US011145744B2

(12) United States Patent
Abe et al.

(10) Patent No.: US 11,145,744 B2
(45) Date of Patent: Oct. 12, 2021

(54) SEMICONDUCTOR DEVICE AND METHOD OF MANUFACTURING THE SAME

(71) Applicant: Renesas Electronics Corporation, Tokyo (JP)

(72) Inventors: Shinichiro Abe, Tokyo (JP); Takashi Hashimoto, Tokyo (JP); Hideaki Yamakoshi, Tokyo (JP); Yuto Omizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 255 days.

(21) Appl. No.: 15/957,785

(22) Filed: Apr. 19, 2018

(65) Prior Publication Data

US 2018/0366556 A1  Dec. 20, 2018

(30) Foreign Application Priority Data

Jun. 19, 2017  (JP) .............................. JP2017-119559

(51) Int. Cl.
*H01L 29/792* (2006.01)
*H01L 29/66* (2006.01)
(Continued)

(52) U.S. Cl.
CPC ...... *H01L 29/6659* (2013.01); *H01L 21/8239* (2013.01); *H01L 27/1157* (2013.01);
(Continued)

(58) Field of Classification Search
CPC ......... H01L 21/82; H01L 27/11; H01L 29/66; H01L 29/6659; H01L 29/665
See application file for complete search history.

(56) References Cited

U.S. PATENT DOCUMENTS 9,508,554 B2   11/2016  Yamabe et al.
2004/0212019 A1  10/2004  Shinohara et al.
(Continued)

FOREIGN PATENT DOCUMENTS

JP   2004-349680 A   12/2004
JP   2010-056311 A   3/2010
(Continued)

OTHER PUBLICATIONS

European Search Report dated Oct. 17, 2018 for European Patent Application No. 18167971.3-1203.
(Continued)

*Primary Examiner* — Samuel A Gebremariam
(74) *Attorney, Agent, or Firm* — McDermott Will & Emery LLP

(57) ABSTRACT

In a semiconductor device including a nonvolatile memory, information of a memory transistor of an unselected bit is accidentally erased during information write operation. A well region is provided in a memory region of a bulk region defined in a SOI substrate. A memory transistor having an LDD region and a diffusion layer is provided in the well region. A raised epitaxial layer is provided on the surface of the well region. The LDD region is provided from a portion of the well region located directly below a sidewall surface of a gate electrode to a portion of the well region located directly below the raised epitaxial layer. The diffusion layer is provided in the raised epitaxial layer.

8 Claims, 60 Drawing Sheets

(51) Int. Cl.
  *H01L 21/8239* (2006.01)
  *H01L 27/1157* (2017.01)
  *H01L 29/423* (2006.01)
  *H01L 27/12* (2006.01)
  *H01L 27/11573* (2017.01)

(52) U.S. Cl.
  CPC .... *H01L 27/11573* (2013.01); *H01L 27/1207* (2013.01); *H01L 29/42364* (2013.01); *H01L 29/6653* (2013.01); *H01L 29/6656* (2013.01); *H01L 29/66492* (2013.01); *H01L 29/66628* (2013.01); *H01L 29/66772* (2013.01); *H01L 29/792* (2013.01); *H01L 29/665* (2013.01)

(56) References Cited

U.S. PATENT DOCUMENTS

| | | | | |
|---|---|---|---|---|
| 2009/0001387 | A1* | 1/2009 | Kimura | H01L 27/1214 257/79 |
| 2011/0117727 | A1 | 5/2011 | Oka et al. | |
| 2012/0319203 | A1* | 12/2012 | Cheng | H01L 29/165 257/346 |
| 2013/0242632 | A1* | 9/2013 | Wada | G11C 15/02 365/49.17 |
| 2014/0353740 | A1 | 12/2014 | Nishida et al. | |
| 2015/0179261 | A1 | 6/2015 | Arsovski et al. | |
| 2016/0093499 | A1* | 3/2016 | Yamabe | H01L 29/792 438/591 |

FOREIGN PATENT DOCUMENTS

| | | |
|---|---|---|
| JP | 2011-192824 A | 9/2011 |
| JP | 2014-143269 A | 8/2014 |
| JP | 2014-232810 A | 12/2014 |
| JP | 2016-072470 A | 5/2016 |

OTHER PUBLICATIONS

Japanese Notice of Reasons for Refusal issued in corresponding Japanese Patent Application No. 2017-119559, dated Sep. 15, 2020, with English translation.

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2017-119559 filed on Jun. 19, 2017 including the specification, drawings and abstract is incorporated herein by reference in its entirety.

BACKGROUND

The present invention relates to a semiconductor device and a method of manufacturing the semiconductor device. For example, the invention can be preferably used for a semiconductor device including a nonvolatile memory having a charge storage layer.

A flash memory has been widely used as a nonvolatile memory that is electrically writable and erasable. For example, Japanese Unexamined Patent Application Publication No. 2016-72470 discloses a semiconductor device including a flash memory.

In a memory transistor of a flash memory, a pair of diffusion layers are provided at a distance from each other in a well region of a semiconductor substrate. A gate electrode is provided over a region to be a channel between the pair of diffusion layers with a gate insulating film including a charge storage layer in between.

For information write operation on the memory transistor of a selected bit, electron is injected from the well region into the charge storage layer to write the information. For information erasure operation, hole is injected from a gate electrode into the charge storage layer to erase the information.

For information read operation, the information is read using a difference in threshold voltage of the memory transistor between a case where electron is stored in the charge storage layer and a case where no electron is stored in the charge storage layer.

SUMMARY

For information write operation of the memory transistor of a selected bit, a positive bias is applied to the gate electrode, and a negative bias is applied to the well region, thereby electron is injected from the well region into the charge storage layer.

In the memory transistor of an unselected bit, a negative bias is applied to the gate electrode, so that no electron is injected from the well region into the charge storage layer. At this time, a positive bias is applied to a diffusion layer coupled to a bit line, and a potential difference exists between the diffusion layer and the well region to which the negative bias is applied.

When an impurity concentration profile steeply varies between the diffusion layer and the LDD region, hot hole may be generated due to such a potential difference. The hot hole is injected into the charge storage layer since the negative bias is applied to the gate electrode. If electron is stored in the charge storage layer, information may be accidentally erased due to such hot-hole injection.

When the impurity concentration profile gently varies between the diffusion layer and the LDD region, the electric potential of the channel region may float due to a depleted layer extending from the diffusing layer. In particular, if the gate length of the gate electrode is reduced, the electric potential of the channel region may easily float. Hence, the electron stored in the charge storage layer may be extracted to the well region (channel region) due to the potential difference between the gate electrode, to which the negative bias is applied, and the channel region, leading to accidental erasure of the information.

The inventors have found that accidental erasure (write disturb), i.e., accidental erasure of information of the memory transistor of the unselected bit may thus occur in the semiconductor device including the flash memory during information write operation due to the impurity concentration profile of the diffusion layer of the memory transistor.

Other objects and novel features will be clarified from the description of this specification and the accompanying drawings.

A semiconductor device of one embodiment includes a semiconductor substrate, an element region, a semiconductor element, and a raised part. The semiconductor substrate includes a semiconductor base substrate and a semiconductor layer formed over the semiconductor base substrate with an insulating film in between. The element region is defined in each of the semiconductor base substrate and the semiconductor layer, and includes a first element region defined in a semiconductor region located in one of the semiconductor base substrate and the semiconductor layer. The semiconductor element is formed in the element region, and includes a memory transistor having a memory gate electrode disposed on the surface of the semiconductor region located in the first element region with a gate insulating film including a charge storage layer in between. The raised part is formed from a position of the surface of the semiconductor region, on which the gate insulating film is disposed, to a position higher than the surface in a portion of the semiconductor region located on each of a first side and a second side in a gate length direction of the memory gate electrode with the memory gate electrode in between. The memory transistor includes a first impurity region and a second impurity region. The first impurity region is formed from a portion of the semiconductor region located directly below each of the opposed sidewall surfaces of the memory gate electrode to a portion of the semiconductor region located directly below the raised part, and has a first impurity concentration. The second impurity region is formed in the raised part, and has a second impurity concentration higher than the first impurity concentration.

A method of manufacturing a semiconductor device of another embodiment includes the following steps. Provided is a semiconductor substrate having a semiconductor layer over a semiconductor base substrate with an insulating film in between. A first region and a second region are defined in the semiconductor substrate, and the semiconductor layer and the insulating film located in the first region are removed to expose the semiconductor base substrate, but leave the semiconductor layer and the insulating film located in the second region. An element region is defined by forming an isolation region in the semiconductor substrate while a step of defining a first element region in the first region is involved. A semiconductor element is formed while a step of forming a memory transistor in the first element region is involved. The step of forming the memory transistor further includes the following steps. A well region having a first conductivity type is formed in the first element region. A memory gate electrode is formed over the well region with a gate insulating film including a charge storage layer in between. A first impurity having a second conductivity type is introduced with the memory gate electrode as an implantation mask to form a first impurity region having a first impurity concentration in the well region. A raised part is formed on the surface of the well region by an epitaxial growth process. A sidewall insulating film is formed on a sidewall surface of the memory gate electrode. A second impurity having the second conductivity type is implanted with the memory gate electrode and the sidewall insulating film as an implantation mask to form a second impurity region having a second impurity concentration higher than the first impurity concentration in the raised part.

A method of manufacturing a semiconductor device of still another embodiment includes the following steps. Provided is a semiconductor substrate having a semiconductor layer over a semiconductor base substrate with an insulating film in between. A first region and a second region are defined in the semiconductor substrate, and the semiconductor layer and the insulating film located in the first region are left while the semiconductor layer and the insulating film located in the second region are removed to expose the semiconductor base substrate. An element region is defined by forming an isolation region in the semiconductor substrate while a step of defining a first element region in the second region is involved. A semiconductor element is formed while a step of forming a memory transistor in the first element region is involved. The step of forming the memory transistor includes the following steps. A memory gate electrode is formed over the semiconductor layer located in the first element region with a gate insulating film including a charge storage layer in between. A first impurity having a second conductivity type is introduced with the memory gate electrode as an implantation mask to form a first impurity region having a first impurity concentration in the semiconductor layer. A raised part is formed over the surface of the semiconductor layer by an epitaxial growth process. A sidewall insulating film is formed over a sidewall surface of the memory gate electrode. A second impurity having the second conductivity type is implanted with the memory gate electrode and the sidewall insulating film as an implantation mask to form a second impurity region having a second impurity concentration higher than the first impurity concentration in the raised part.

According to the semiconductor device of one embodiment, it is possible to suppress write disturb of a memory transistor of an unselected bit.

According to the method of manufacturing the semiconductor device of another embodiment, it is possible to manufacture a semiconductor device that suppresses write disturb of the memory transistor of an unselected bit.

According to the method of manufacturing the semiconductor device of still another embodiment, it is possible to manufacture a semiconductor device that suppresses write disturb of the memory transistor of an unselected bit.

DETAILED DESCRIPTION

Figure 1:
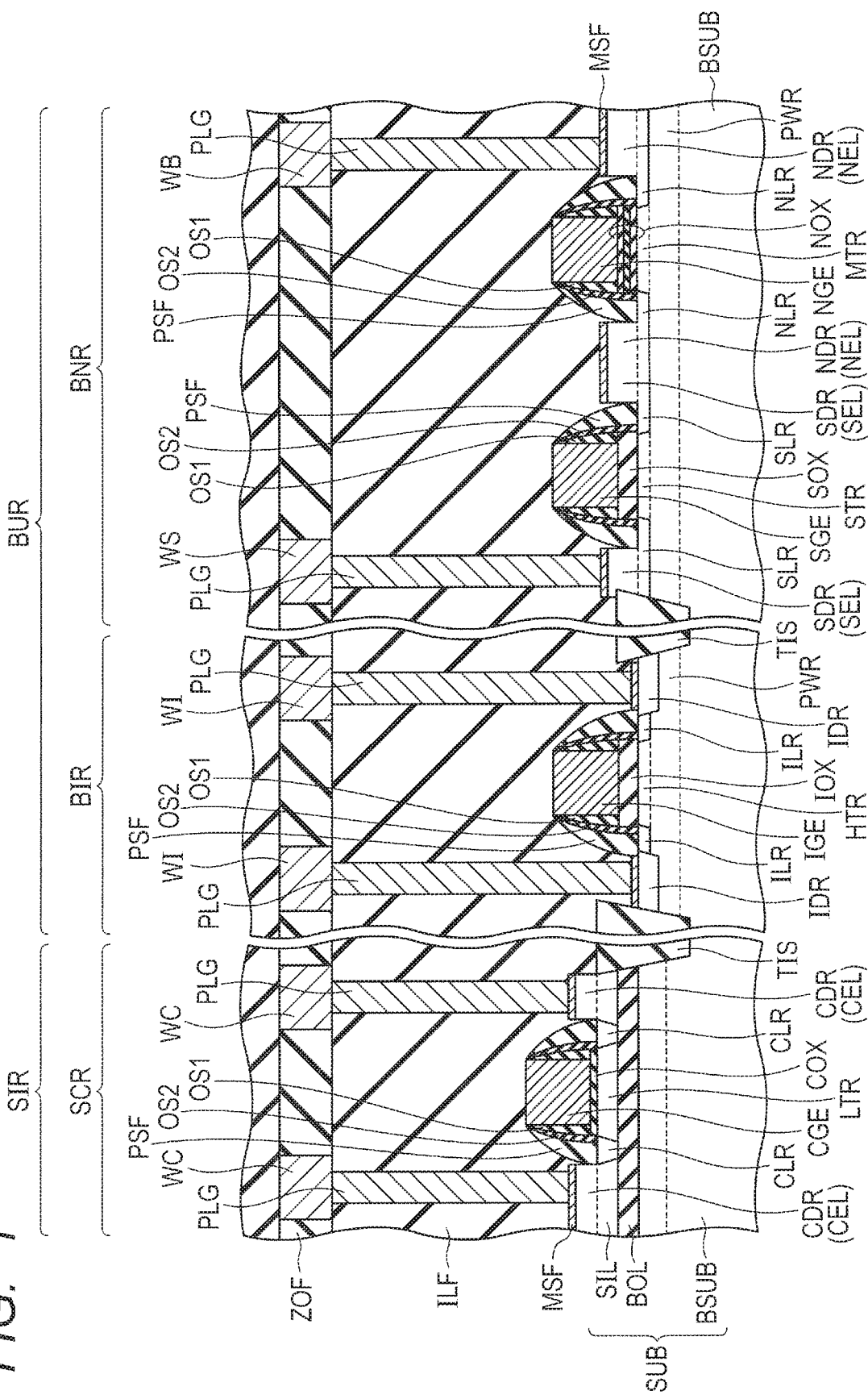
FIG. 1 is a sectional view of a semiconductor device of a first embodiment.

In a semiconductor device of each embodiment, for example, a silicon on insulator (SOI) substrate SUB (semiconductor substrate) is used as shown in FIG. 1 and the like. In the SOI substrate SUB, a silicon layer SIL (semiconductor layer) is provided over a silicon substrate BSUB (semiconductor base substrate) with an insulating film BOL in between. A bulk region BUR of the silicon substrate BSUB, from which the silicon layer SIL and the insulating film BOL are removed, and an SOI region SIR, in which the silicon layer SIL and the insulating film BOL are left, are defined in the SOI substrate SUB. Semiconductor elements including a memory transistor MTR are provided in the bulk region BUR and the SOI region SIR.

Although both an n-channel-type metal oxide semiconductor (MOS) transistor and a p-channel-type MOS transistor are provided as the semiconductor elements in the semiconductor device, the n-channel-type MOS transistor is exemplarily described to simplify the description and drawings in this specification.

First Embodiment

An example of a semiconductor device, in which one memory cell is configured by one memory transistor and one selection transistor and provided in the bulk region, is now described.

As shown in FIG. 1, the bulk region BUR and the SOI region SIR are defined in the SOT substrate SUB. An element isolation insulating film TIS defines a memory region BNR and a high-withstand-voltage MOS transistor region BIR in the bulk region BUR, and defines a low-withstand-voltage MOS transistor region SCR in the SOT region SIR.

The memory region BNR has a p-type well region PWR from the surface of the silicon substrate BSUB to a predetermined depth. A memory transistor MTR and a selection transistor STR are provided in the well region PWR. The memory transistor MTR and the selection transistor STR are electrically coupled in series. Raised epitaxial layers NEL and SEL (raised parts) are provided on the surface of the well region PWR.

The memory transistor MTR includes a gate insulating film NOX including a charge storage layer, a gate electrode NGE, a lightly doped drain (LDD) region NLR, and a diffusion layer NDR. The gate insulating film NOX has a stacked structure in which a silicon oxide film, a silicon nitride film, and a silicon oxide film are stacked in this order. The silicon nitride film serves as the charge storage layer. The gate electrode NGE is provided over the well region PWR with the gate insulating film NOX in between.

The raised epitaxial layer NEL is provided from the surface of the well region PWR, on which the gate insulating film NOX is disposed, to a position higher than the surface. The LDD region NLR is provided from a portion of the well region PWR located directly below the sidewall surface of the gate electrode NGE to a portion of the well region PWR located directly below the raised epitaxial layer NEL.

The diffusion layer NDR is provided mainly in the raised epitaxial layer NEL. The impurity concentration (second impurity concentration) of the diffusion layer NDR is higher than the impurity concentration (first impurity concentration) of the LDD region NLR. Offset spacer films OS1 and OS2 and a spacer film PSF are stacked on a sidewall surface of the gate electrode NGE. A metal silicide film MSF is provided on the surface of the diffusion layer NDR.

The selection transistor STR includes a gate insulating film SOX, a gate electrode SGE, an LDD region SLR, and a diffusion layer SDR. The gate electrode SGE is provided over the well region PWR with the gate insulating film SOX in between. The LDD region SLR is provided from a portion of the well region PWR located directly below the sidewall surface of the gate electrode SGE to a portion of the well region PWR located directly below the raised epitaxial layer SEL.

The diffusion layer SDR is provided mainly in the raised epitaxial layer SEL. The impurity concentration of the diffusion layer SDR is higher than the impurity concentration of the LDD region SLR. The offset spacer films OS1 and OS2 and the spacer film PSF are stacked on a sidewall surface of the gate electrode SGE. The metal silicide film MSF is provided on the surface of the diffusion layer SDR.

A p-type well region PWR is provided from the surface of the silicon substrate BSUB to a predetermined depth in the high-withstand-voltage MOS transistor region BIR. A high-withstand-voltage MOS transistor HTR is provided in the well region PWR. The high-withstand-voltage MOS transistor HTR operates at a voltage of 3.3 V, for example. The high-withstand-voltage MOS transistor HTR includes a gate insulating film IOX, a gate electrode NGE, an LDD region ILR, and a diffusion layer IDR.

The gate electrode IGE is provided over the well region PWR with the gate insulating film IOX in between. The LDD region ILR is provided from a portion of the well region PWR located directly below the sidewall surface of the gate electrode IGE in a direction away from the gate electrode IGE. The diffusion layer IDR is provided from a portion of the well region PWR located directly below the sidewall surface of the spacer film PSF in a direction away from the gate electrode IGE.

The impurity concentration of the diffusion layer IDR is higher than the impurity concentration of the LDD region ILR. The offset spacer films OS1 and OS2 and the spacer film PSF are stacked on a sidewall surface of the gate electrode IGE.

A low-withstand-voltage MOS transistor LTR is provided in the low-withstand-voltage MOS transistor region SCR. A raised epitaxial layer CEL is provided on the surface of the silicon layer SIL. The low-withstand-voltage MOS transistor LTR operates at a voltage of 1.3 V, for example. The low-withstand-voltage MOS transistor LTR includes a gate insulating film COX, a gate electrode CGE, an LDD region CLR, and a diffusion layer CDR. The gate electrode CGE is formed over the silicon layer SIL with the gate insulating film COX in between.

The LDD region CLR is provided from a portion of the silicon layer SIL located directly below the sidewall surface of the gate electrode CGE to a portion of the silicon layer SIL located directly below the raised epitaxial layer CEL. The diffusion layer CDR is provided mainly in the raised epitaxial layer CEL. The impurity concentration of the diffusion layer CDR is higher than the impurity concentration of the LDD region CLR. The offset spacer films OS1 and OS2 and the spacer film PSF are stacked on a sidewall surface of the gate electrode CGE. The metal silicide film MSF is provided on the surface of the diffusion layer CDR.

An interlayer insulating film ILF is provided so as to cover the memory transistor MTR, the selection transistor STR, the high-withstand-voltage MOS transistor HTR, the low-withstand-voltage MOS transistor LTR, and the like. An insulating film ZOF is provided so as to cover the interlayer insulating film ILF. Interconnections WB, WS, WI, and WC are provided in the insulating film ZOF.

The interconnection WB is electrically coupled to one diffusion layer NDR of the memory transistor MTR via the plug PLG. The interconnection WS is electrically coupled to one diffusion layer SDR of the selection transistor STR via the plug PLG. One interconnection WI is electrically coupled to one diffusion layer IDR of the high-withstand-voltage MOS transistor HTR via the plug PLG. The other interconnection WI is electrically coupled to the other diffusion layer IDR of the high-withstand-voltage MOS transistor HTR via the plug PLG.

One interconnection WC is electrically coupled to one diffusion layer CDR of the low-withstand-voltage MOS transistor LTR via the plug PLG. The other interconnection WC is electrically coupled to the other diffusion layer CDR of the low-withstand-voltage MOS transistor LTR via the plug PLG. An interlayer insulating film is further provided so as to cover the interconnections WB, WS, WI, and WC, and an undepicted top interconnection is provided in the interlayer insulating film. The semiconductor device of the first embodiment is configured as above.

An exemplary method of manufacturing the semiconductor device is now described. Although the case of forming the n-channel-type MOS transistor is described to simplify the description and drawings as mentioned at the beginning, a p-channel-type MOS transistor may also be formed in the semiconductor device.

First, the SOI substrate SUB is provided. The SOI substrate SUB has the silicon layer SIL over the silicon substrate BSUB with the insulating film BOL in between (see FIG. 2). Subsequently, predetermined photoengraving processing is performed to form a photoresist pattern PR1 that covers a region to be the SOI region SIR, but exposes a region to be the bulk region (see FIG. 2).

Figure 2:
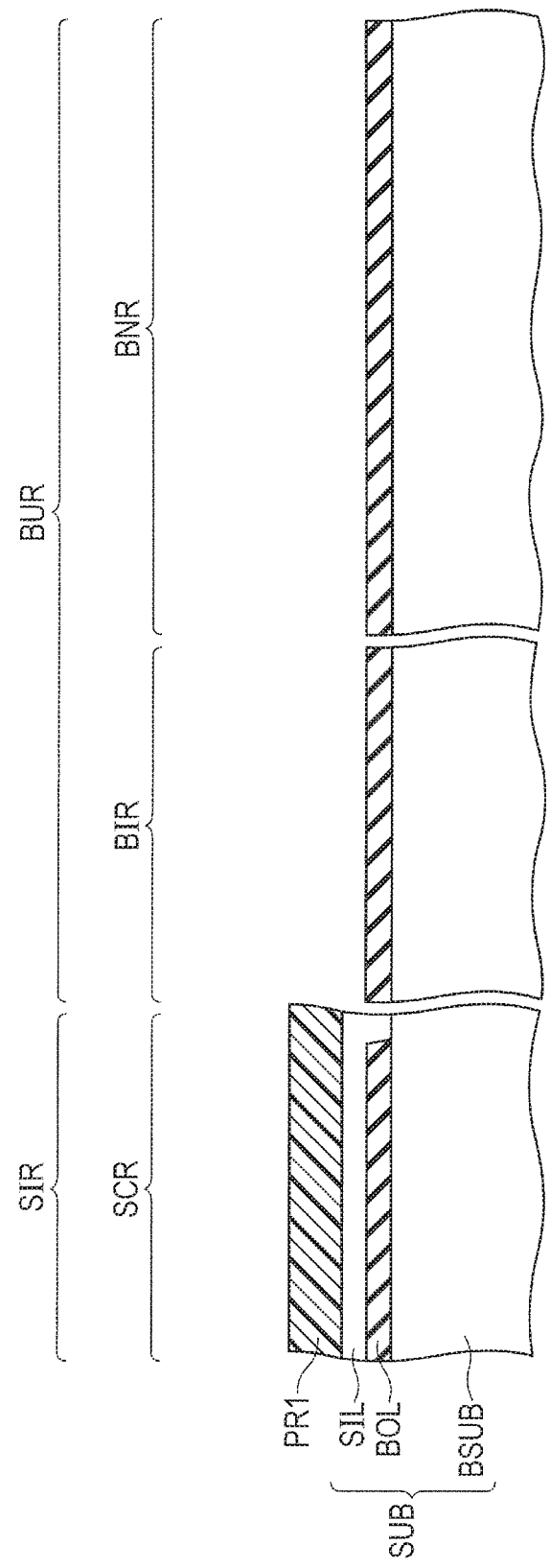
FIG. 2 is a sectional view illustrating one step of a method of manufacturing the semiconductor device in the first embodiment.

Subsequently, as shown in FIG. 2, the exposed silicon layer SIL is removed using the photoresist pattern PR1 as an etching mask, thereby the insulating film BOL, which is located in a region to be the bulk region BUR, is exposed. Subsequently, the photoresist pattern PR1 is removed.

Figure 3:
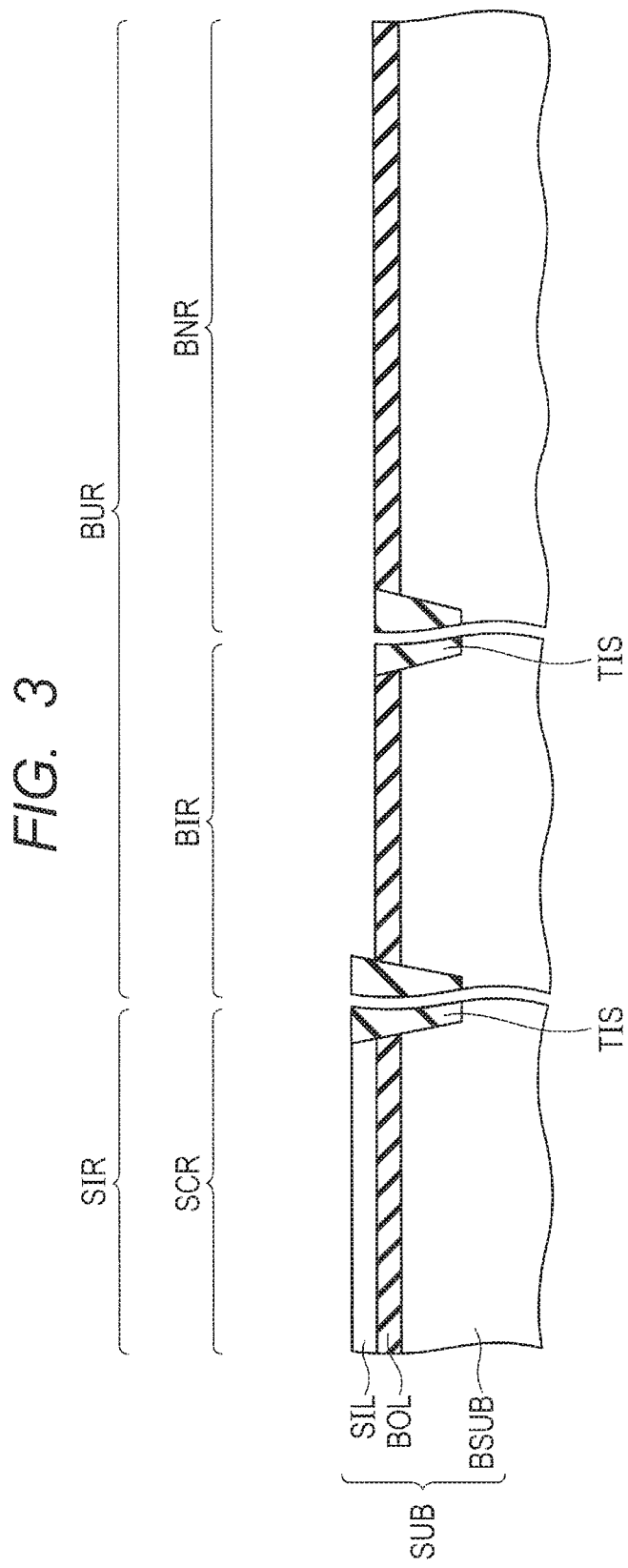
FIG. 3 is a sectional view illustrating a step performed after the step illustrated in FIG. 2 in the first embodiment.

Subsequently, predetermined photoengraving processing, etching processing, film formation processing, and the like are performed, thereby the element isolation insulating film TIS is formed as shown in FIG. 3. The element isolation insulating film TIS defines the memory region BNR, the high-withstand-voltage MOS transistor region BIR, and the like in the region to be the bulk region BUR, and defines the low-withstand-voltage MOS transistor region SCR and the like in the SOI region SIR.

Figure 4:
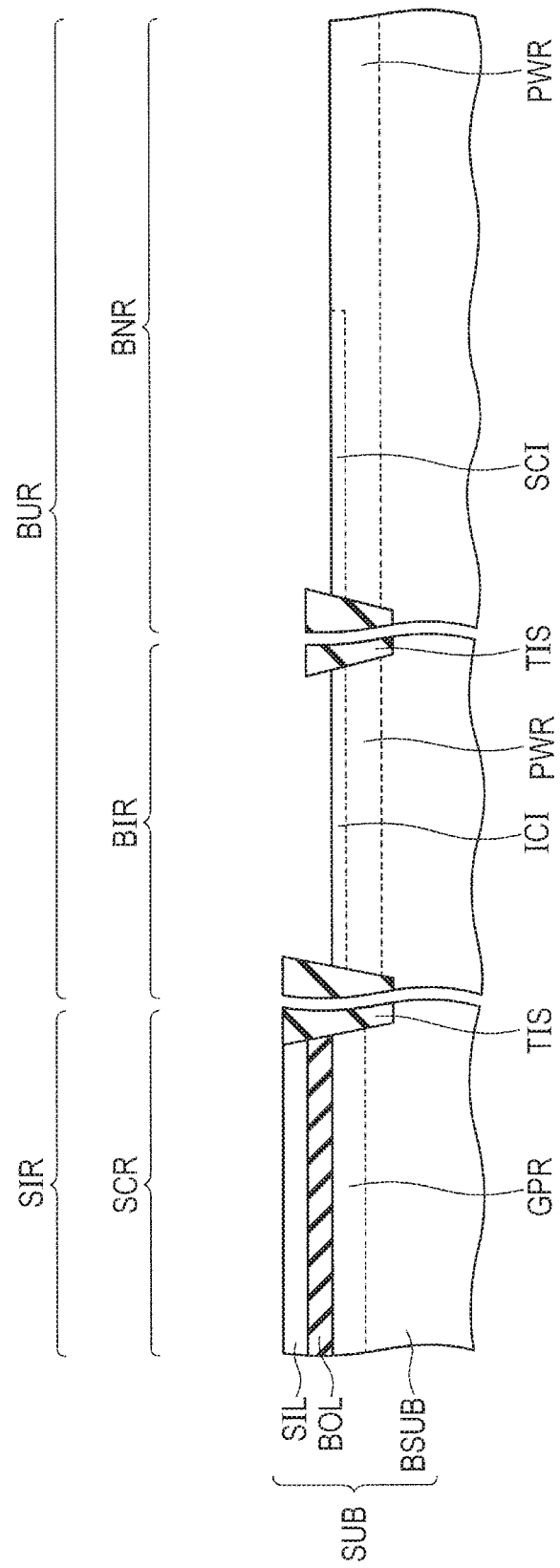
FIG. 4 is a sectional view illustrating a step performed after the step illustrated in FIG. 3 in the first embodiment.

Subsequently, as shown in FIG. 4, the insulating film BOL located in the region to be the bulk region BUR is removed and thus the bulk region BUR is defined. Subsequently, predetermined photoengraving processing and ion implantation (for example, B) are performed to form the p-type well region PWR in the bulk region BUR.

Subsequently, predetermined photoengraving processing and ion implantation (for example, $BF_2$) are performed to form a channel injection region SCI in a region, in which the selection transistor is to be formed, of the memory region BNR. A channel injection region ICI is formed in the high-withstand-voltage MOS transistor region BIR. The channel injection region SCI adjusts the threshold voltage of the selection transistor. The channel injection region ICI adjusts the threshold voltage of the high-withstand-voltage MOS transistor.

Predetermined photoengraving processing and ion implantation (for example, B) are performed to form a ground plane region GPR in a portion of the silicon substrate BSUB located directly below the insulating film BOL in the SOI region SIR. The ground plane region GPR adjusts the threshold voltage of the low-withstand-voltage MOS transistor.

Subsequently, thermal oxidation processing is performed to form a silicon oxide film OXF1 having a thickness of, for example, about 7.5 nm on the surfaces of the silicon layer SIL and the silicon substrate BSUB (see FIG. 5). The silicon oxide film OXF1 serves as a gate insulating film of the high-withstand-voltage MOS transistor. Subsequently, predetermined photoengraving processing is performed to form a photoresist pattern PR2 that exposes a region, in which the memory transistor is to be formed, of the memory region BNR, but covers other regions (see FIG. 5).

Figure 5:
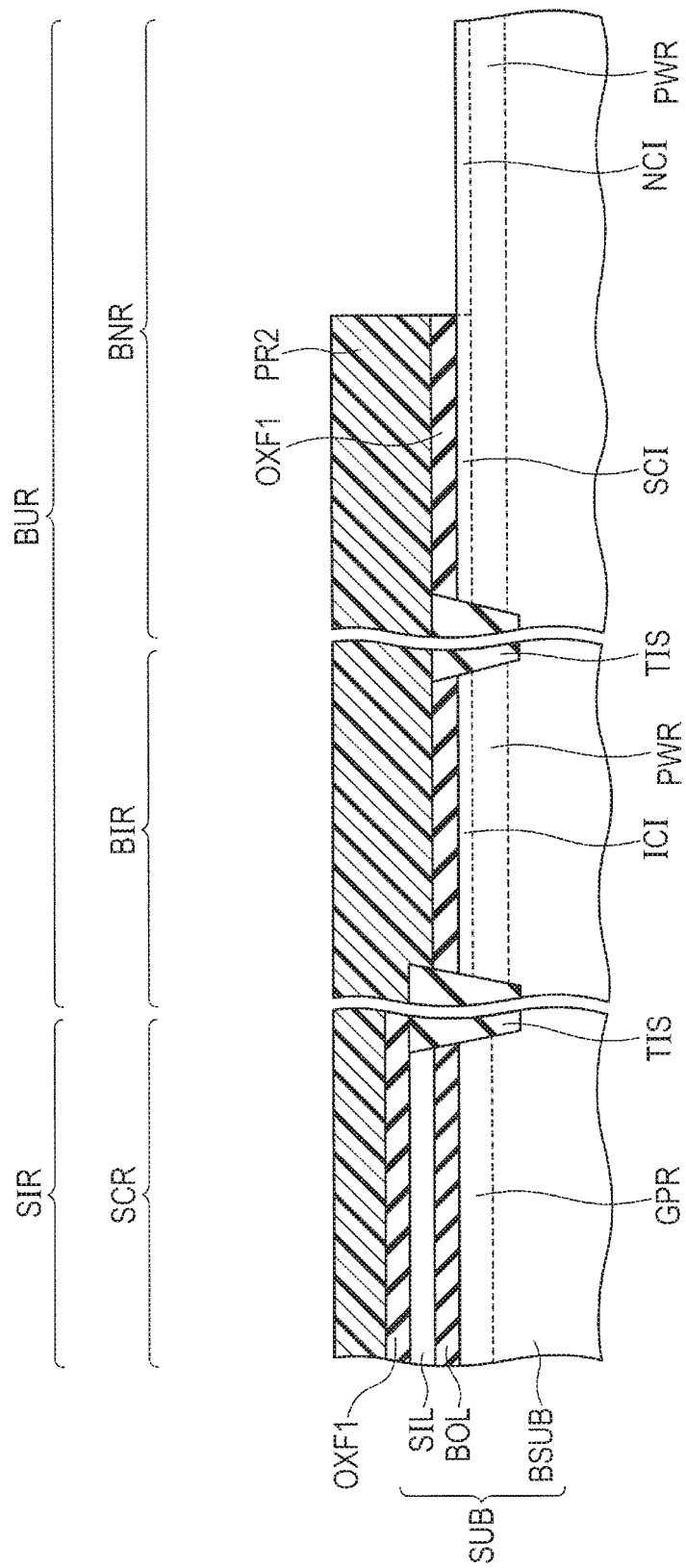
FIG. 5 is a sectional view illustrating a step performed after the step illustrated in FIG. 4 in the first embodiment.

Subsequently, as shown in FIG. 5, etching processing is performed with the photoresist pattern PR2 as an etching mask to remove a portion of the silicon oxide film OXF1 located in the region, in which the memory transistor is to be formed, of the memory region BNR. Subsequently, ion implantation (for example, As) is performed with the photoresist pattern PR2 as an implantation mask to form a channel injection region NCI in the exposed silicon substrate BSUB. The channel injection region NCI adjusts the threshold voltage of the memory transistor. Subsequently, the photoresist pattern PR2 is removed.

Figure 6:
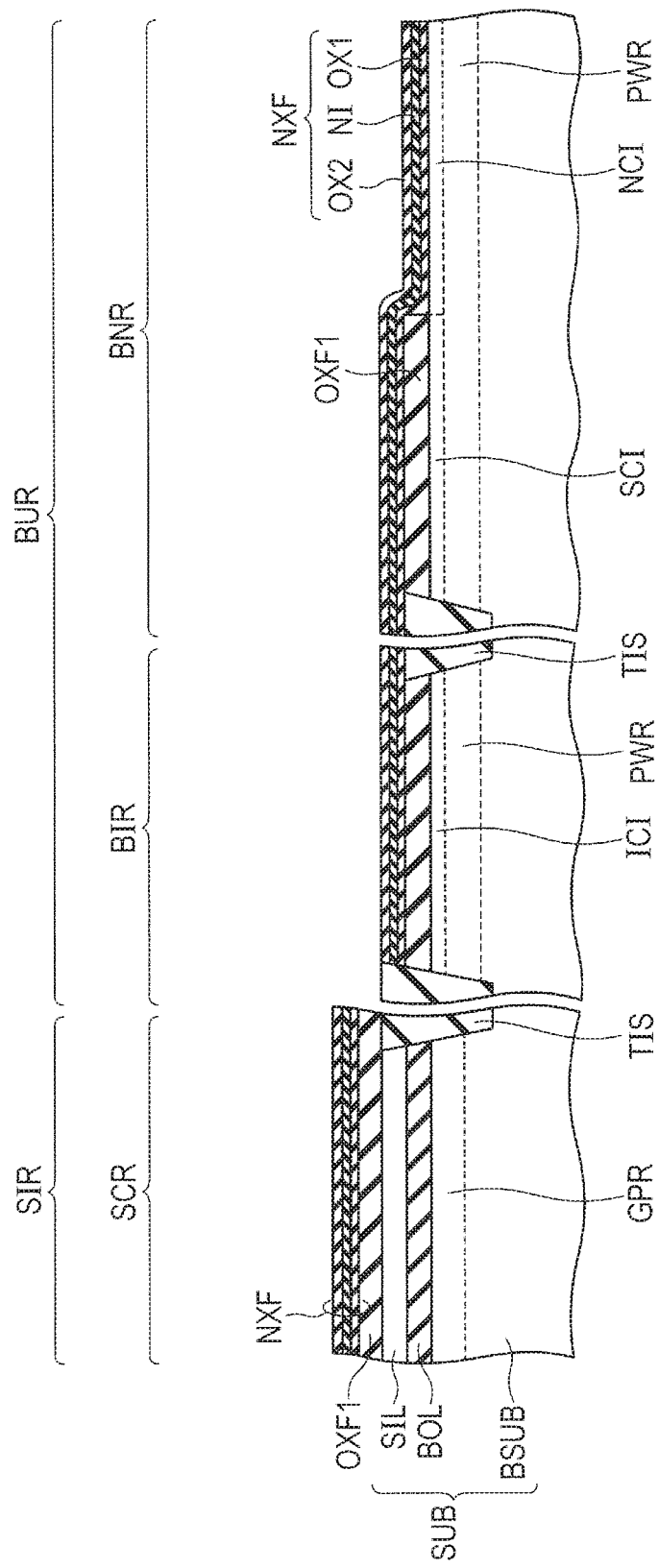
FIG. 6 is a sectional view illustrating a step performed after the step illustrated in FIG. 5 in the first embodiment.

Subsequently, as shown in FIG. 6, an ONO film NXF, in which a silicon oxide film OX1, a silicon nitride film NI, and a silicon oxide film OX2 are stacked in this order, is formed by a thermal oxidation process and a chemical vapor deposition (CVD) process, for example. The ONO film NXF serves as a gate insulating film of the memory transistor. The silicon nitride film of the ONO film NXF serves as the charge storage layer. The silicon oxide film OXF1 is a composite film with the bottom silicon oxide film of the ONO film NXF. Subsequently, predetermined photoengraving processing is performed to form a photoresist pattern PR3 that covers a region, in which the memory transistor is to be formed, of the memory region BNR, and exposes other regions (see FIG. 7).

Figure 7:
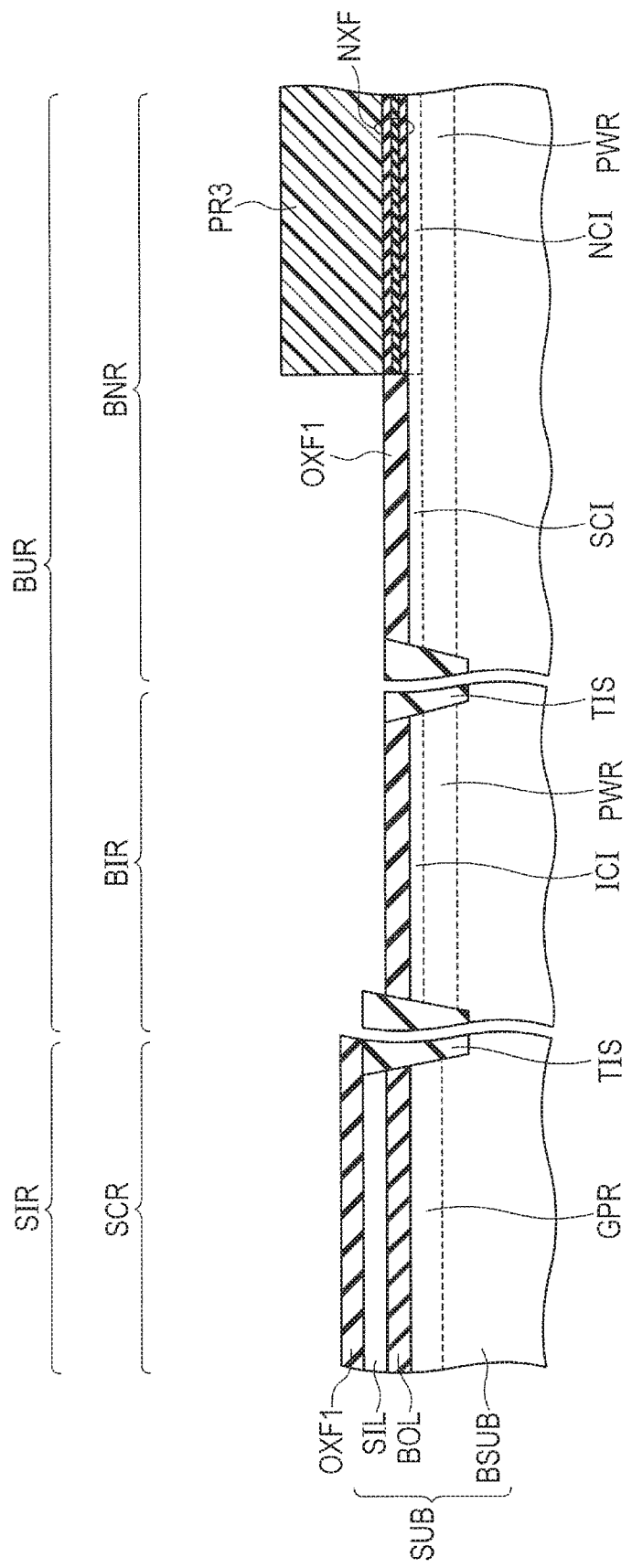
FIG. 7 is a sectional view illustrating a step performed after the step illustrated in FIG. 6 in the first embodiment.

Subsequently, as shown in FIG. 7, etching processing is performed with the photoresist pattern PR3 as an etching mask to remove a portion of the ONO film NXF located in a region other than the region, in which the memory transistor is to be formed, of the memory region BNR. Subsequently, the photoresist pattern PR3 is removed.

Figure 8:
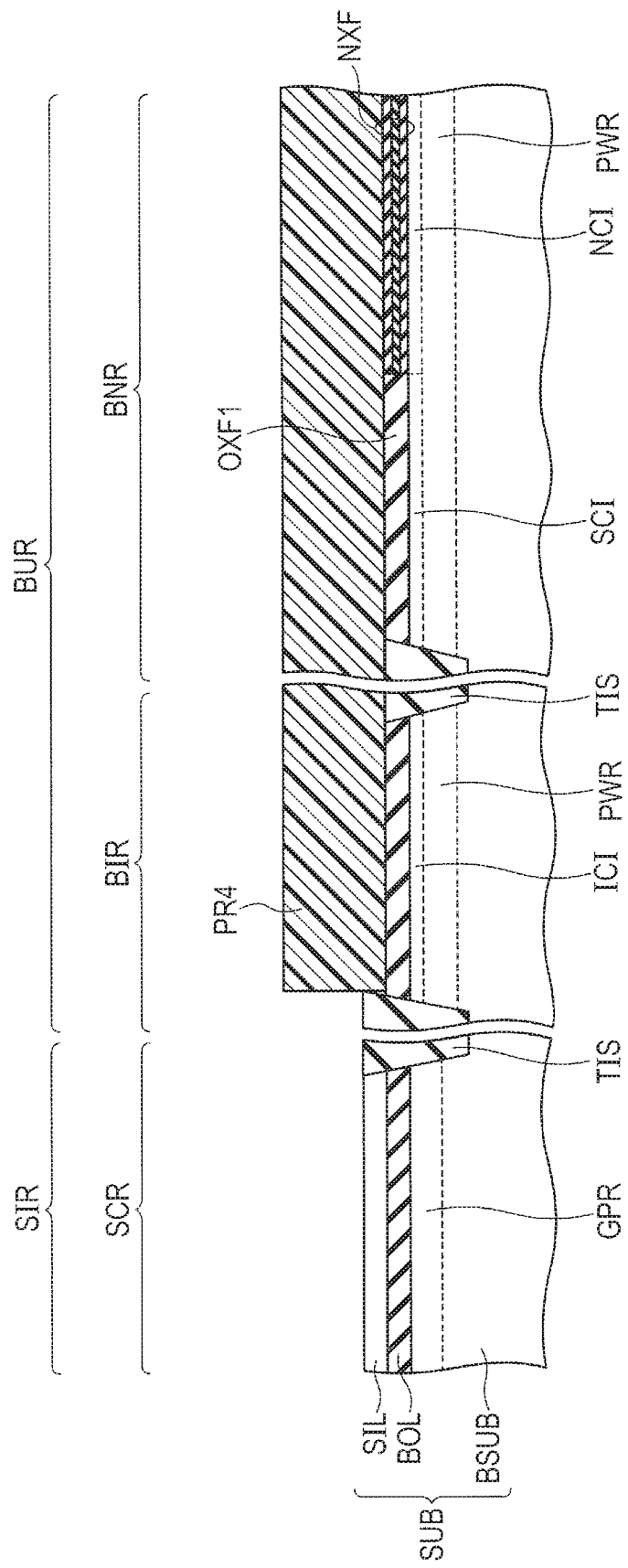
FIG. 8 is a sectional view illustrating a step performed after the step illustrated in FIG. 7 in the first embodiment.

Subsequently, predetermined photoengraving processing is performed to form a photoresist pattern PR4 that covers the bulk region BUR and exposes the SOI region SIR (see FIG. 8). Subsequently, as shown in FIG. 8, etching processing is performed with the photoresist pattern PR4 as an etching mask to remove a portion of the silicon oxide film OXF1 located in the SOI region SIR. Subsequently, the photoresist pattern PR4 is removed.

Figure 9:
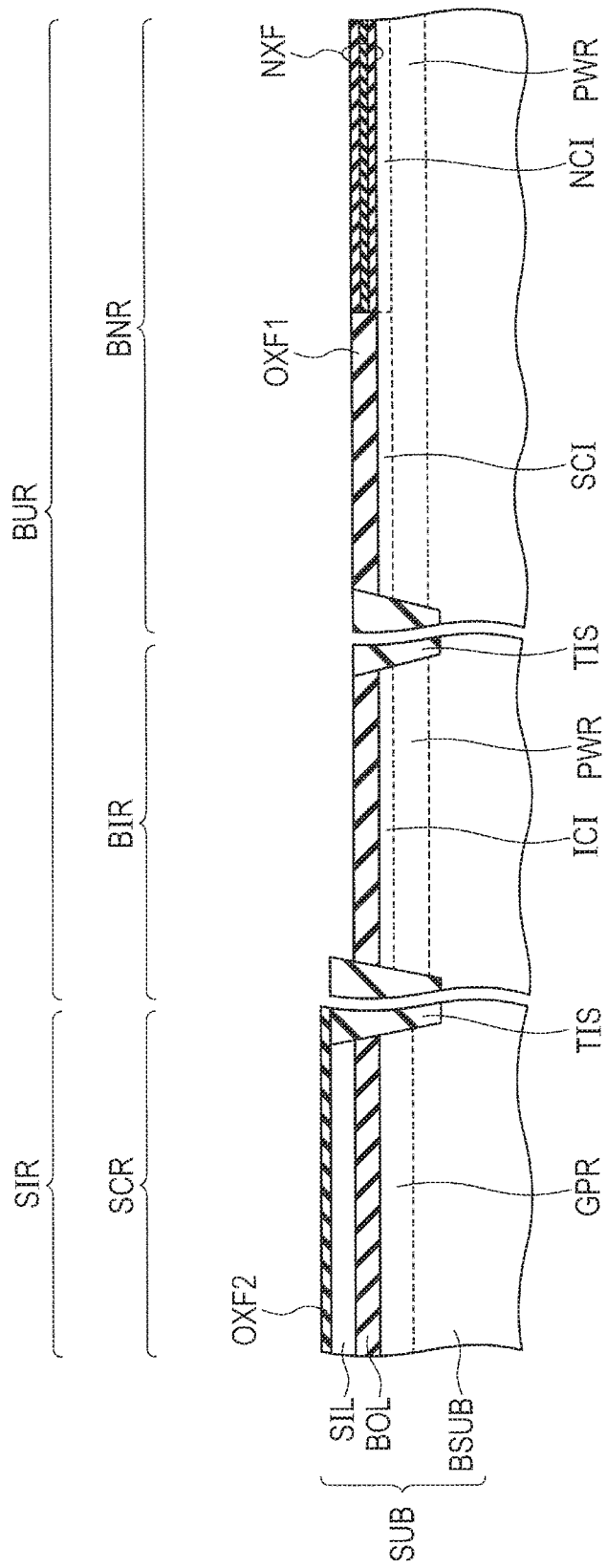
FIG. 9 is a sectional view illustrating a step performed after the step illustrated in FIG. 8 in the first embodiment.

Subsequently, as shown in FIG. 9, thermal oxidation processing is performed to form a silicon oxide film OXF2 having a thickness of, for example, about 1.5 nm on the surface of the silicon layer SIL. The silicon oxide film OXF2 serves as a gate insulating film of the low-withstand-voltage MOS transistor. In this step, hafnium or the like is deposited by a sputter process after the thermal oxidation processing to adjust the threshold voltage of the low-withstand-voltage MOS transistor. Hence, hafnium or the like is deposited on the top silicon oxide film of the ONO film NXF. Hafnium or the like is also deposited on the silicon oxide film OXF1.

Subsequently, an undepicted polysilicon film is formed by, for example, a CVD process so as to cover the silicon oxide film OXF1, the silicon oxide film OXF2, the ONO film NXF, and the like. Subsequently, predetermined photoengraving processing and etching processing are performed to pattern the gate electrodes NGE, SGE, IGE, and CGE (see FIG. 10).

Subsequently, for example, an undepicted silicon nitride film is formed so as to cover the gate electrodes NGE, SGE, IGE, and CGE. Subsequently, such a silicon nitride film is subjected to anisotropic etching to form an offset spacer film OS1 on each of the sidewall surfaces of the gate electrodes NGE, SGE, IGE, and CGE (see FIG. 10). Subsequently, the exposed silicon oxide films OXF1 and OXF2 are subjected to etching processing.

Figure 10:
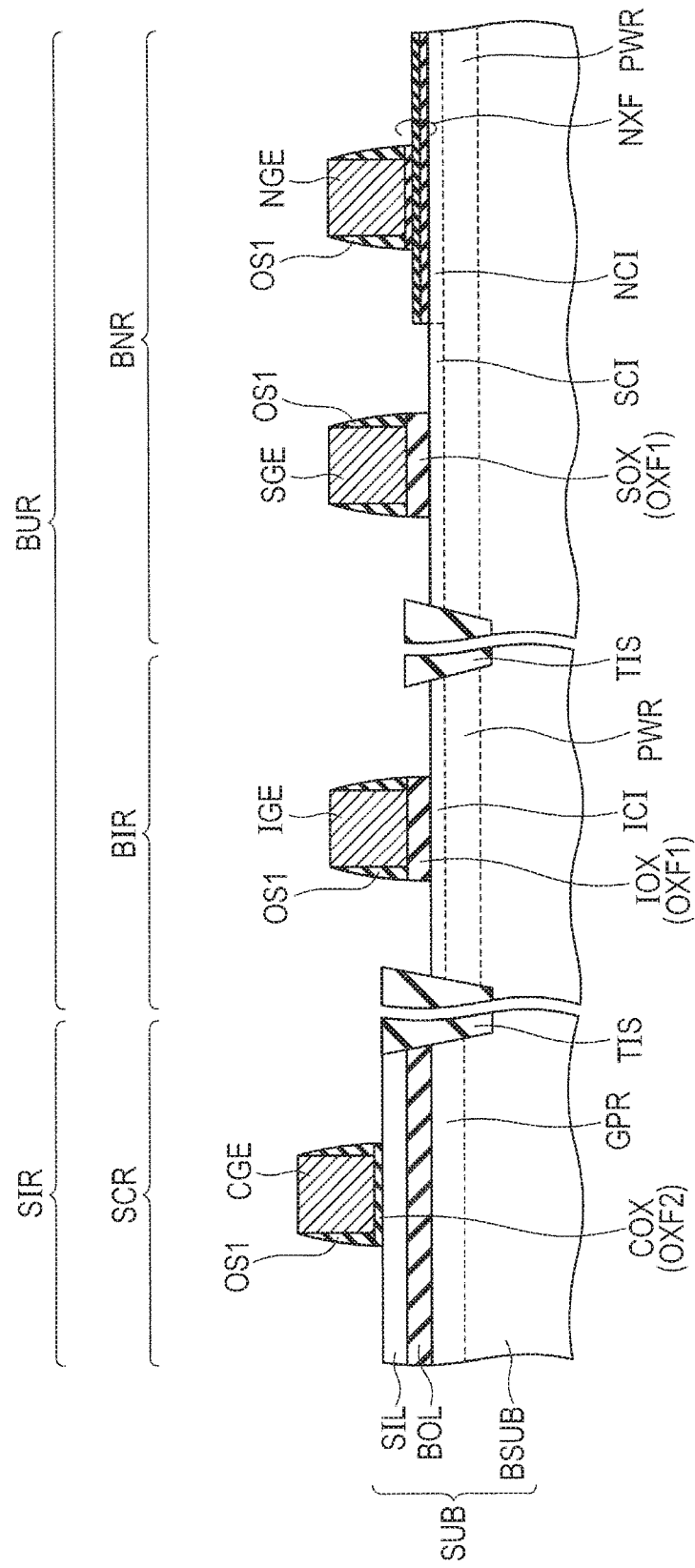
FIG. 10 is a sectional view illustrating a step performed after the step illustrated in FIG. 9 in the first embodiment.

As a result, as shown in FIG. 10, the gate electrode SGE is formed over the well region PWR with the gate insulating film SOX in between in the memory region BNR. The gate electrode IGE is formed over the well region PWR with the gate insulating film IOX in between in the high-withstand-voltage MOS transistor region BIR. The gate electrode CGE is formed over the silicon layer SIL with the gate insulating film COX in between in the low-withstand-voltage MOS transistor region SCR. The bottom silicon oxide film and the silicon nitride film of the ONO film NXF are left in the memory region BNR.

Figure 11:
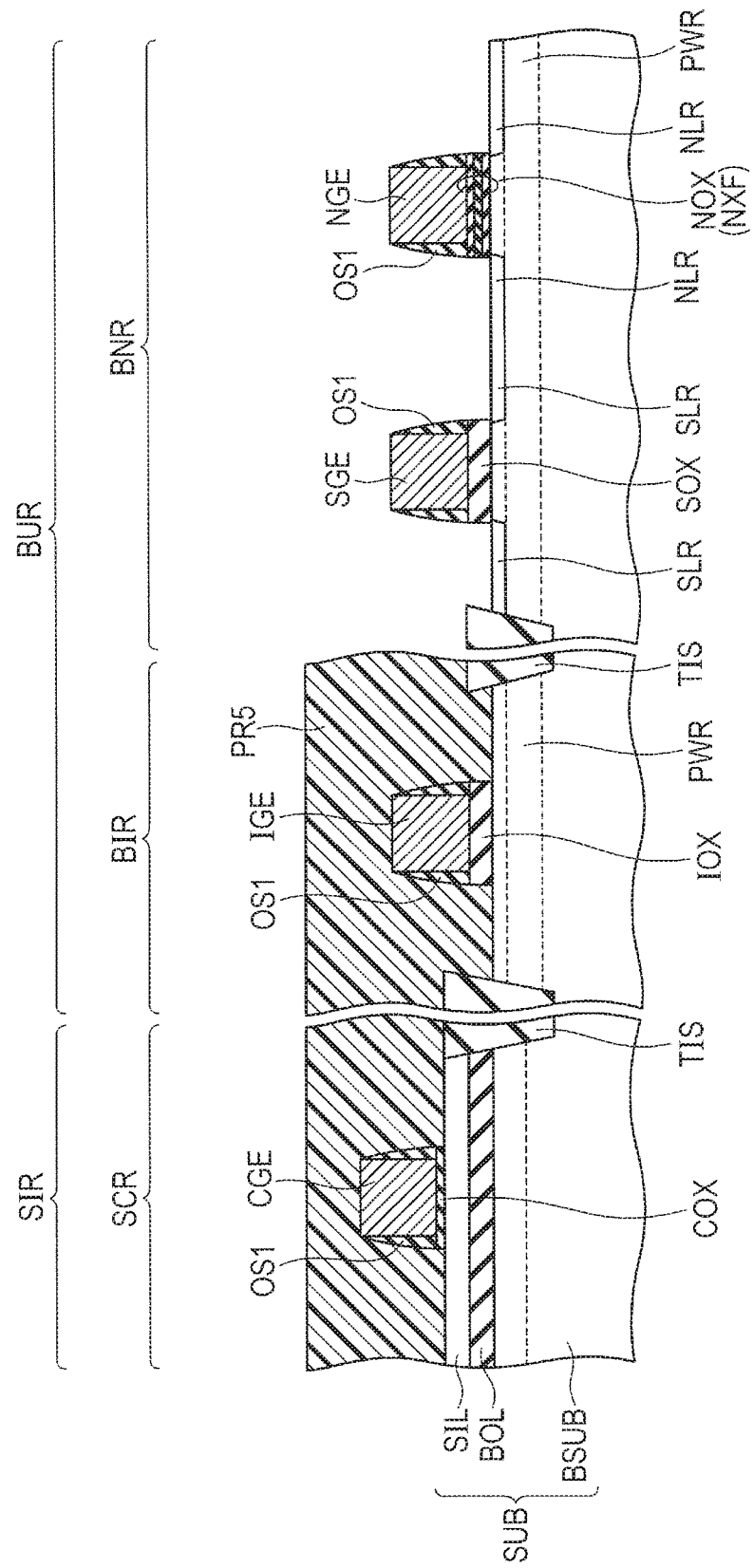
FIG. 11 is a sectional view illustrating a step performed after the step illustrated in FIG. 10 in the first embodiment.

Subsequently, as shown in FIG. 11, predetermined photoengraving processing is performed to form a photoresist pattern PR5 that exposes the memory region BNR but covers other regions. Subsequently, an exposed portion of the ONO film NXF is removed with the photoresist pattern PR5 as an etching film. Subsequently, an n-type impurity is implanted with the photoresist pattern PR5 and the like as a mask to form the LDD regions NLR and SLR. At this time, the impurity concentration (dose amount) is on the order of about $10^{12}/cm^2$. Subsequently, the photoresist pattern PR5 is removed.

Figure 12:
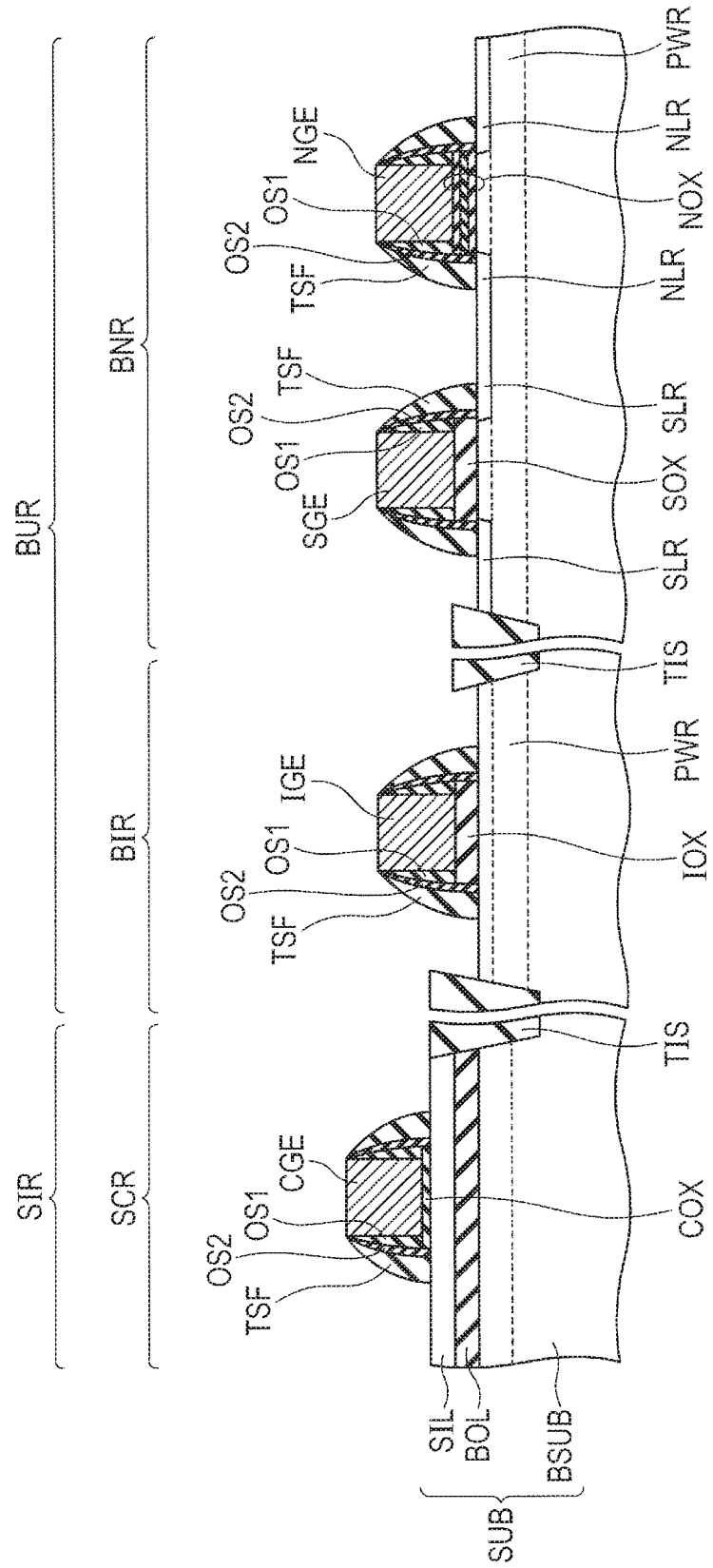
FIG. 12 is a sectional view illustrating a step performed after the step illustrated in FIG. 11 in the first embodiment.

Subsequently, as shown in FIG. 12, an offset spacer film OS2 is formed over each of the sidewall surfaces of the gate electrodes NGE, SGE, IGE, and CGE. Furthermore, a spacer film TSF is formed over each of the sidewall surfaces of the gate electrodes NGE, SGE, IGE, and CGE. The spacer film TSF is a temporary spacer film.

Subsequently, for example, an undepicted silicon nitride film is formed so as to cover the gate electrodes NGE, SGE, IGE, and CGE. Subsequently, predetermined photoengraving processing and etching processing are performed to remove portions of the silicon nitride film other than a portion thereof located in the high-withstand-voltage MOS transistor region BIR.

Figure 13:
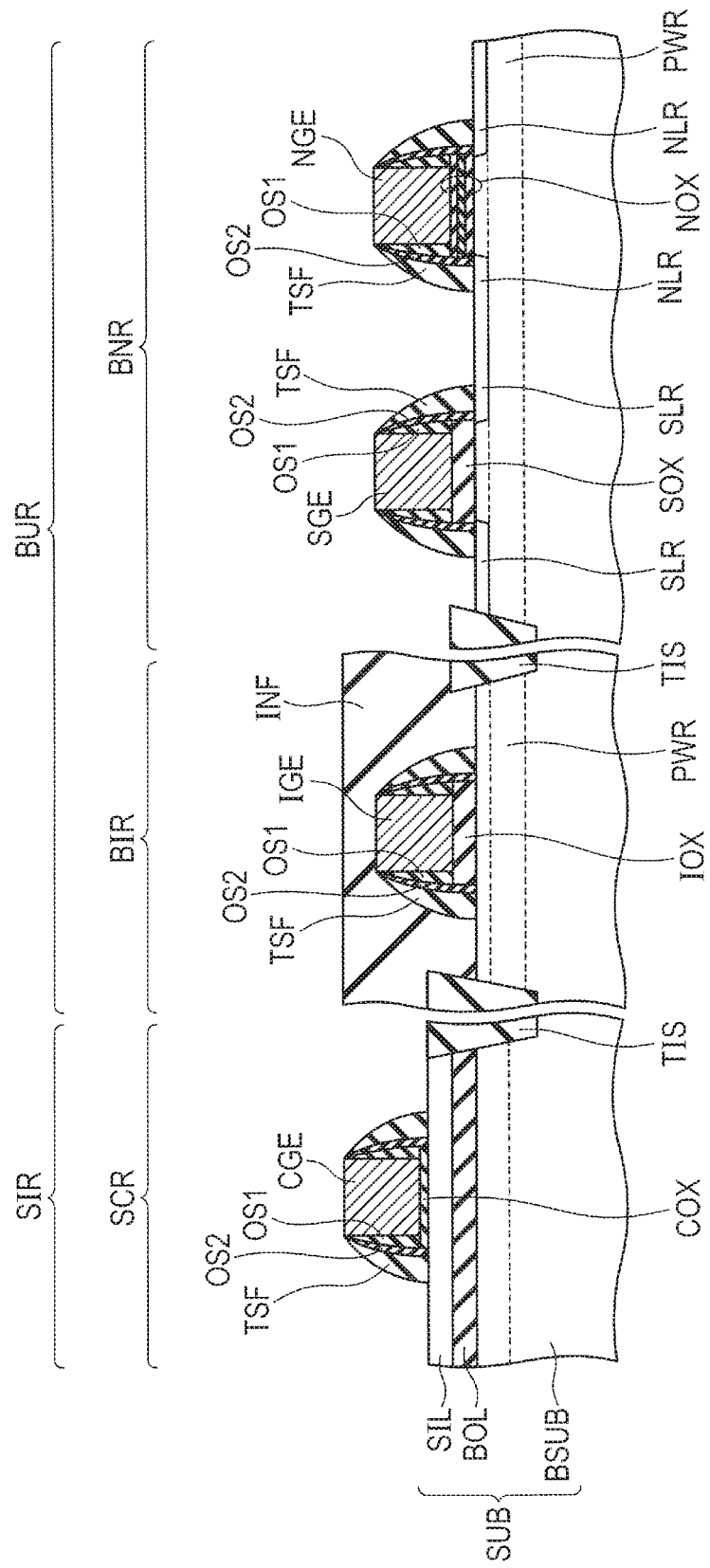
FIG. 13 is a sectional view illustrating a step performed after the step illustrated in FIG. 12 in the first embodiment.

Subsequently, as shown in FIG. 13, hydrogen anneal processing is performed under a temperature condition of 750° C. or higher while the high-withstand-voltage MOS transistor region BIR is covered with the silicon nitride film INF. As a result, a slight amount of oxygen existing in the surfaces of the well region PWR and the silicon layer SIL is removed through a reduction reaction with hydrogen.

Figure 14:
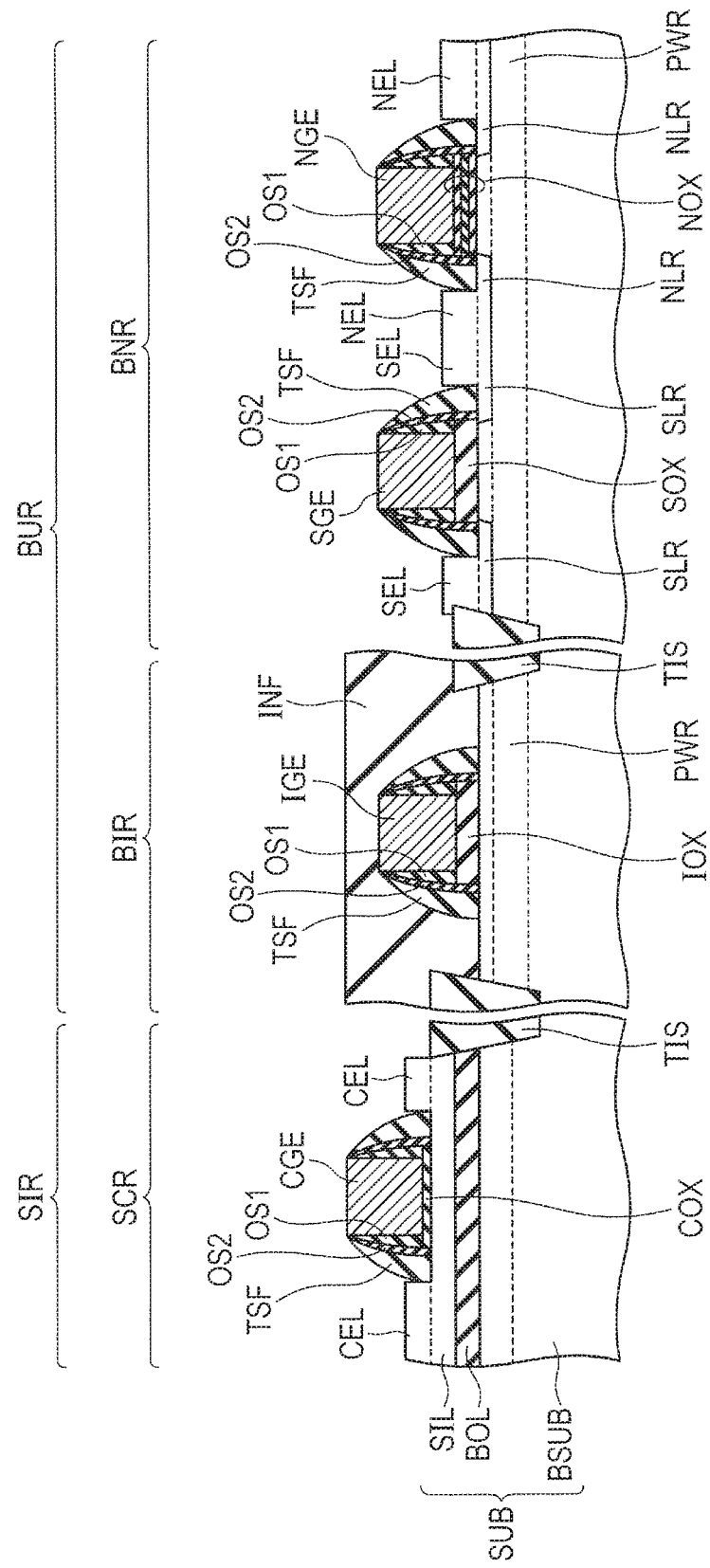
FIG. 14 is a sectional view illustrating a step performed after the step illustrated in FIG. 13 in the first embodiment.

Subsequently, epitaxial growth of silicon is performed. As shown in FIG. 14, the raised epitaxial layers NEL and SEL of silicon are each formed on the surface of the exposed well region PWR in the memory region BNR. A raised epitaxial layer CEL of silicon is formed on the surface of the exposed silicon layer SIL in the low-withstand-voltage MOS transistor region SCR.

Each of the LDD regions NLR and SLR has been previously formed by ion implantation in the well region PWR of the memory region BNR. A relatively small damage is caused by the ion implantation because of a relatively low impurity concentration (about $10^{12}/cm^2$). In addition, oxygen has been removed from the surfaces of the well region PWR and the silicon layer SIL. As a result, the raised epitaxial layers NEL and SEL of silicon are stably grown. The inventors have found that the raised epitaxial layers NEL and SEL of silicon are stably grown at an impurity concentration of at most about $10^{14}/cm^2$.

Figure 15:
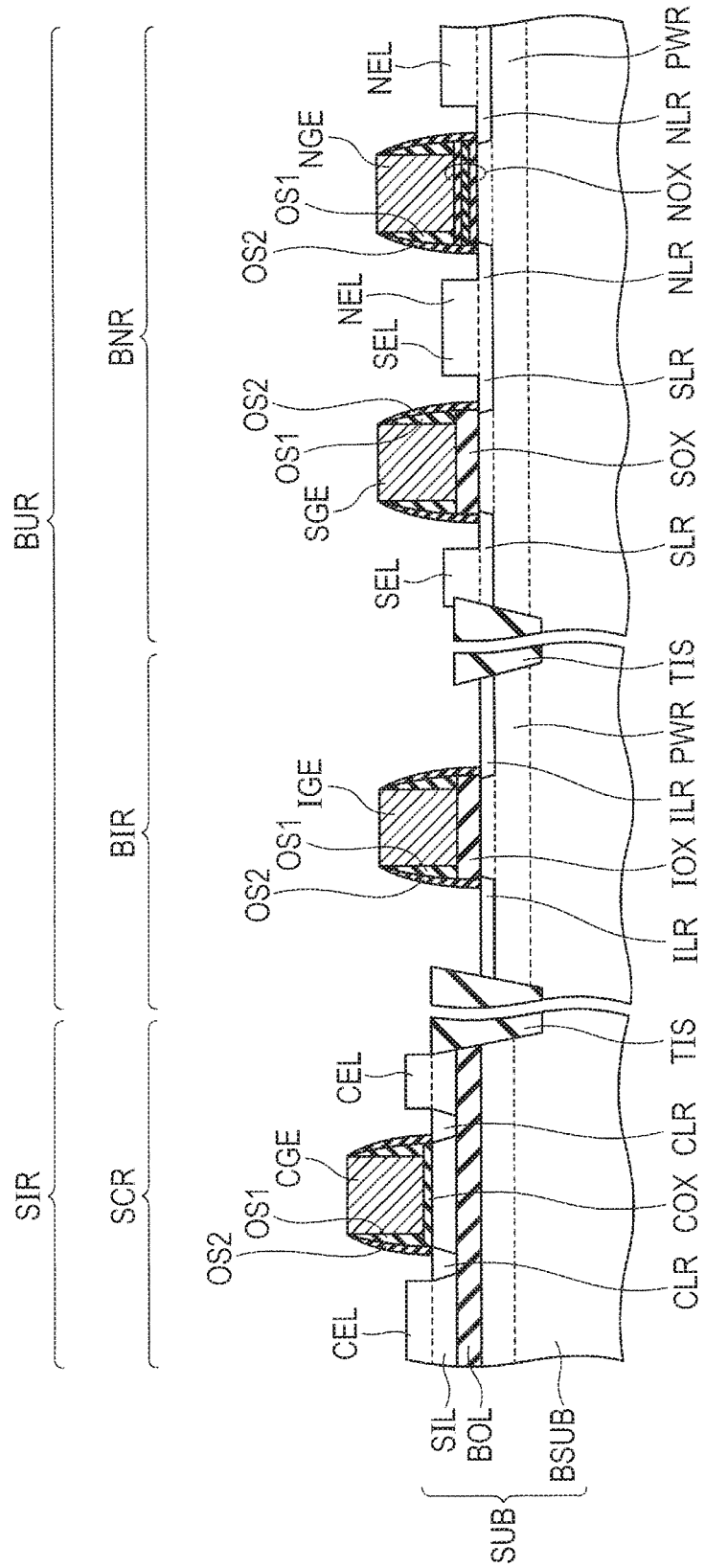
FIG. 15 is a sectional view illustrating a step performed after the step illustrated in FIG. 14 in the first embodiment.

Subsequently, as shown in FIG. 15, the silicon nitride film INF and the spacer film TSF are removed. Subsequently, predetermined photoengraving processing is performed to form an undepicted photoresist pattern that exposes the high-withstand-voltage MOS transistor region BIR and the low-withstand-voltage MOS transistor region SCR, but covers other regions. Subsequently, an n-type impurity is implanted with the photoresist pattern as an implantation mask to form the LDD region ILR in the well region PWR of the high-withstand-voltage MOS transistor region BIR. The LDD region CLR is formed in the silicon layer SIL of the low-withstand-voltage MOS transistor region SCR. Subsequently, the photoresist pattern is removed.

Figure 16:
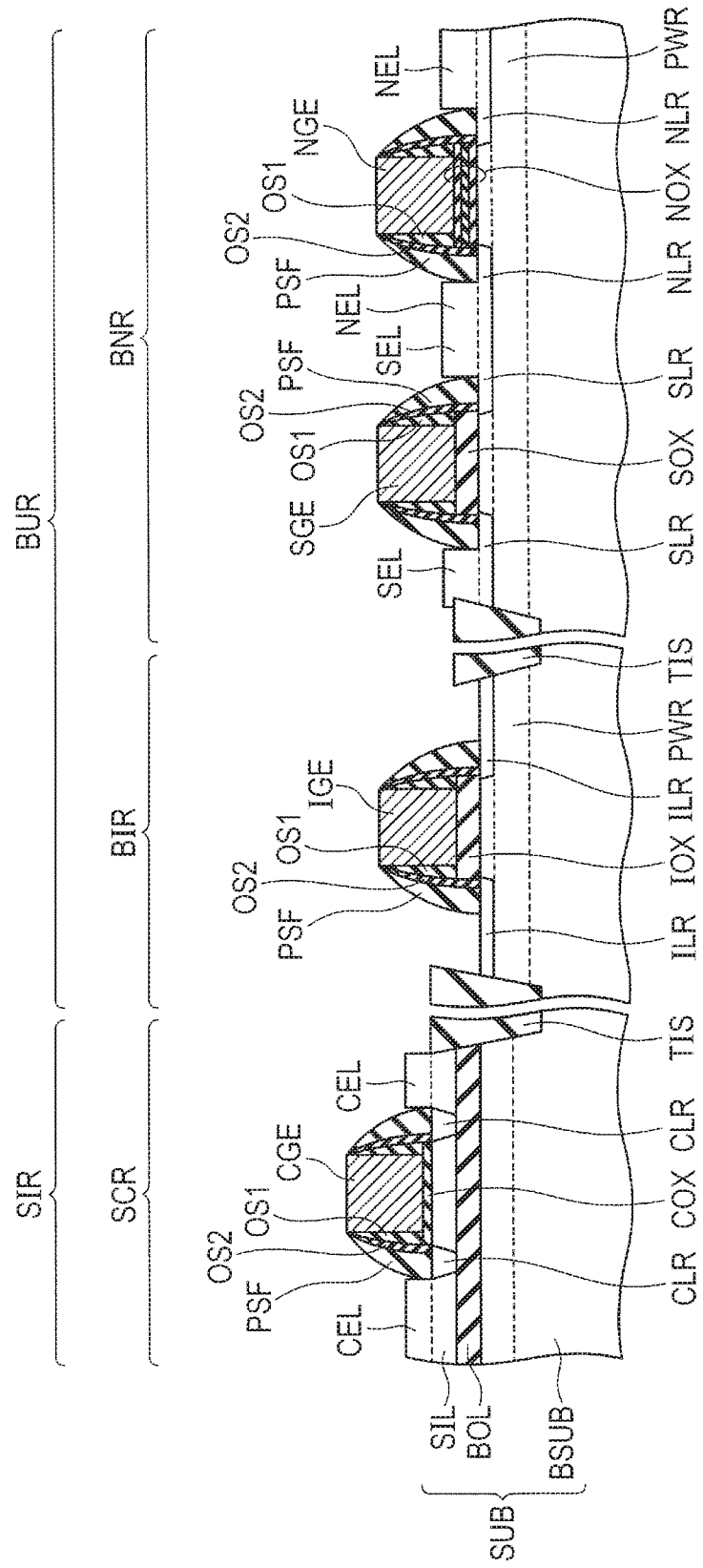
FIG. 16 is a sectional view illustrating a step performed after the step illustrated in FIG. 15 in the first embodiment.
Figure 17:
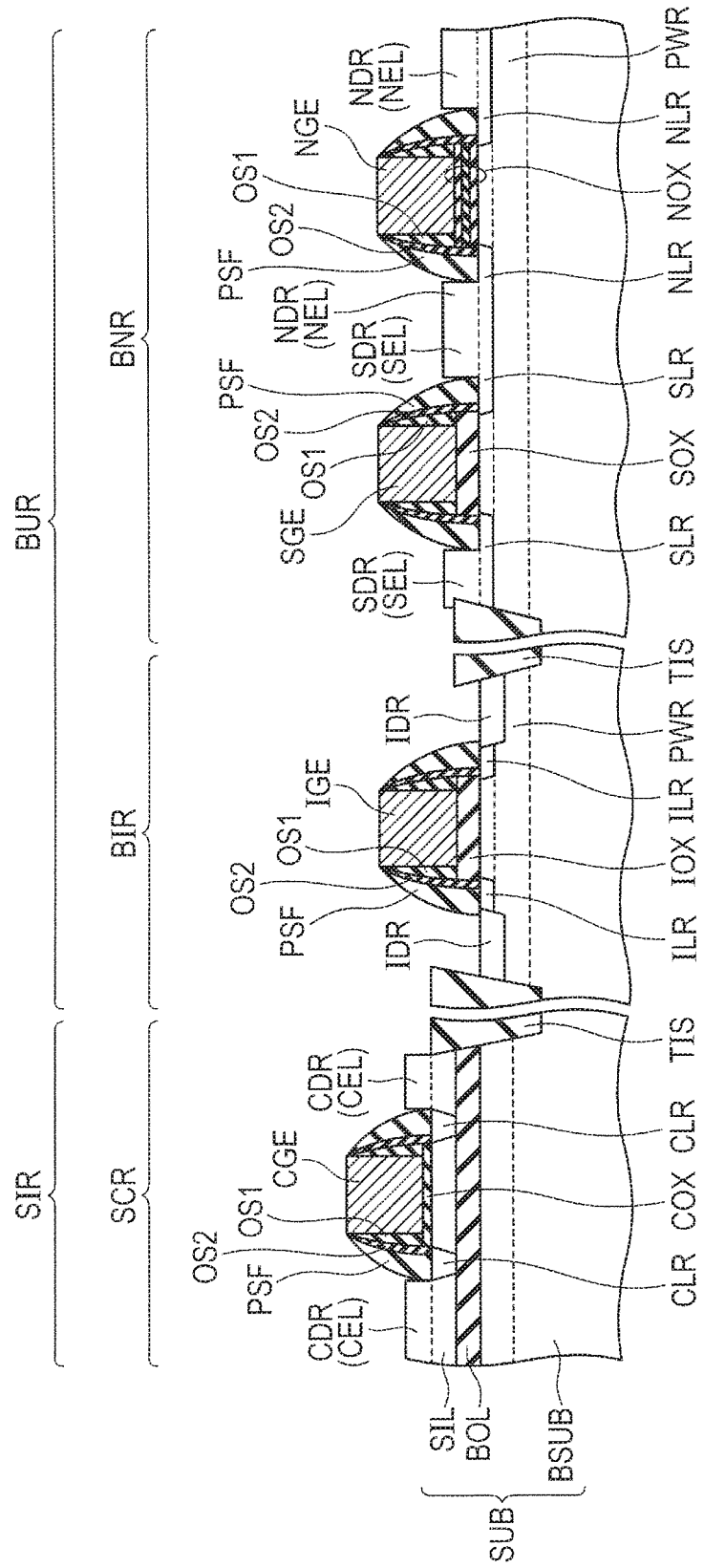
FIG. 17 is a sectional view illustrating a step performed after the step illustrated in FIG. 16 in the first embodiment.

Subsequently, for example, an undepicted silicon oxide film is formed so as to cover the gate electrodes NGE, SGE, IGE, and CGE. Subsequently, such a silicon oxide film is subjected to anisotropic etching processing to form a spacer film PSF over each of the sidewall surfaces of the gate electrodes NGE, SGE, IGE, and CGE, as shown in FIG. 16.

Subsequently, predetermined photoengraving processing is performed to form an undepicted photoresist pattern that exposes the memory region BNR, the high-withstand-voltage MOS transistor region BIR, and the low-withstand-voltage MOS transistor region SCR, but covers other regions. Subsequently, an n-type impurity is implanted with the photoresist pattern as an implantation mask to form the diffusion layer NDR in the raised epitaxial layer NEL and the diffusion layer SDR in the raised epitaxial layer SEL in the memory region BNR. The diffusion layer IDR is formed in the well region PWR in the high-withstand-voltage MOS transistor region BIR. The diffusion layer CDR is formed in the raised epitaxial layer CEL in the low-withstand-voltage MOS transistor region SCR. Subsequently, the photoresist pattern is removed.

Figure 18:
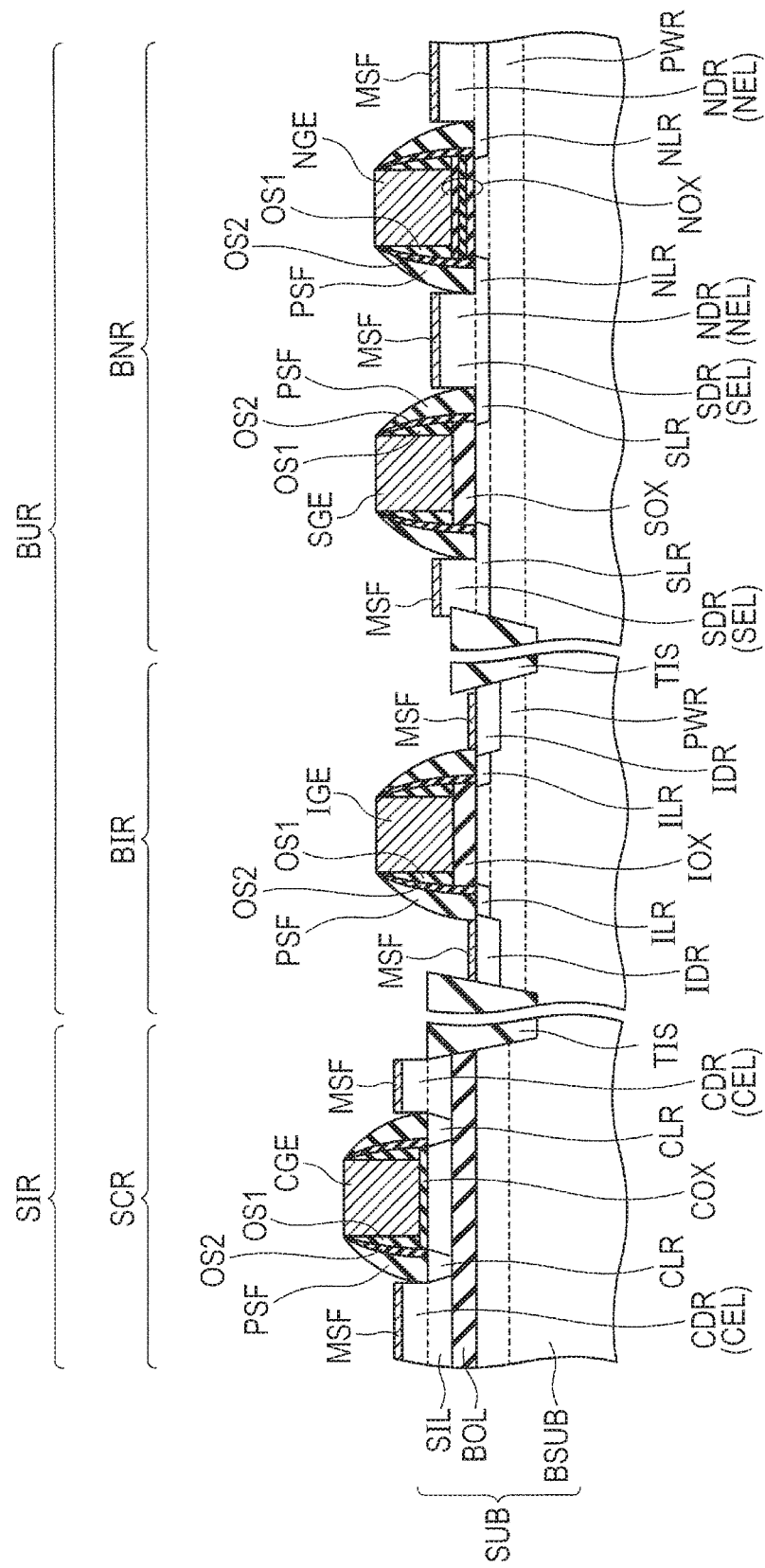
FIG. 18 is a sectional view illustrating a step performed after the step illustrated in FIG. 17 in the first embodiment.

Subsequently, as shown in FIG. 18, a metal silicide film MSF is formed on each of the surfaces of the raised epitaxial layers NEL, SEL, and CEL (diffusion layers NDR, SDR, and CDR) and the well region PWR (diffusion layer IDR) by a salicide process, for example.

Figure 19:
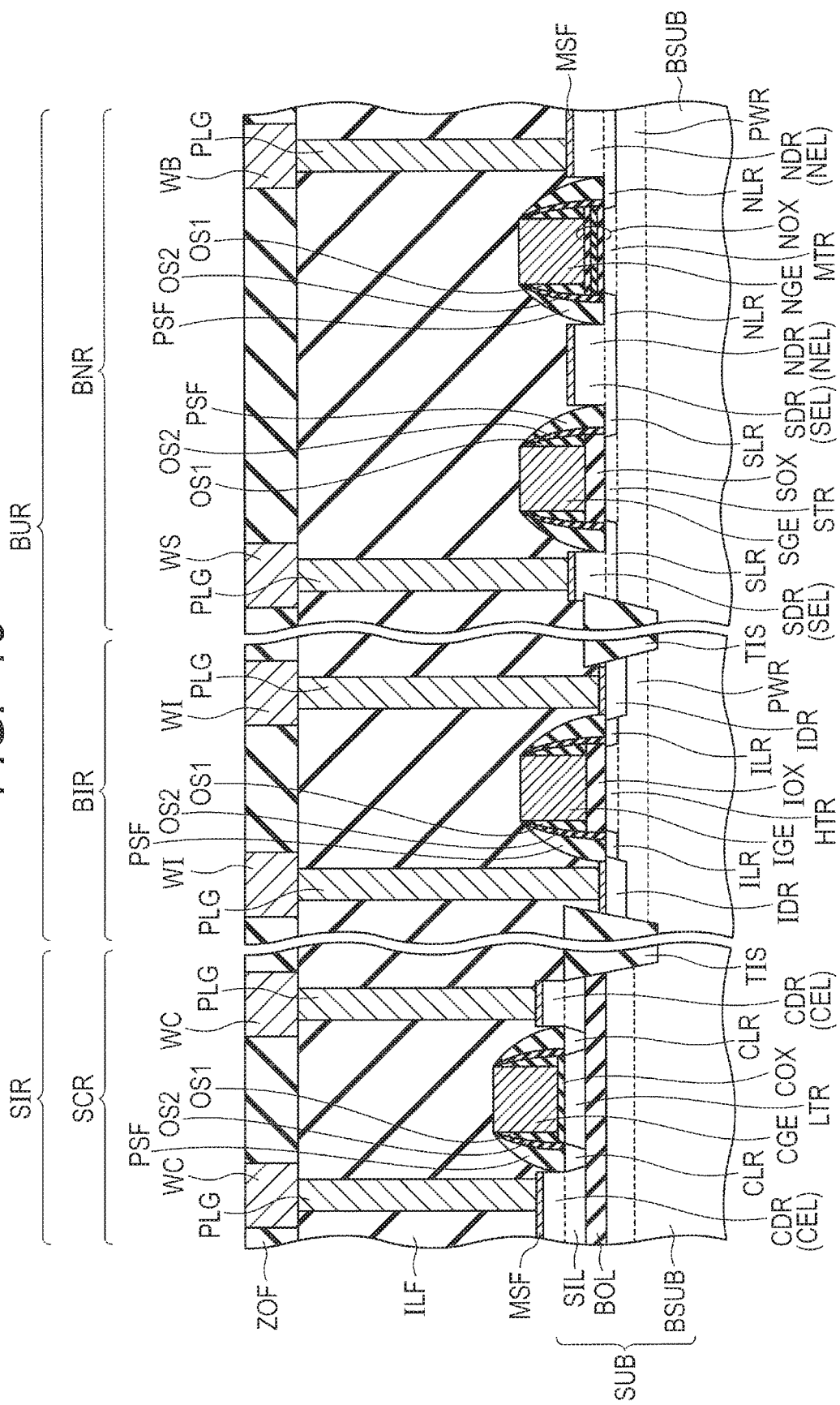
FIG. 19 is a sectional view illustrating a step performed after the step illustrated in FIG. 18 in the first embodiment.

Subsequently, as shown in FIG. 19, an interlayer insulating film ILF such as, for example, a silicon oxide film is formed so as to cover the gate electrodes NGE, SGE, IGE, and CGE. A plug PLG is formed so as to penetrate the interlayer insulating film ILF and reach each metal silicide film MSF. Subsequently, an insulating film ZOF is formed so as to cover the interlayer insulating film ILF. Interconnections WB, WS, WI, and WC are formed in the insulating film ZOF by a damascene process, for example. Subsequently, an undepicted top interconnection is formed as necessary, and thus the major part of the semiconductor device shown in FIG. 1 is completed.

Operation of the semiconductor device of the first embodiment is now described. First, a circuit diagram of memory cells in the memory region BNR is described. The memory cells in the memory region BNR of the semiconductor device include the memory transistors MTR and the selection transistors STR arranged in a matrix. Four memory cells are exemplified herein to simplify the description.

Figure 20:
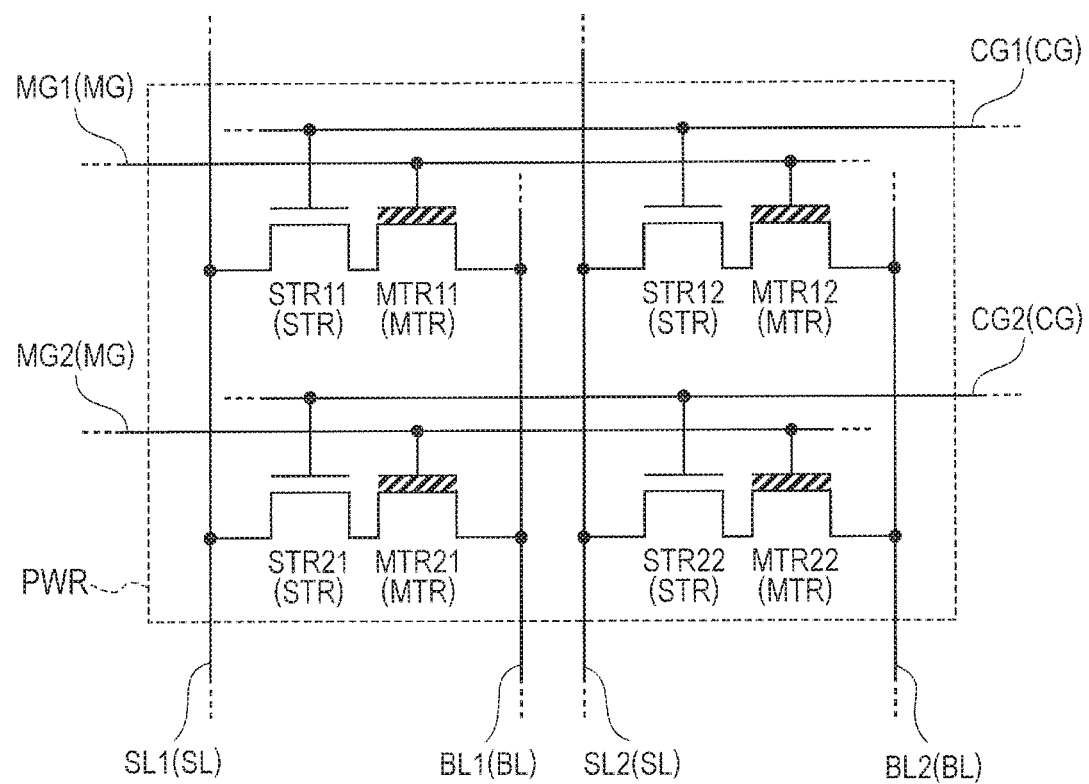
FIG. 20 is a circuit diagram of memory cells in a memory region in the first embodiment.

As shown in FIG. 20, the memory gate lines MG and the selection gate lines CG are disposed so as to intersect the source lines SL and the bit lines BL. The memory transistor MTR and the selection transistor STR are electrically coupled in series between the source line SL and the bit line BL. The gate electrode of the memory transistor MTR is electrically coupled to the memory gate line MG. The gate electrode of the selection transistor STR is electrically coupled to the selection gate line CG. Memory transistors MTR11 to MTR22 and selection transistors STR11 to STR22 are provided in a p-type well region PWR.

The memory transistor MTR11 and the selection transistor STR11 are electrically coupled in series between a source line SL1 and a bit line BL1. The gate electrode of the memory transistor MTR11 is electrically coupled to a memory gate line MG1. The gate electrode of the selection transistor STR11 is electrically coupled to a selection gate line CG1.

The memory transistor MTR12 and the selection transistor STR12 are electrically coupled in series between a source line SL2 and a bit line BL2. The gate electrode of the memory transistor MTR12 is electrically coupled to the memory gate line MG1. The gate electrode of the selection transistor STR12 is electrically coupled to the selection gate line CG1.

The memory transistor MTR21 and the selection transistor STR21 are electrically coupled in series between the source line SL1 and the bit line BL1. The gate electrode of the memory transistor MTR21 is electrically coupled to a memory gate line MG2. The gate electrode of the selection transistor STR21 is electrically coupled to a selection gate line CG2.

The memory transistor MTR22 and the selection transistor STR22 are electrically coupled in series between the source line SL2 and the bit line BL2. The gate electrode of the memory transistor MTR22 is electrically coupled to the memory gate line MG2. The gate electrode of the selection transistor STR22 is electrically coupled to the selection gate line CG2.

Figure 21:
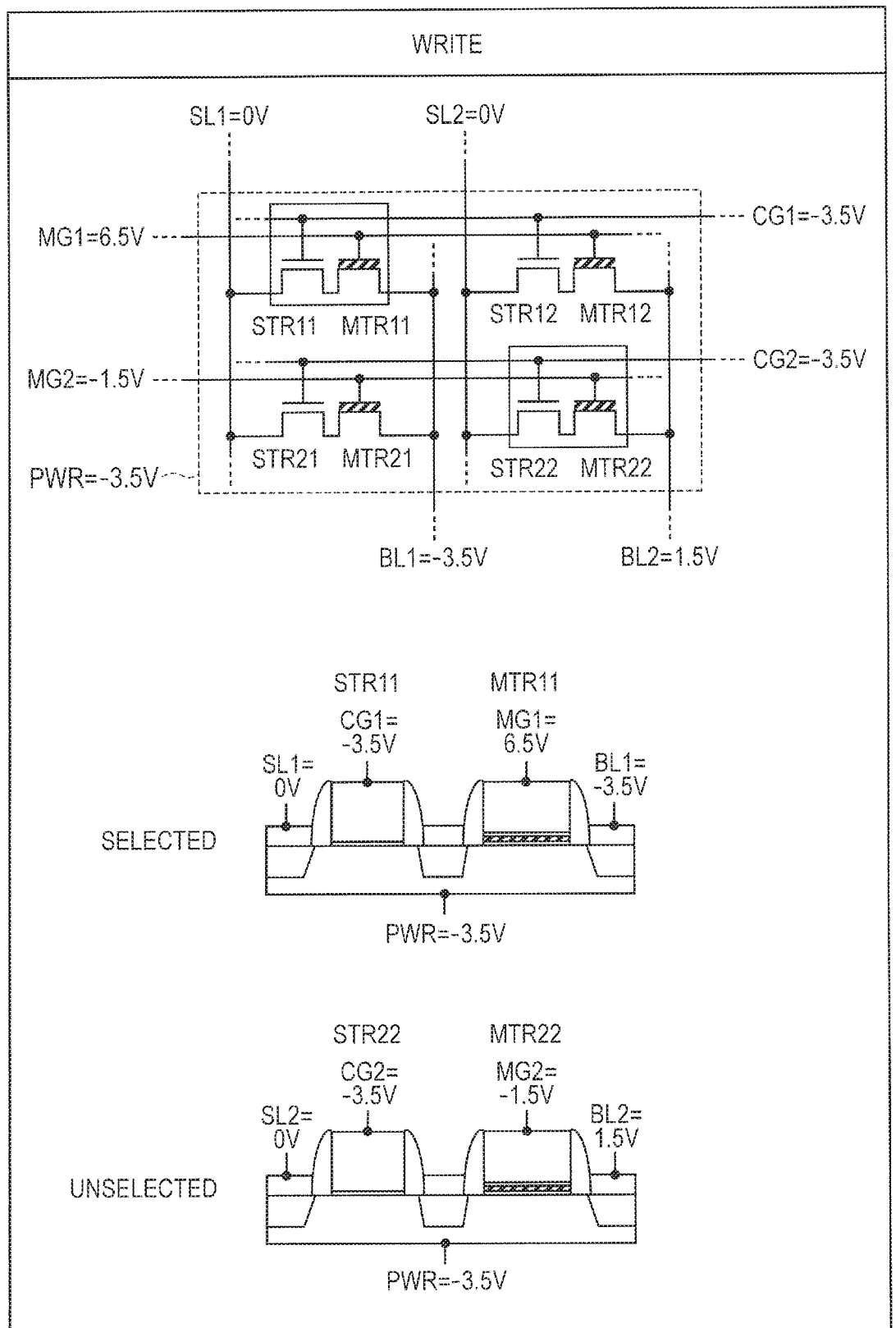
FIG. 21 is a diagram to explain information write operation on a memory cell in the first embodiment.

Information write operation on a memory sell is now described with reference to the circuit diagram shown in FIG. 20. As shown in FIG. 21, the selected bit to be written is assumed to include the memory transistor MTR11 and the selection transistor STR11, for example. For example, 6.5 V, −3.5 V, 0 V, −3.5 V, and −3.5 V are applied to the memory gate line MG1, the selection gate line CG1, the source line SL1, the bit line BL1, and the well region PWR, respectively.

As a result, a positive bias is applied to the gate electrode NGE of the memory transistor MTR11, and electron is injected into the charge storage layer (silicon nitride film NI) of the gate insulating film NOX from the well region PWR to which a negative bias is applied. In this way, information write operation is performed on the selected bit.

On the other hand, for example, assuming the unselected bit to be not written includes the memory transistor MTR22 and the selection transistor STR22, −1.5 V, −3.5 V, 0 V, 1.5 V, and −3.5 V are applied to the memory gate line MG2, the selection gate line CG2, the source line SL2, the bit line BL2, and the well region PWR, respectively. As a result, a negative bias is applied to the gate electrode NGE of the memory transistor MTR22, and no electron is injected into the charge storage layer (silicon nitride film NI) of the gate insulating film NOX.

The diffusion layer NDR, to which an electric potential of the bit line is applied, is provided in the raised epitaxial layer NEL in the memory transistor MTR of the semiconductor device. This suppresses influence of the impurity in the diffusion layer on the impurity concentration profile of the LDD region NLR. Consequently, accidental erasure of information in the unselected bit is reduced compared with a case where the impurity concentration profile of the LDD region NLR changes steeply or gently. This is described in detail later.

Figure 22:
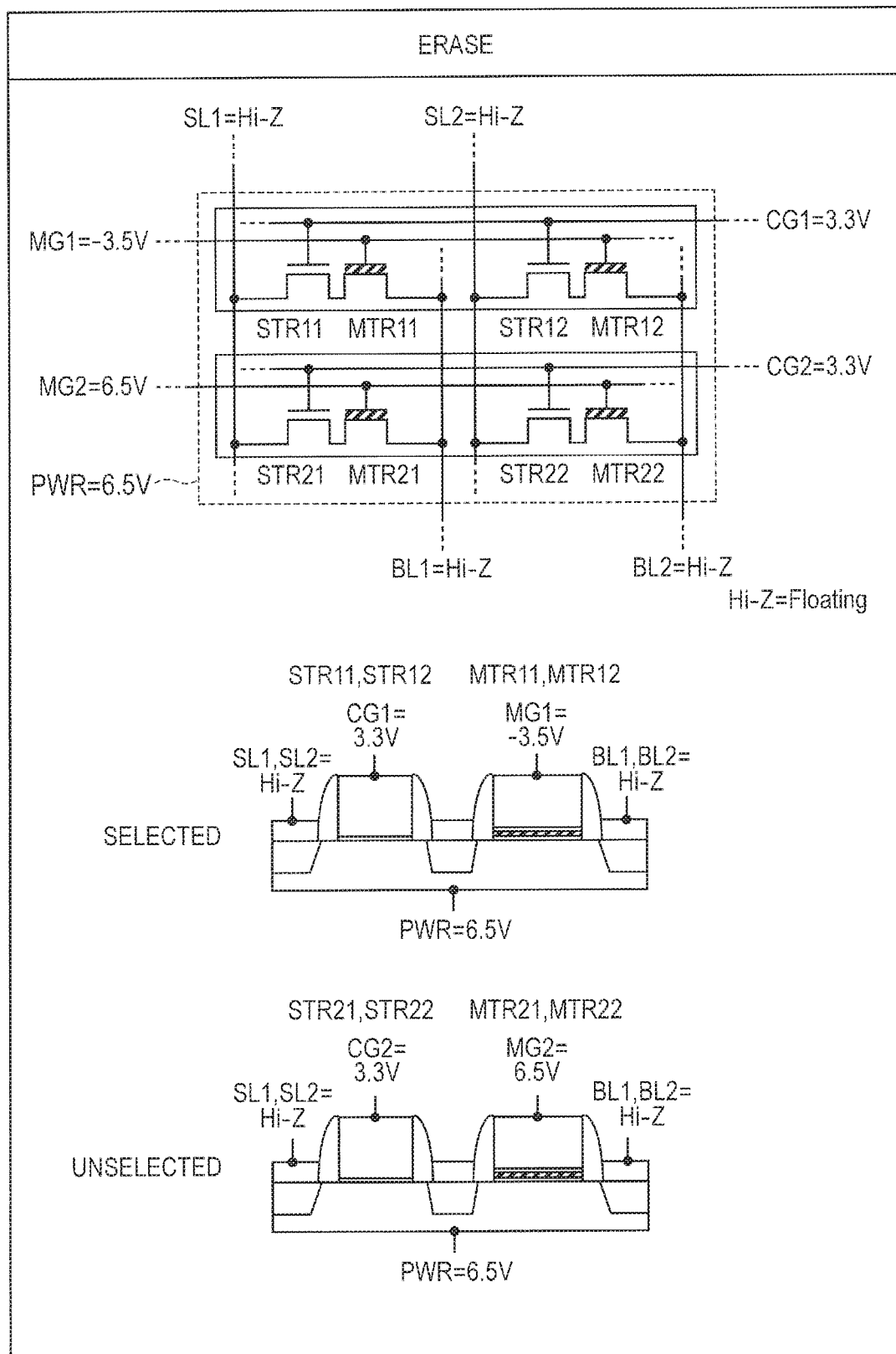
FIG. 22 is a diagram to explain information erasure operation on a memory cell in the first embodiment.

Information erasure operation on memory sells is now described. As shown in FIG. 22, the respective selected bits to be erased are assumed to include the memory transistor MTR11 and the selection transistor STR11, and the memory transistor MTR12 and the selection transistor STR12, for example.

For example, −3.5 V, 3.3 V, and 6.5 V are applied to the memory gate line MG1, the selection gate line CG1, and the well region PWR, respectively. The source lines SL1 and SL2 and the bit lines BL1 and BL2 are each adjusted to a high impedance (Hi-Z) state. The high impedance state means a floating state.

As a result, a negative bias is applied to the gate electrode NGE of each of the memory transistors MTR11 and MTR12, and thus electron stored in the charge storage layer of the gate insulating film NOX is extracted to the well region PWR to which a positive bias is applied. In this way, information erasure operation is performed on the selected bits.

On the other hand, assuming the respective unselected bits to be not erased include the memory transistor MTR21 and the selection transistor STR21, and the memory transistor MTR22 and the selection transistor STR22, 6.5 V, 3.3 V, and 6.5 V are applied to the memory gate line MG2, the selection gate line CG2, and the well region PWR, respectively. The source lines SL1 and SL2 and the bit lines BL1 and BL2 are each adjusted to a high impedance state. As a result, the electric potential of the gate electrode NGE of each of the memory transistors MTR21 and MTR22 becomes equal to the electric potential of the well region PWR, and thus no electron is extracted.

Figure 23:
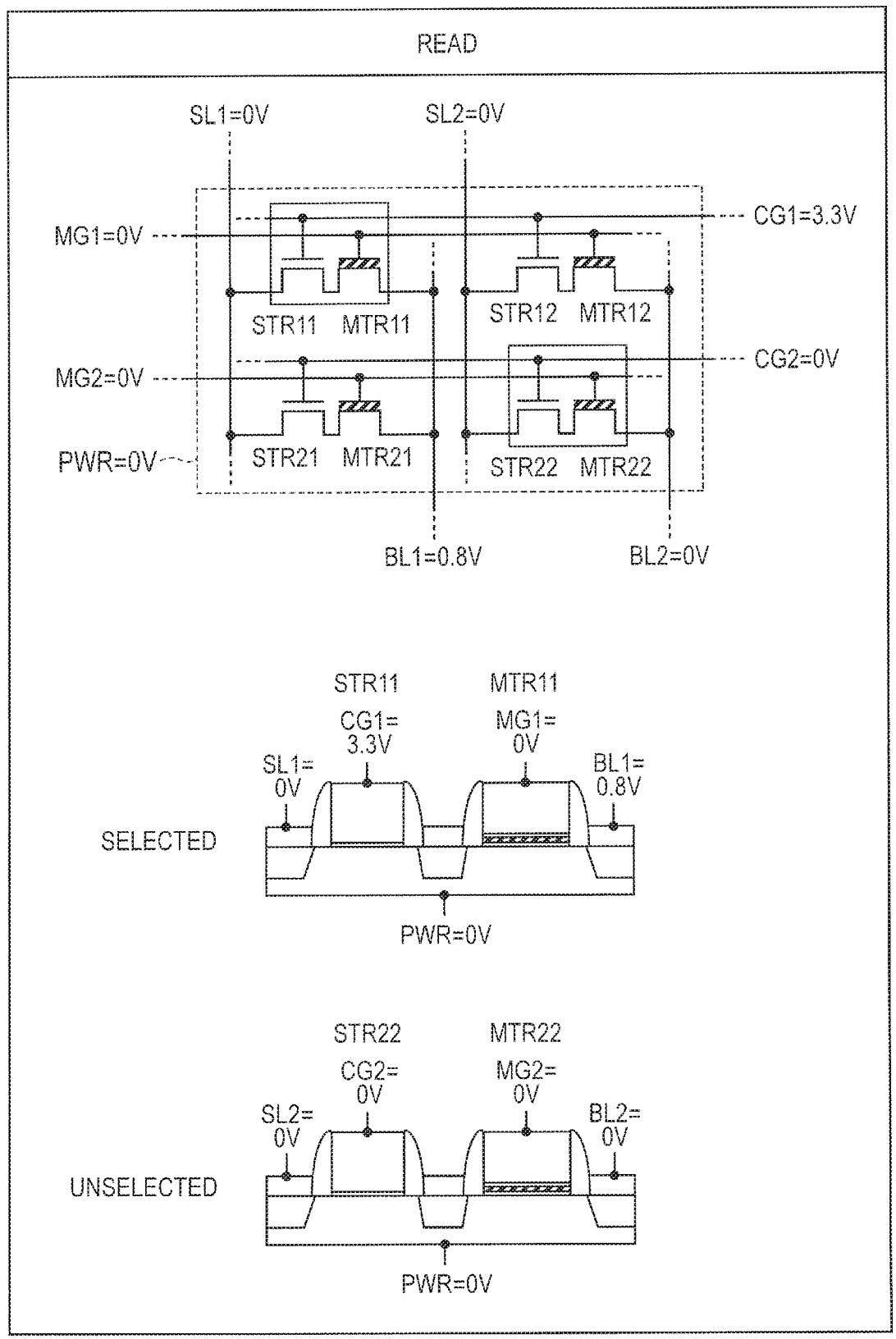
FIG. 23 is a diagram to explain information read operation on a memory cell in the first embodiment.

Information read operation on a memory sell is now described. As shown in FIG. 23, the selected bit to be read is assumed to include the memory transistor MTR11 and the selection transistor STR11, for example. For example, 0 V, 3.3 V, 0 V, 0 V, and 0 V are applied to the memory gate line MG1, the selection gate line CG1, the source line SL1, the bit line BL1, and the well region PWR, respectively.

If the charge storage layer of the memory transistor MTR11 stores the injected electron, the threshold voltage of the memory transistor MTR11 increases. No current therefore flows through the memory transistor MTR11 and the selection transistor STR11. If the charge storage layer stores no injected electron, the threshold voltage is reduced, and current flows through the memory transistor MTR11 and the selection transistor STR11. In this way, information read operation is performed on the selected bit.

On the other hand, assuming the unselected bit to be not read includes the memory transistor MTR22 and the selection transistor STR22, 0 V, 0 V, 0 V, 0 V, and 0 V are applied to the memory gate line MG2, the selection gate line CG2, the source line SL2, the bit line BL2, and the well region PWR, respectively. No channel region is therefore formed in the selection transistor STR11, and thus information read operation is not performed.

In the memory transistor MTR of the semiconductor device, the diffusion layer NDR, to which the electric potential of the bit line is applied, is provided in the raised epitaxial layer NEL, which suppresses influence of the impurity in the diffusion layer NDR on the impurity concentration profile of the LDD region NLR, leading to a reduction in write disturb. This is described in comparison with a semiconductor device having no raised epitaxial layer. The used reference numeral of each part is the same as that of the semiconductor device of the first embodiment for convenience of the description.

When the impurity concentration profile steeply changes in the periphery of the LDD region NLR, hot hole, which is generated by a potential difference between an electric potential applied from the bit line BL and an electric potential applied to the well region PWR, may be injected during write operation into the charge storage layer in the memory transistor MTR of an unselected bit. If electron is stored in the charge storage layer, the information may be accidentally erased due to such hot-hole injection (write disturb).

When the impurity concentration profile gently varies in the periphery of the LDD region NLR, the electric potential of the channel region may float due to a depleted layer extending from the diffusion layer NDR. In the memory transistor MTR of the unselected bit, therefore, the electron stored in the charge storage layer may be extracted to the well region (channel region) due to the potential difference between the electric potential of the gate electrode to which a negative bias is applied and the electric potential of the channel region, leading to erasure of the information (write disturb).

Figure 24:
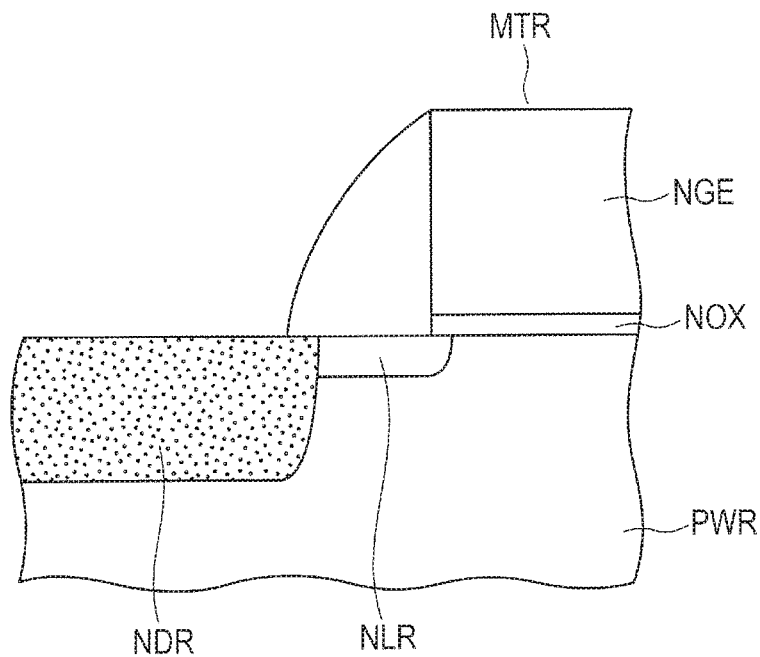
FIG. 24 is a first partial sectional view of a memory as a comparative example to explain functions and effects of a memory of the semiconductor device in the first embodiment.
Figure 25:
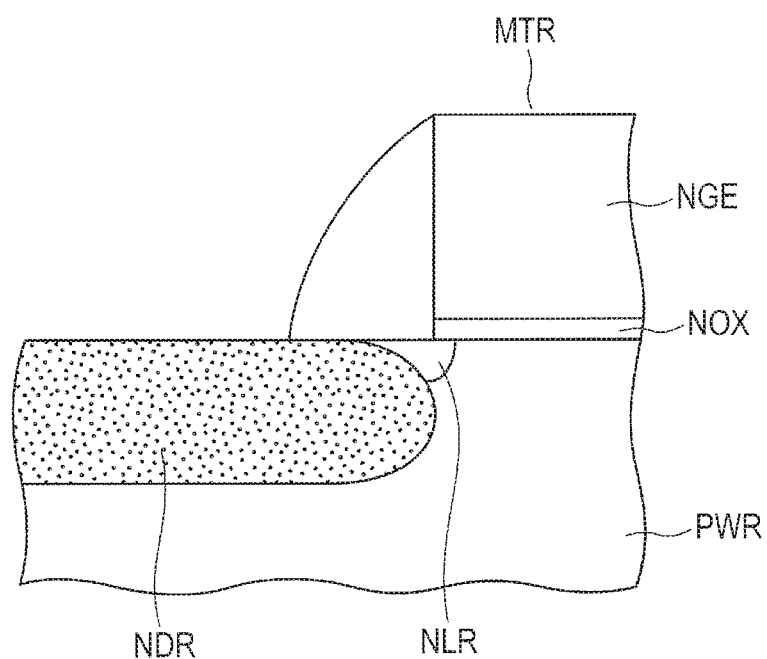
FIG. 25 is a second partial sectional view of the memory as the comparative example to explain the functions and effects of the memory of the semiconductor device in the first embodiment.

Hence, the impurity concentration profile of the LDD region NLR and its periphery is required to be accurately controlled in the semiconductor device in which the diffusion layer NDR is provided in the well region PWR as shown in FIG. 24. However, when the diffusion layer NDR is provided in the well region PWR, the impurity in the diffusion layer NDR may be diffused as shown in FIG. 25 along with a series of heat treatment performed after formation of the diffusion layer NDR. As a result, the impurity concentration profile of the LDD region NLR and its periphery is deviated from a desired profile, and thus write disturb easily occurs in the unselected bit.

The inventors therefore have had an idea of a structure, in which the impurity in the LDD region NLR and its periphery of the memory transistor MTR is not affected by the impurity in the diffusion layer NDR, i.e., an idea of the structure, in which the raised epitaxial layer NEL is formed on the surface of the well region PWR and the diffusion layer NDR is formed in the raised epitaxial layer NEL (see FIG. 1).

The inventors have made various investigations on the result of simulation of the impurity concentration profile in the periphery of the MOS transistor, the simulation being performed in a series of development of the semiconductor device. First, FIG. 26 shows an example of a simulation result of an impurity concentration profile as a comparative example.

In a condition of the simulation, the gate electrode GEL has a height H of 100 nm and a length L in a gate length direction of 100 nm. The implantation condition for the LDD region includes a condition: P, 20 keV, and $1.2 \times 10^{12}$ cm$^{-2}$, where the gate electrode GEL is used as an implantation mask. The implantation condition for the source/drain region includes a condition: As, 20 keV, and 4×10$^{15}$ cm$^{-2}$ and a condition; P, 10 keV, and 5×10$^{14}$ cm$^{-2}$, where the gate electrode GEL and the sidewall insulating film SWF are used as an implantation mask. The implantation condition for the halo region includes a condition: BF$_2$, 60 keV, and 1.2×10$^{13}$ cm$^{-2}$. The illustrated impurity concentration profile is a profile after a series of heat treatment has been performed in a manufacturing process.

Figure 26:
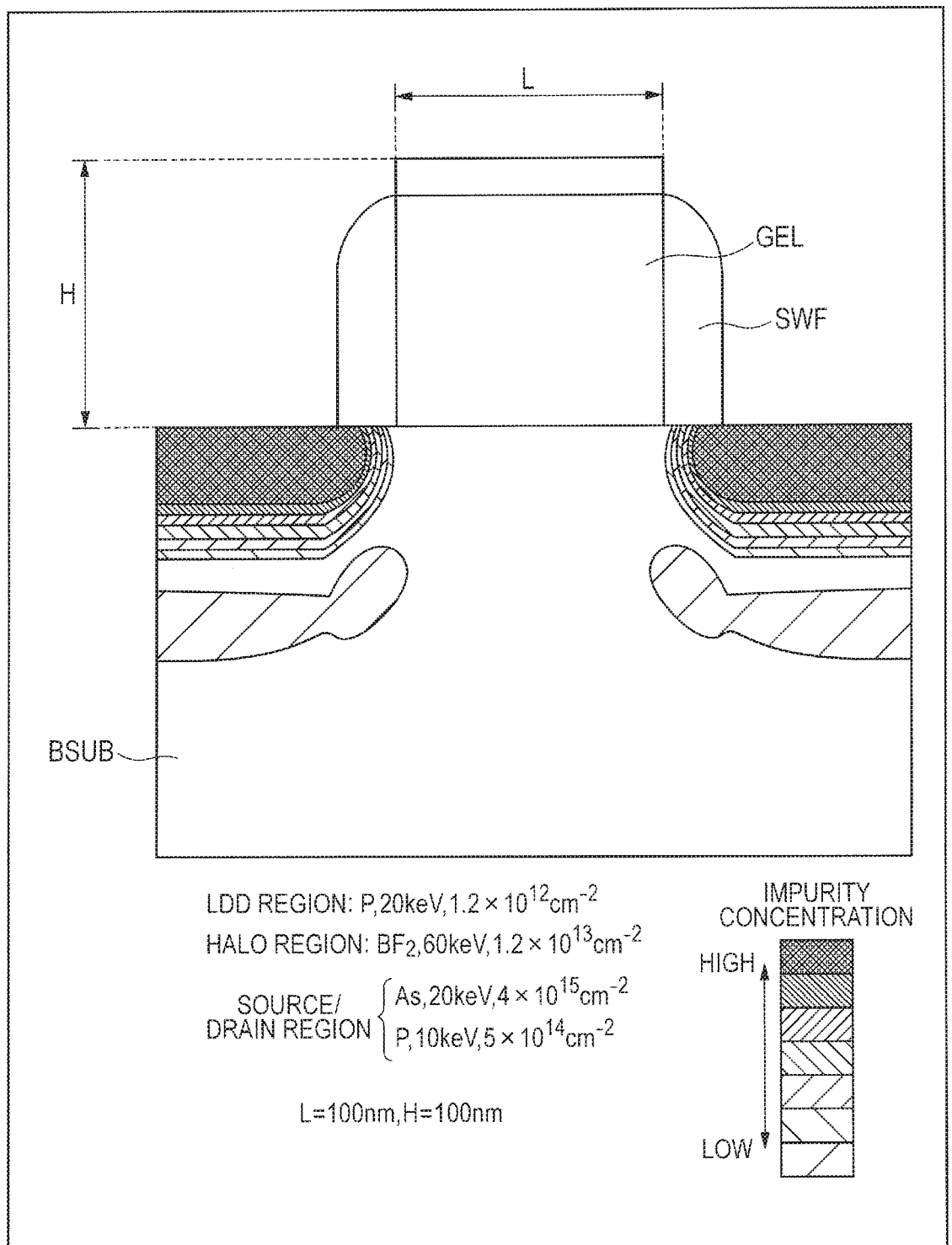
FIG. 26 is a first diagram illustrating an evaluation result of an impurity concentration profile by simulation to explain the functions and effects of the memory of the semiconductor device in the first embodiment.

As shown in FIG. 26, after the series of heat treatment, the impurity in the source/drain region (corresponding to the diffusion layer) is diffused up to a region corresponding to the LDD region, showing an increase in impurity concentration of the region corresponding to the LDD region. That is, the LDD region is hidden in the source/drain region.

When the result of the impurity concentration profile by the simulation are applied to the memory transistor, write disturb probably occurs in the unselected bit during write operation.

Figure 27:
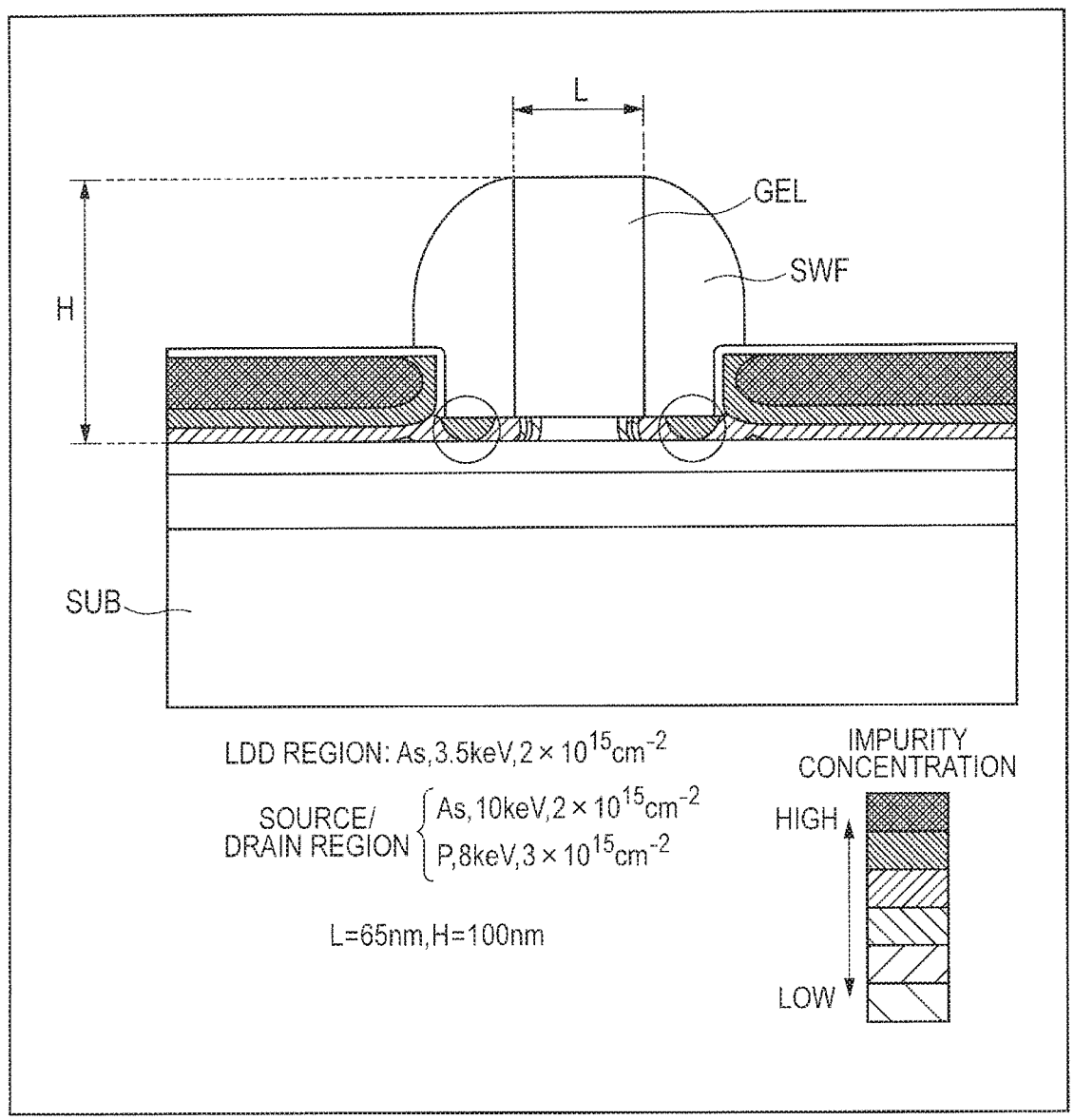
FIG. 27 is a second diagram illustrating an evaluation result of an impurity concentration profile by simulation to explain the functions and effects of the memory of the semiconductor device in the first embodiment.

FIG. 27 shows an example of a simulation result of the impurity concentration profile in the periphery of the MOS transistor having the raised epitaxial layer.

In a condition of the simulation, the gate electrode has a height H of 100 nm and a length L in a gate length direction of 65 nm. The implantation condition for the LDD region includes a condition: As, 3.5 keV, and 2×10$^{15}$ cm$^{-2}$, where the gate electrode GEL is used as an implantation mask. The implantation condition for the source/drain region includes a condition: As, 10 keV, and 2×10$^{15}$ cm$^{-2}$ and a condition: P, 8 keV, and 3×10$^{15}$ cm$^{-2}$, where the gate electrode GEL and the sidewall insulating film SWF are used as an implantation mask. The illustrated impurity concentration profile is a profile after a series of heat treatment has been performed in a manufacturing process.

As shown in FIG. 27, after the series of heat treatment, the impurity in the source/drain region (corresponding to the diffusion layer) substantially remains in a portion of the raised epitaxial layer and is not diffused up to a region corresponding to the LDD region, showing that the impurity concentration profile of the LDD region is maintained (see inside of circular frame).

In this simulation, the concentration of the impurity (As) is set to 2×10$^{15}$ cm$^{-2}$ in the implantation condition for the LDD region. On the other hand, the impurity concentration of the LDD region of the memory transistor is on the order of about 10$^{12}$ cm$^{-2}$. Hence, the order of the impurity concentration of the LDD region differs between the simulation result and the actual memory transistor.

From the simulation result, however, the inventors have considered that even if the impurity concentration of the LDD region is set to the order of about 10$^{12}$ cm$^{-2}$, the impurity in the source/drain region (corresponding to the diffusion layer) remains in the portion of the raised epitaxial layer, and the profile of the impurity concentration of the LDD region is maintained.

Hence, the inventors have considered that the impurity concentration profile of the LDD region NLR and its periphery is maintained, thereby it is possible to suppress occurrence of write disturb (accidental erasure) in the unselected bit during write operation.

The effects of high-temperature hydrogen anneal are now described. High-temperature hydrogen anneal is known to improve the retention characteristics of the memory transistor compared with the case where the high-temperature hydrogen anneal is not performed.

Figure 28:
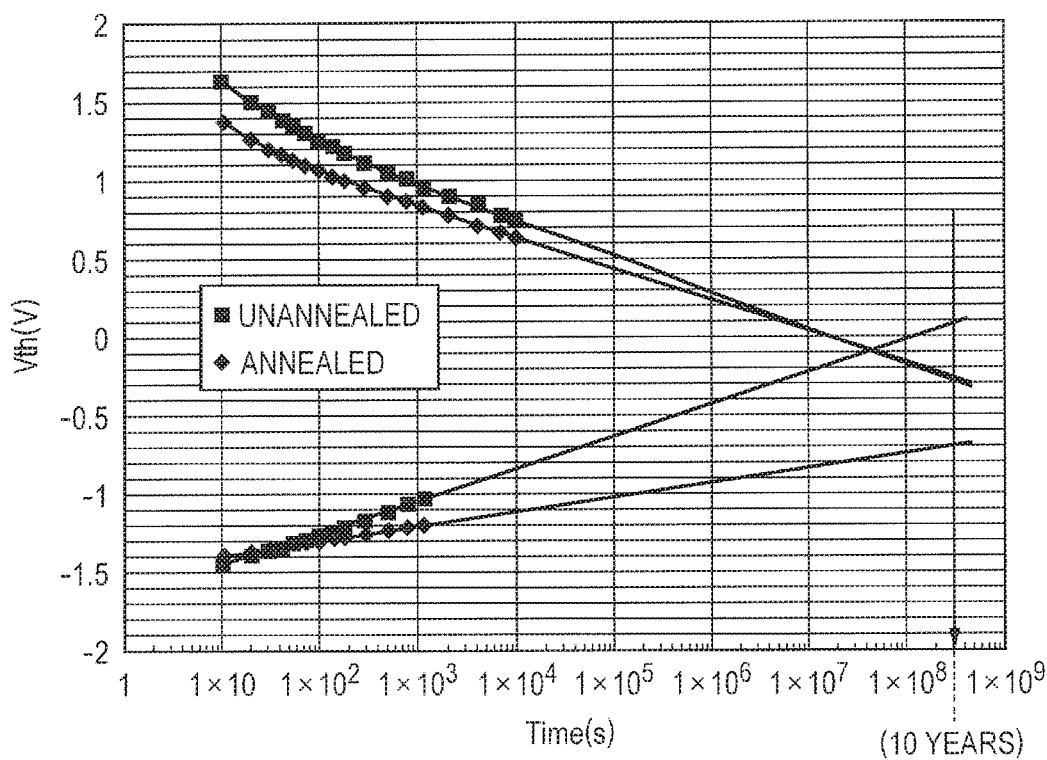
FIG. 28 is a graph illustrating retention characteristics of the memory to explain the functions and effects of the memory of the semiconductor device in the first embodiment.

FIG. 28 shows the result of evaluation of the retention characteristics in each of the write state and the erasure state after rewrite stress is applied to the gate insulating film of the memory transistor. The abscissa represents time, and the ordinate represents the threshold voltage. When the charge storage layer of the gate insulating film has the injected electron, the threshold voltage is relatively high. When the charge storage layer of the gate insulating film has no injected electron, the threshold voltage is relatively low.

When the charge storage layer of the gate insulating film has injected electron, the threshold voltage gradually decreases with time. When the charge storage layer of the gate insulating film has no injected electron, the threshold voltage gradually increases with time, and a difference in threshold voltage is large between the case where the hydrogen anneal is performed and the case where the hydrogen anneal is not performed. In the case where the hydrogen anneal is performed, the graph has a small gradient compared with the case where the hydrogen anneal is not performed, showing an improvement in the retention characteristics.

Rewrite stress application to the gate insulating film (ONO film) causes formation of interface states (traps) in a portion of the bottom silicon oxide film of the ONO film on a side close to the well region. The electron injected into the charge storage layer of the ONO film is easily escaped to the well region via the interface states. Hydrogen anneal is therefore performed to trap hydrogen in the interface states, making it possible to suppress escape of the electron injected into the charge storage layer to the well region.

Figure 29:
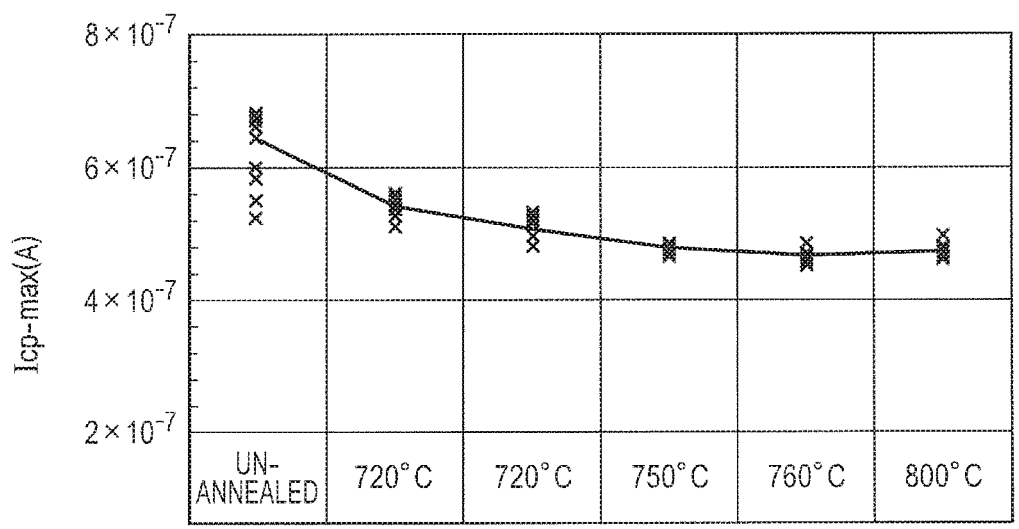
FIG. 29 is a graph illustrating an evaluation result of interface states in the memory to explain the functions and effects of the memory of the semiconductor device in the first embodiment.

FIG. 29 is a graph showing that the number of interface states in the silicon oxide film is decreased by the hydrogen anneal. The abscissa represents an anneal condition, and the ordinate represents a charge pump current. The charge pump current means a current that flows between the gate electrode and the substrate by applying an AC voltage therebetween, and is in proportion to the number of interface states. As shown in the graph, while the charge pump current without hydrogen anneal is relatively high and its value varies significantly, the charge pump current with hydrogen anneal is low and its value varies little.

As described above, the hydrogen anneal processing contributes to an improvement in retention characteristics of the memory transistor MTR. In the above-described semiconductor device, since the raised epitaxial layer is formed, hydrogen anneal processing can be performed before formation of the raised epitaxial layer in a substitutable manner.

It is therefore possible to prevent the impurity in the semiconductor element or the like other than the memory transistor MTR from being affected by hydrogen anneal, and thus prevent characteristics of the semiconductor device from being changed, compared with the case where hydrogen anneal is separately performed only to improve the retention characteristics of the memory transistor MTR. Deuterium may be used in place of hydrogen in the hydrogen anneal processing.

Second Embodiment

An example of a semiconductor device, in which one memory cell is configured by one memory transistor and one selection transistor and is provided in the SOI region, is now described.

Figure 30:
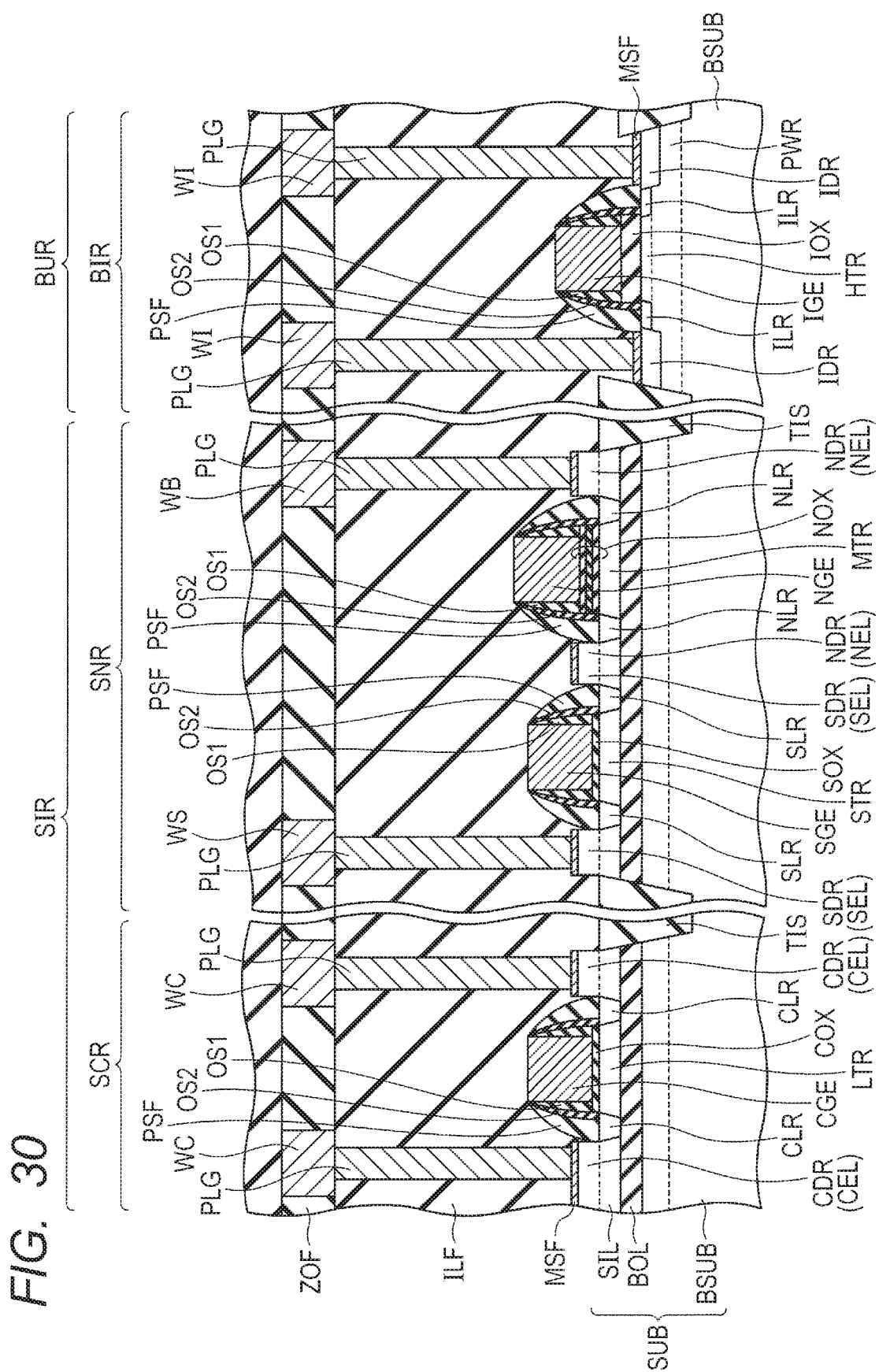
FIG. 30 is a sectional view of a semiconductor device of a second embodiment.

As shown in FIG. 30, the bulk region BUR and the SOI region SIR are defined in the SOI substrate SUB. The element isolation insulating film TIS defines the high-withstand-voltage MOS transistor region BIR in the bulk region BUR, and defines the memory region SNR and the low-withstand-voltage MOS transistor region SCR in the SOI region SIR.

The memory transistor MTR and the selection transistor STR are provided in the silicon layer SIL in the memory region SNR. The memory transistor MTR and the selection transistor STR are electrically coupled in series. The raised epitaxial layers NEL and SEL (raised parts) are provided on the surface of the silicon layer SIL.

The memory transistor MTR includes the gate insulating film NOX including the charge storage layer, the gate electrode NGE, the LDD region NLR, and the diffusion layer NDR. The gate insulating film NOX has a stacked structure in which a silicon oxide film, a silicon nitride film, and a silicon oxide film are stacked in this order. The silicon nitride film serves as the charge storage layer. The gate electrode NGE is provided over the silicon layer SIL with the gate insulating film NOX in between.

The raised epitaxial layer NEL is provided from the surface of the silicon layer SIL, on which the gate insulating film NOX is disposed, to a position higher than the surface. The LDD region NLR is provided from a portion of the silicon layer SIL located directly below a sidewall surface of the gate electrode NGE to a portion of the silicon layer SIL located directly below the raised epitaxial layer NEL. The diffusion layer NDR is provided mainly in the raised epitaxial layer NEL. The impurity concentration (second impurity concentration) of the diffusion layer NDR is higher than the impurity concentration (first impurity concentration) of the LDD region NLR.

The selection transistor STR includes the gate insulating film SOX, the gate electrode SGE, the LDD region SLR, and the diffusion layer SDR. The gate electrode SGE is provided over the silicon layer SIL with the gate insulating film SOX in between. The LDD region SLR is provided from a portion of the silicon layer SIL located directly below the sidewall surface of the gate electrode SGE to a portion of the silicon layer SIL located directly below the raised epitaxial layer SEL.

The diffusion layer SDR is provided mainly in the raised epitaxial layer SEL. The impurity concentration of the diffusion layer SDR is higher than the impurity concentration of the LDD region SLR. Since other configurations are similar to those of the semiconductor device shown in FIG. 1, the same components are designated by the same reference numeral, and duplicated description is omitted except when required.

An exemplary method of manufacturing the semiconductor device is now described. As mentioned in the first embodiment, although the case of forming the n-channel-type MOS transistor is described to simplify the description and drawings, a p-channel-type MOS transistor may also be formed in the semiconductor device.

First, the SOI substrate SUB is provided. Subsequently, predetermined photoengraving processing is performed to form a photoresist pattern PR11 that covers a region to be the SOI region SIR, but exposes a region to be the bulk region (see FIG. 31).

Figure 31:
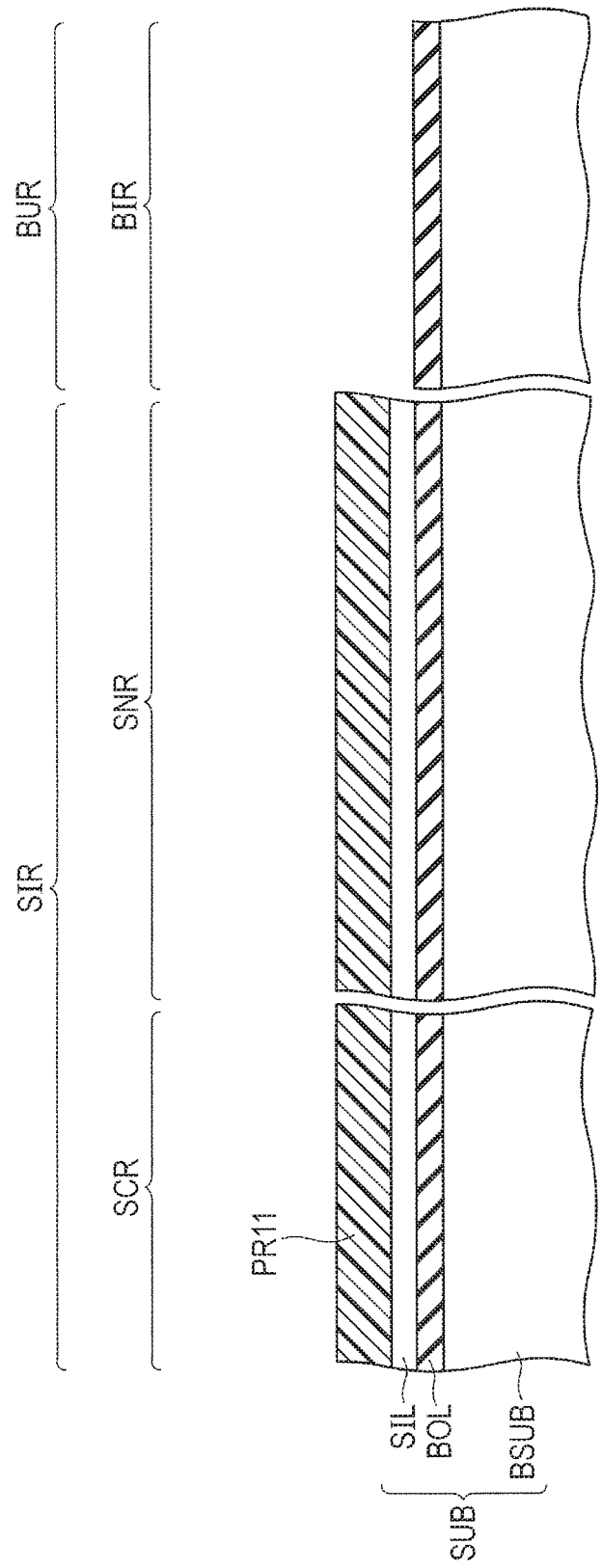
FIG. 31 is a sectional view illustrating one step of a method of manufacturing the semiconductor device in the second embodiment.

Subsequently, as shown in FIG. 31, the exposed silicon layer SIL is removed using the photoresist pattern PR11 as an etching mask to expose the insulating film BOL located in a region to be the bulk region BUR. Subsequently, the photoresist pattern PR11 is removed.

Figure 32:
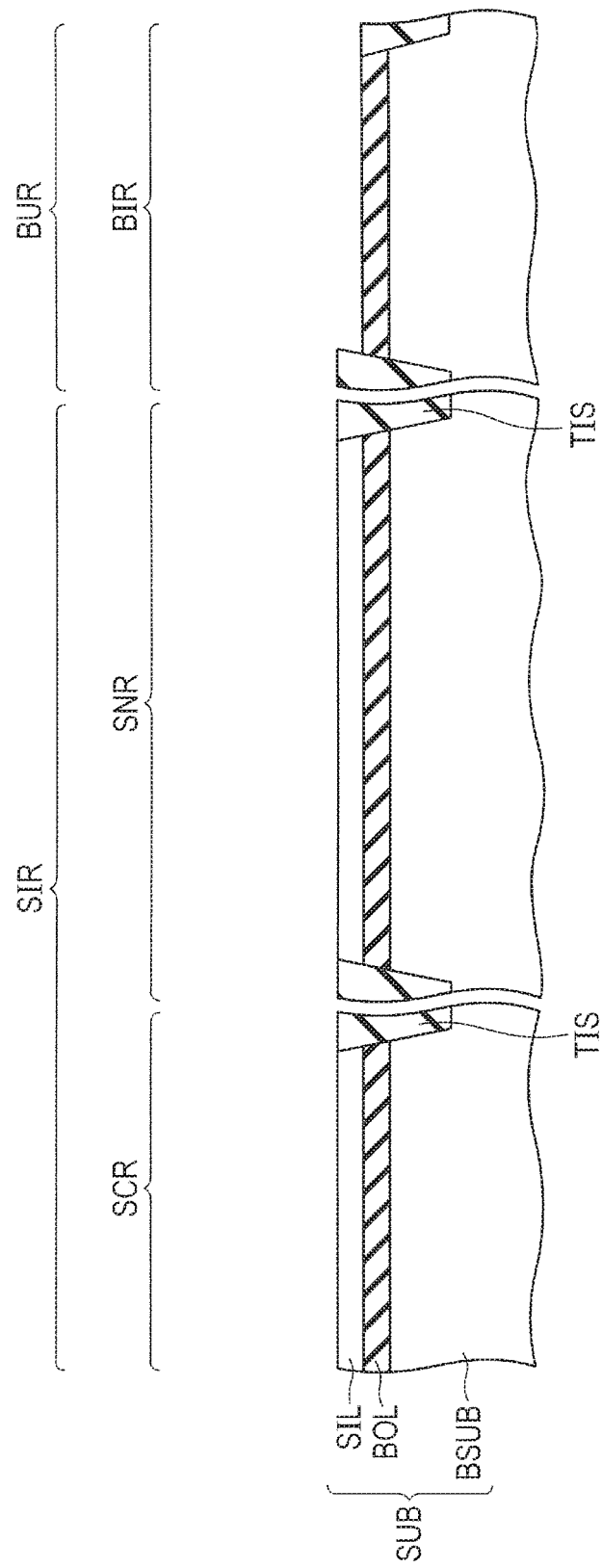
FIG. 32 is a sectional view illustrating a step performed after the step illustrated in FIG. 31 in the second embodiment.

Subsequently, predetermined photoengraving processing, etching processing, film formation processing, and the like are performed to form the element isolation insulating film TIS as shown in FIG. 32. The element isolation insulating film TIS defines the high-withstand-voltage MOS transistor region BIR in the region to be the bulk region BUR, and defines the memory region SNR and the low-withstand-voltage MOS transistor region SCR in the SOI region SIR.

Figure 33:
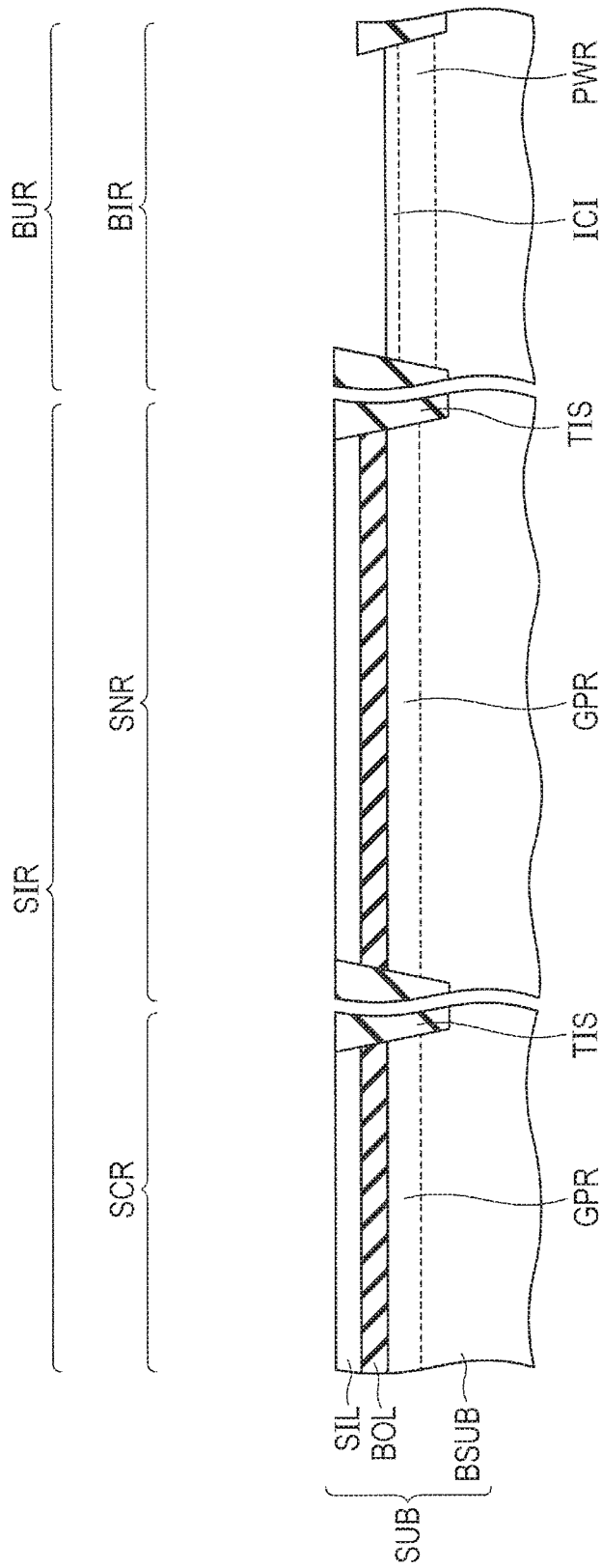
FIG. 33 is a sectional view illustrating a step performed after the step illustrated in FIG. 32 in the second embodiment.

Subsequently, as shown in FIG. 33, the insulating film BOL located in the region to be the bulk region BUR is removed to define the bulk region BUR. Subsequently, predetermined photoengraving processing and ion implantation (for example, B) are performed to form the p-type well region PWR in the bulk region BUR.

Subsequently, predetermined photoengraving processing and ion implantation (for example, $BF_2$) are performed to form the channel injection region ICI in the high-withstand-voltage MOS transistor region BIR. Predetermined photoengraving processing and ion implantation (for example, B) are performed to form the ground plane region GPR in a portion of the silicon substrate BSUB located directly below the insulating film BOL in the SOI region SIR.

Subsequently, thermal oxidation processing is performed to form a silicon oxide film OXF1 having a thickness of, for example, about 7.5 nm on the surfaces of the silicon layer SIL and the silicon substrate BSUB (see FIG. 34). Subsequently, predetermined photoengraving processing is performed to form a photoresist pattern PR12 that exposes a region, in which the memory transistor is to be formed, of the memory region SNR, and covers other regions (see FIG. 34).

Figure 34:
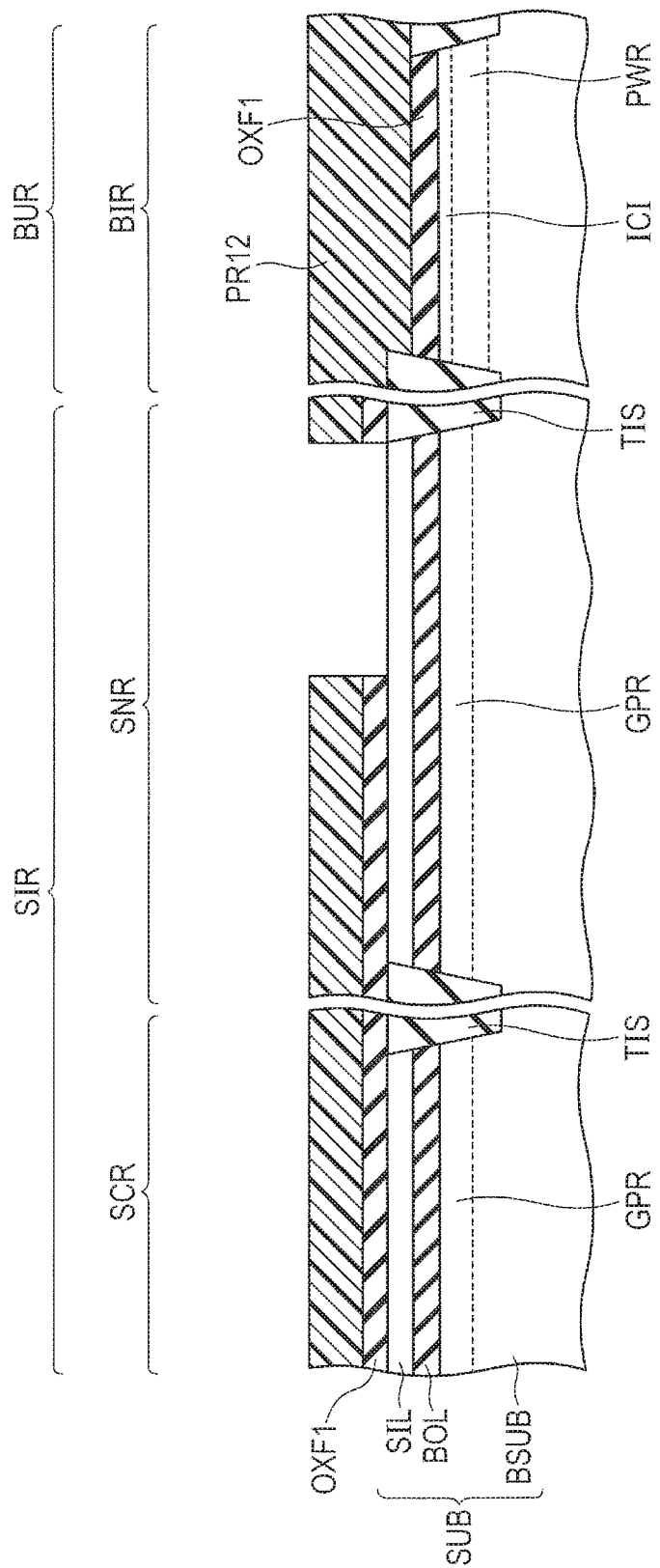
FIG. 34 is a sectional view illustrating a step performed after the step illustrated in FIG. 33 in the second embodiment.

Subsequently, as shown in FIG. 34, etching processing is performed with the photoresist pattern PR12 as an etching mask to remove a portion of the silicon oxide film OXF1 located in the region, in which the memory transistor is to be formed, of the memory region SNR. Subsequently, the photoresist pattern PR12 is removed.

Figure 35:
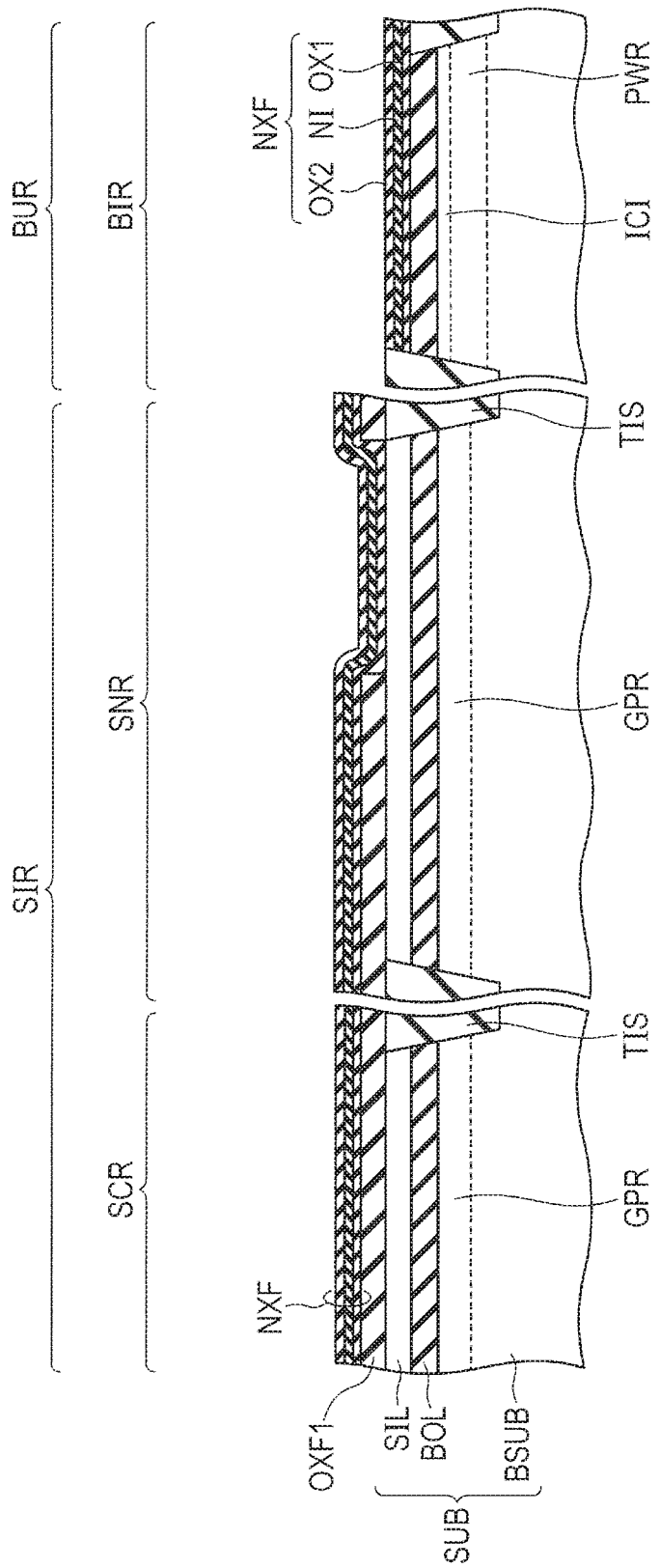
FIG. 35 is a sectional view illustrating a step performed after the step illustrated in FIG. 34 in the second embodiment.

Subsequently, as shown in FIG. 35, the ONO film NXF is formed so as to cover the silicon oxide film OXF1 and the like. Subsequently, predetermined photoengraving processing is performed to form a photoresist pattern PR13 that covers the region, in which the memory transistor is to be formed, of the memory region SNR, but exposes other regions (see FIG. 36).

Figure 36:
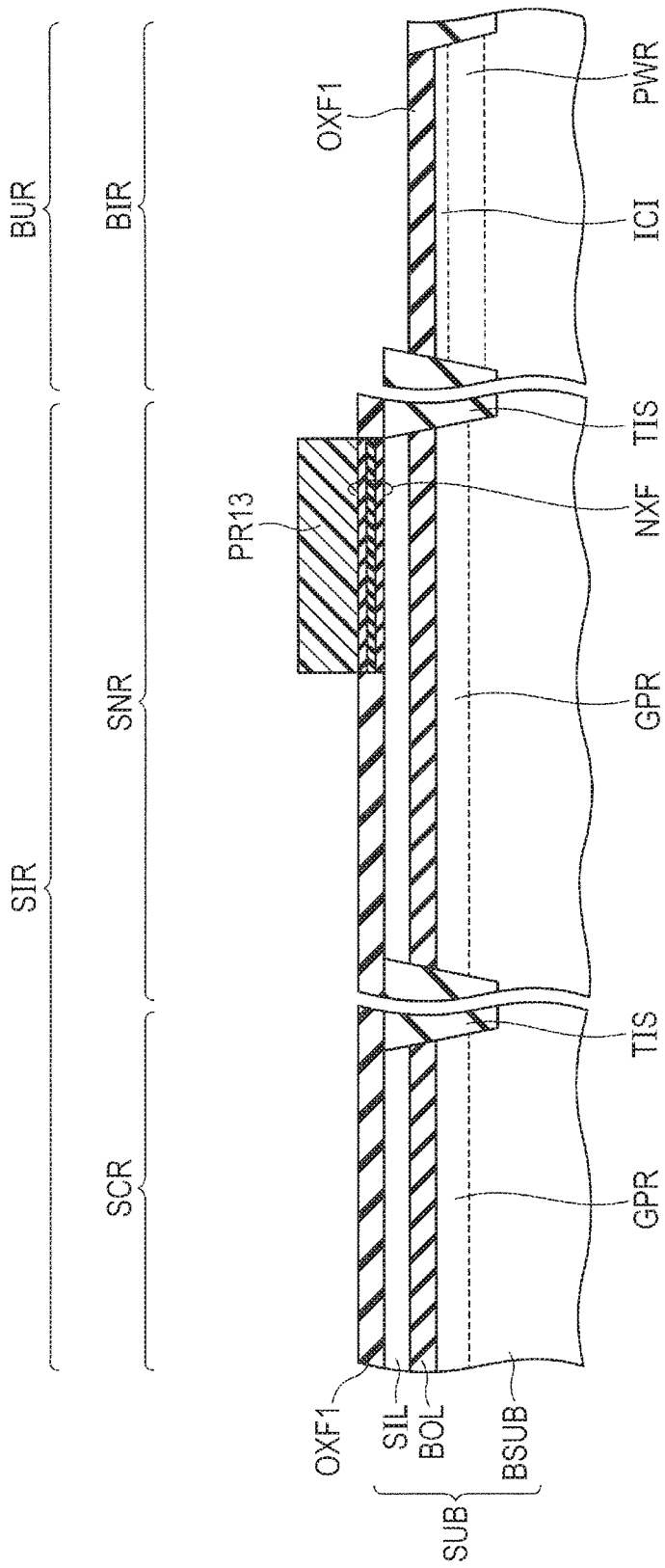
FIG. 36 is a sectional view illustrating a step performed after the step illustrated in FIG. 35 in the second embodiment.

Subsequently, as shown in FIG. 36, etching processing is performed with the photoresist pattern PR13 as an etching mask to remove a portion of the ONO film NXF located in a region other than the region, in which the memory transistor is to be formed, of the memory region SNR. Subsequently, the photoresist pattern PR13 is removed.

Figure 37:
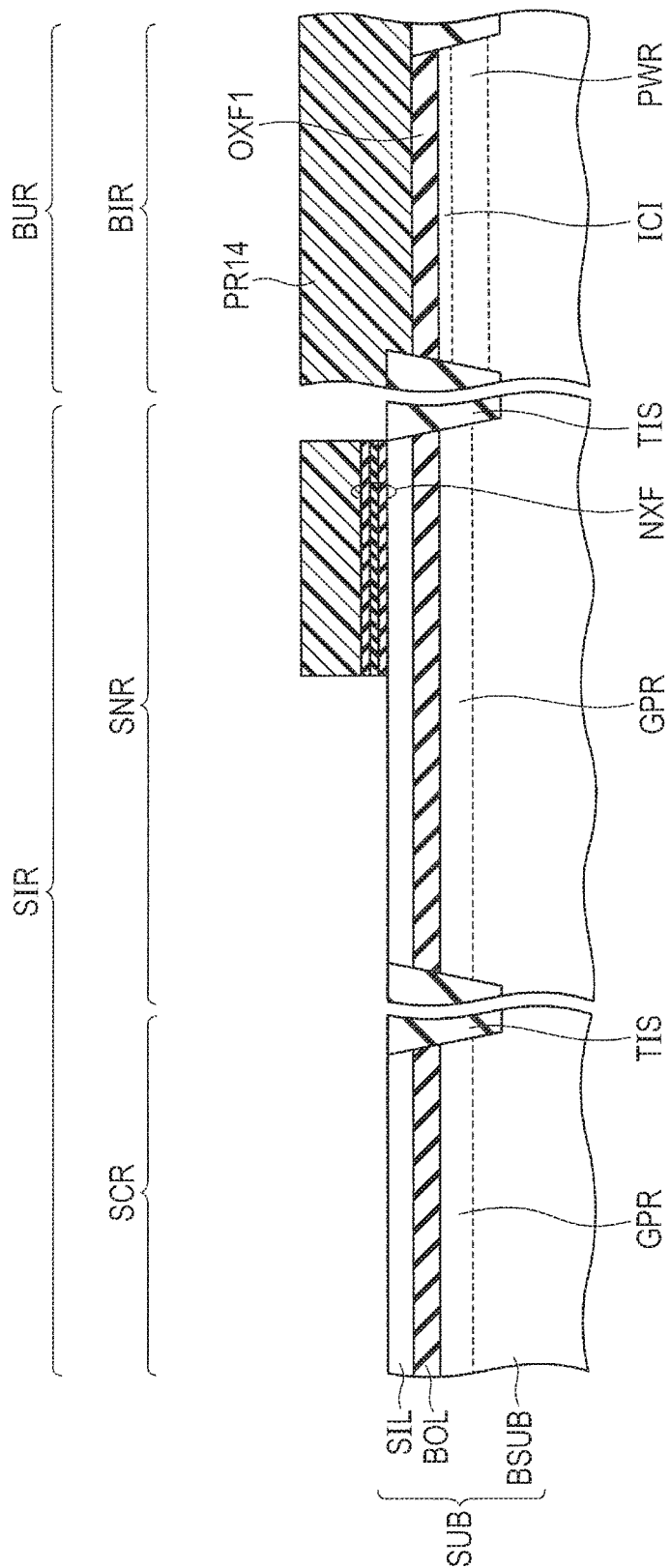
FIG. 37 is a sectional view illustrating a step performed after the step illustrated in FIG. 36 in the second embodiment.

Subsequently, predetermined photoengraving processing is performed to form a photoresist pattern PR14 that covers the bulk region BUR and the region, in which the memory transistor is to be formed, of the memory region SNR, but exposes other regions (see FIG. 37). Subsequently, as shown in FIG. 37, etching processing is performed with the photoresist pattern PR14 as an etching mask to remove a portion of the silicon oxide film OXF1 located in a region other than the bulk region BUR and the region, in which the memory transistor is to be formed, of the memory region SNR. Subsequently, the photoresist pattern PR14 is removed.

Figure 38:
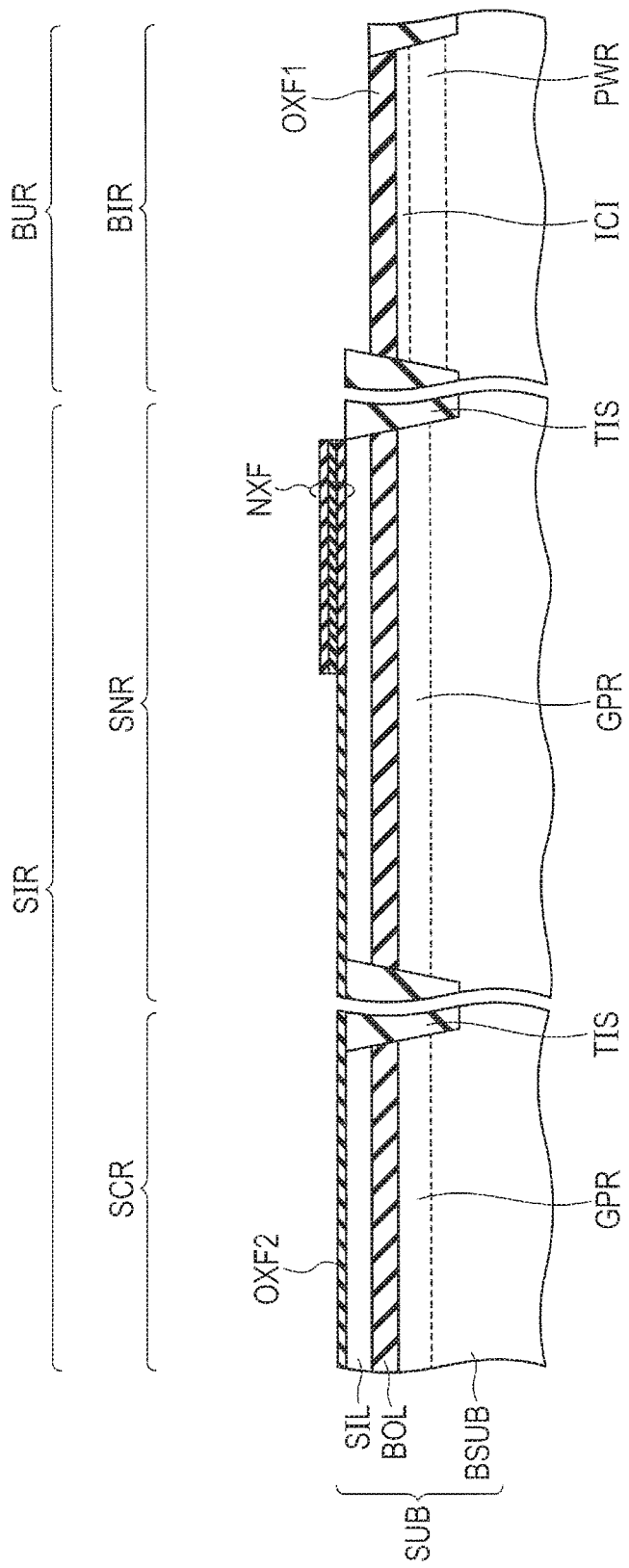
FIG. 38 is a sectional view illustrating a step performed after the step illustrated in FIG. 37 in the second embodiment.

Subsequently, as shown in FIG. 38, thermal oxidation processing is performed to form a silicon oxide film OXF2 having a thickness of, for example, about 1.5 nm on the surface of the silicon layer SIL. Subsequently, an undepicted polysilicon film is formed so as to cover the silicon oxide film OXF1, the silicon oxide film OXF2, the ONO film NXF, and the like. Subsequently, predetermined photoengraving processing and etching processing are performed to pattern the gate electrodes NGE, SGE, IGE, and CGE (see FIG. 39).

Subsequently, the offset spacer film OS1 is formed on each of the sidewall surfaces of the gate electrodes NGE, SGE, IGE, and CGE. Subsequently, the exposed silicon oxide films OXF1 and OXF2 are subjected to etching processing.

Figure 39:
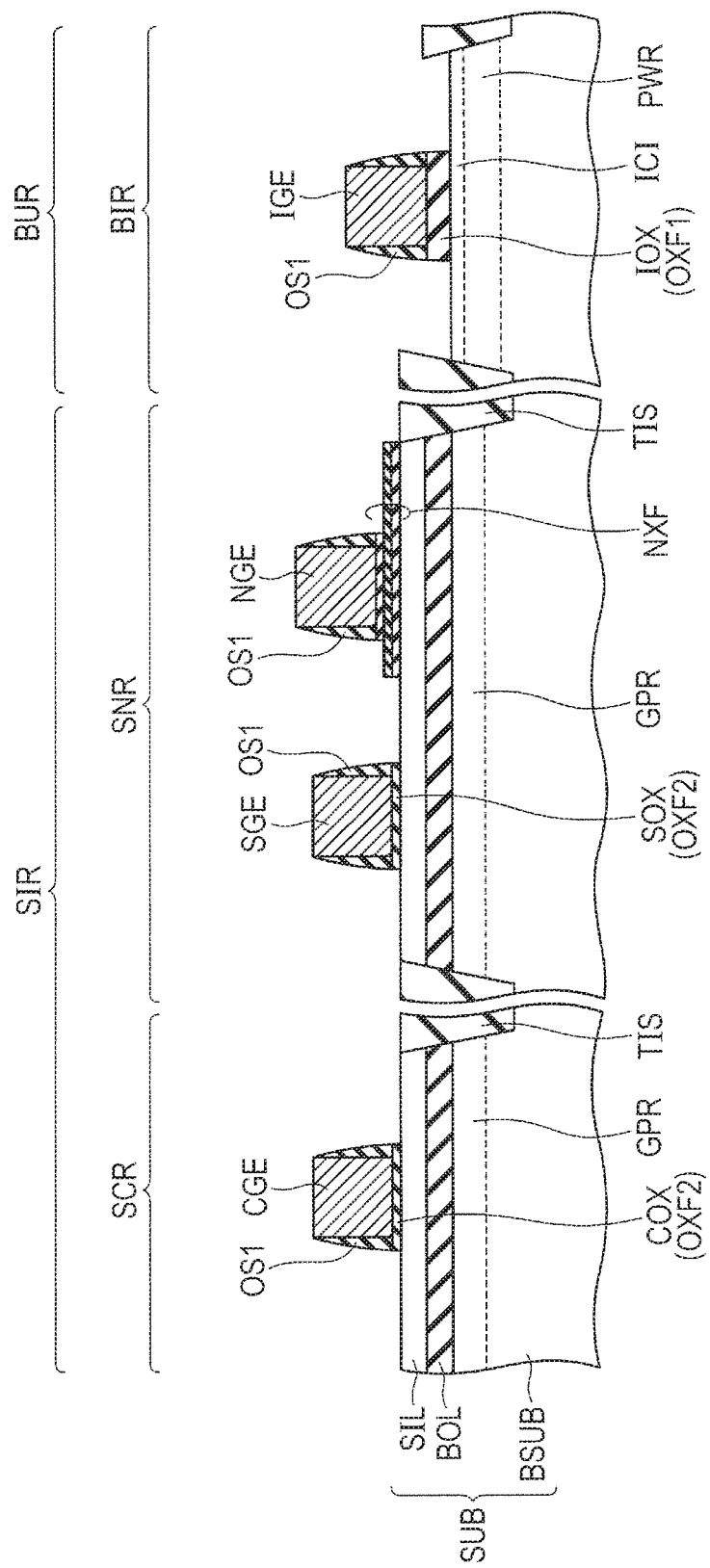
FIG. 39 is a sectional view illustrating a step performed after the step illustrated in FIG. 38 in the second embodiment.

As a result, as shown in FIG. 39, the gate electrode SGE is formed over the silicon layer SIL with the gate insulating film SOX in between in the memory region SNR. The gate electrode IGE is formed over the well region PWR with the gate insulating film IOX in between in the high-withstand-voltage MOS transistor region BIR. The gate electrode CGE is formed over the silicon layer SIL with the gate insulating film COX in between in the low-withstand-voltage MOS transistor region SCR. The bottom silicon oxide film and the silicon nitride film of the ONO film NXF are left in the memory region SNR.

Figure 40:
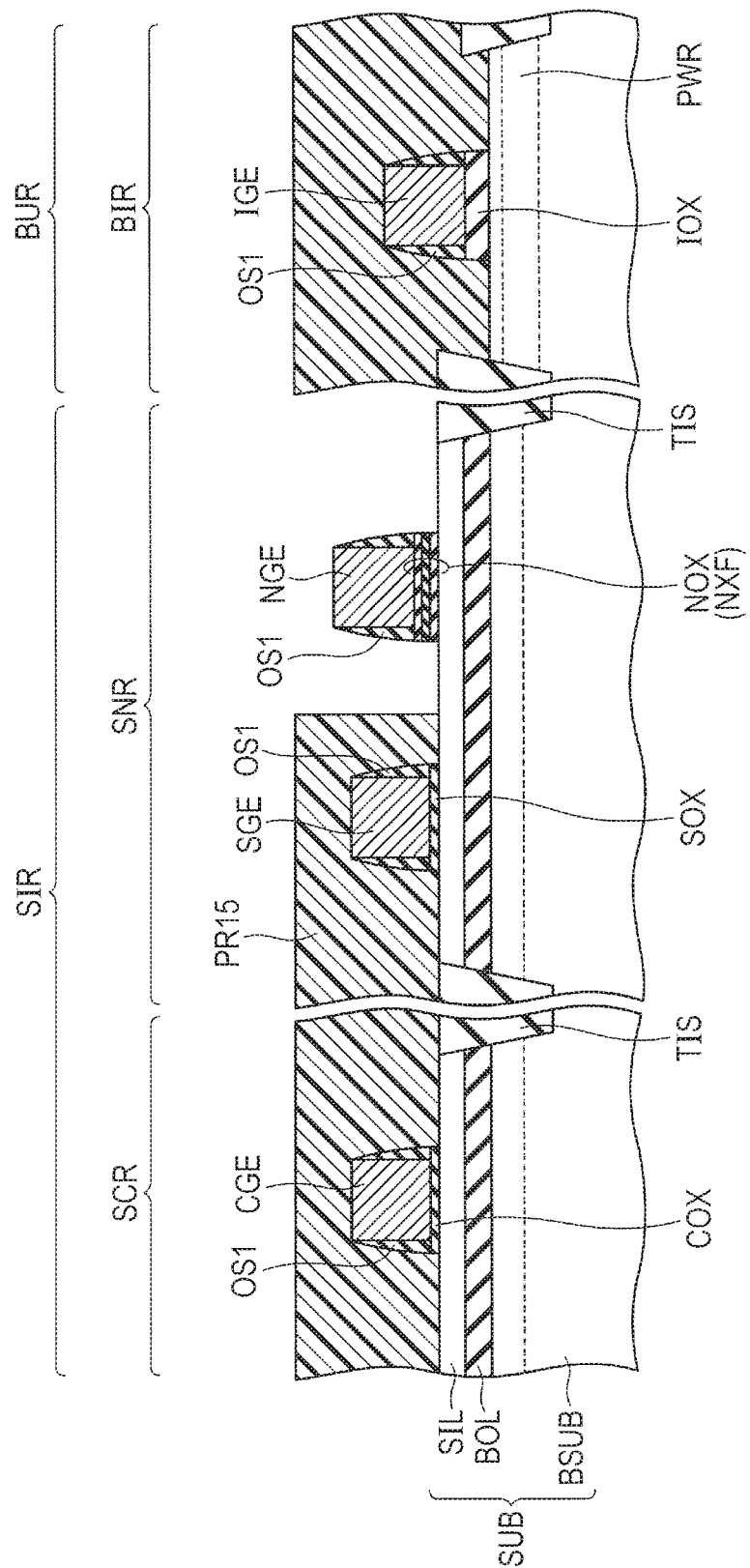
FIG. 40 is a sectional view illustrating a step performed after the step illustrated in FIG. 39 in the second embodiment.
Figure 41:
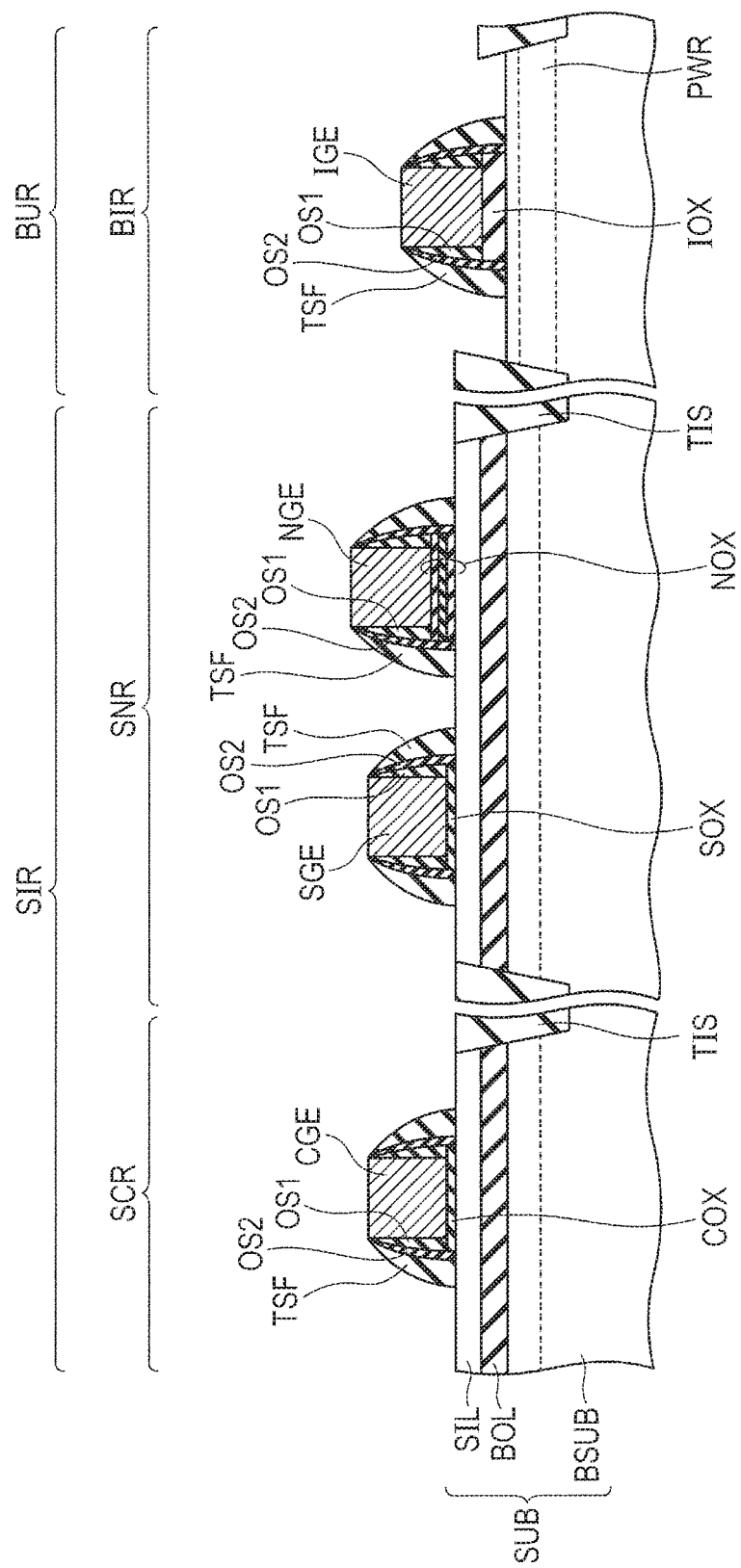
FIG. 41 is a sectional view illustrating a step performed after the step illustrated in FIG. 40 in the second embodiment.

Subsequently, as shown in FIG. 40, predetermined photoengraving processing is performed to form a photoresist pattern PR15 that exposes the memory region SNR but covers other regions. Subsequently, an exposed portion of the ONO film NXF is removed with the photoresist pattern PR15 as an etching film. Subsequently, the photoresist pattern PR15 is removed. Subsequently, as shown in FIG. 41, an offset spacer film OS2 is formed over each of the sidewall surfaces of the gate electrodes NGE, SGE, IGE, and CGE. Furthermore, a temporary spacer film TSF is formed over each of the sidewall surfaces of the gate electrodes NGE, SGE, IGE, and CGE.

Figure 42:
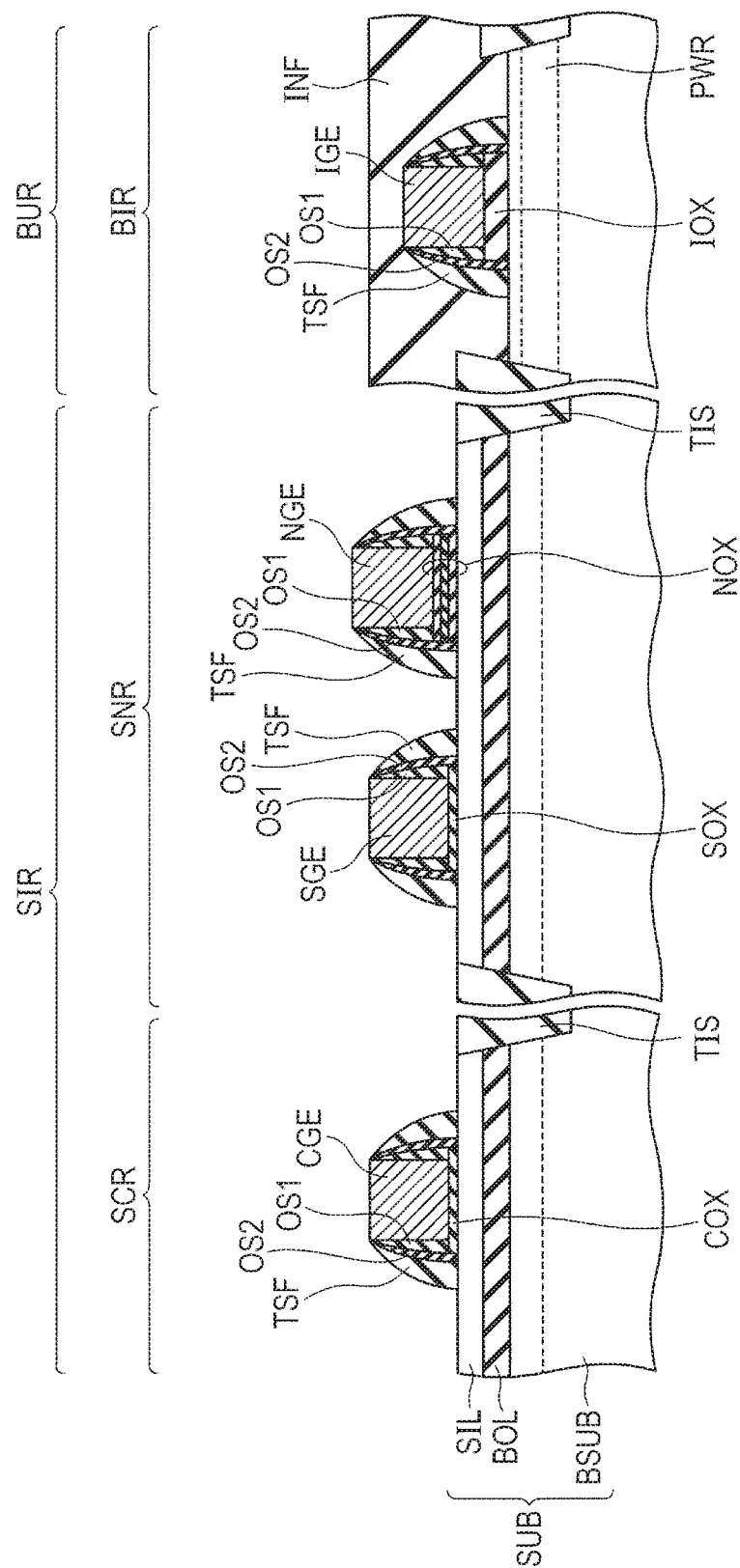
FIG. 42 is a sectional view illustrating a step performed after the step illustrated in FIG. 41 in the second embodiment.

Subsequently, as shown in FIG. 42, the silicon nitride film INF is formed so as to cover the high-withstand-voltage MOS transistor region BIR. Subsequently, hydrogen anneal processing is performed under a temperature condition of 750° C. or higher while the high-withstand-voltage MOS transistor region BIR is covered with the silicon nitride film INF. As a result, a slight amount of oxygen existing in the surfaces of the well region PWR and the silicon layer SIL are removed through a reduction reaction with hydrogen.

Figure 43:
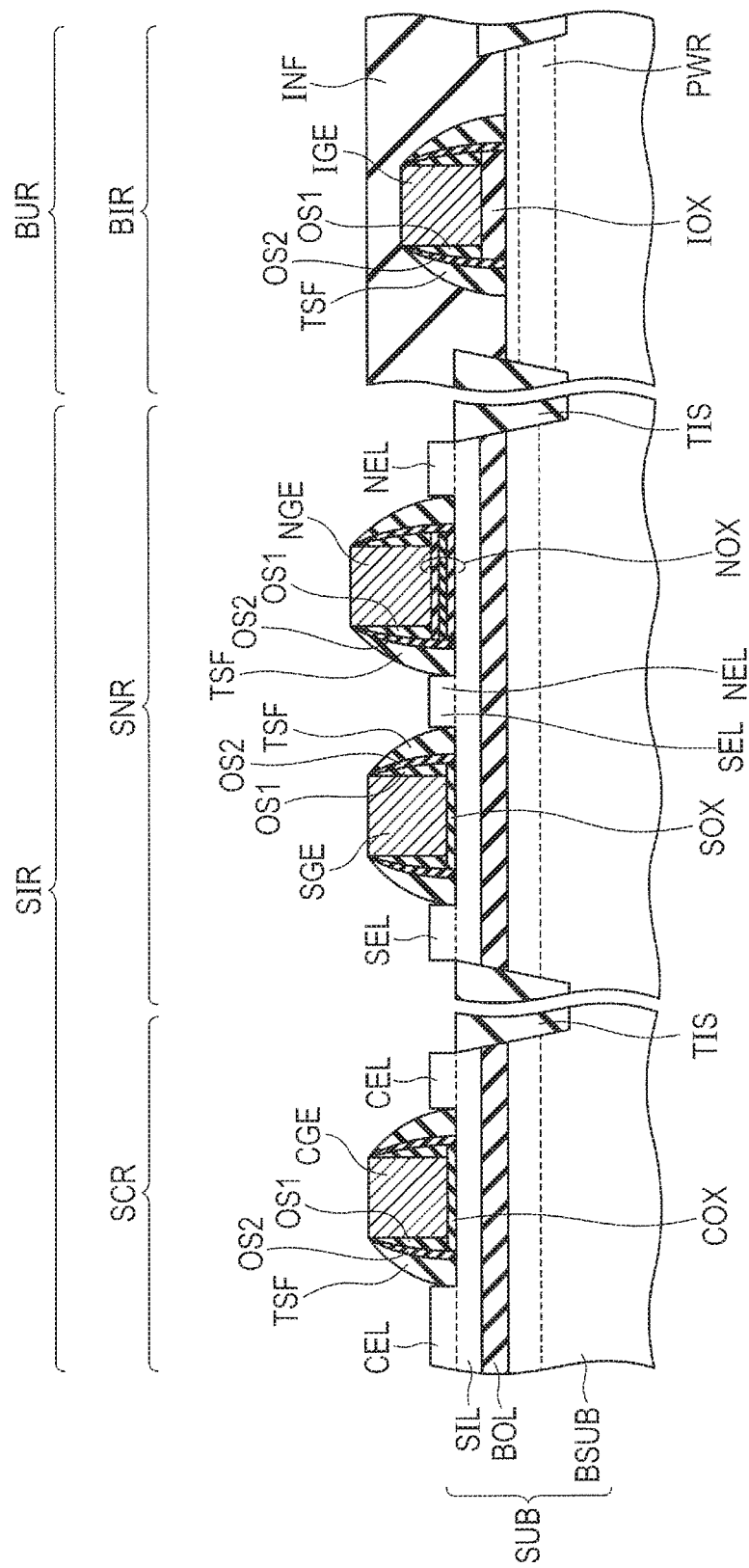
FIG. 43 is a sectional view illustrating a step performed after the step illustrated in FIG. 42 in the second embodiment.

Subsequently, epitaxial growth of silicon is performed. As shown in FIG. 43, the raised epitaxial layers NEL and SEL of silicon are formed on the surface of the exposed silicon layer SIL in the memory region SNR. The raised epitaxial layer CEL of silicon is formed on the surface of the exposed silicon layer SIL in the low-withstand-voltage MOS transistor region SCR.

Figure 44:
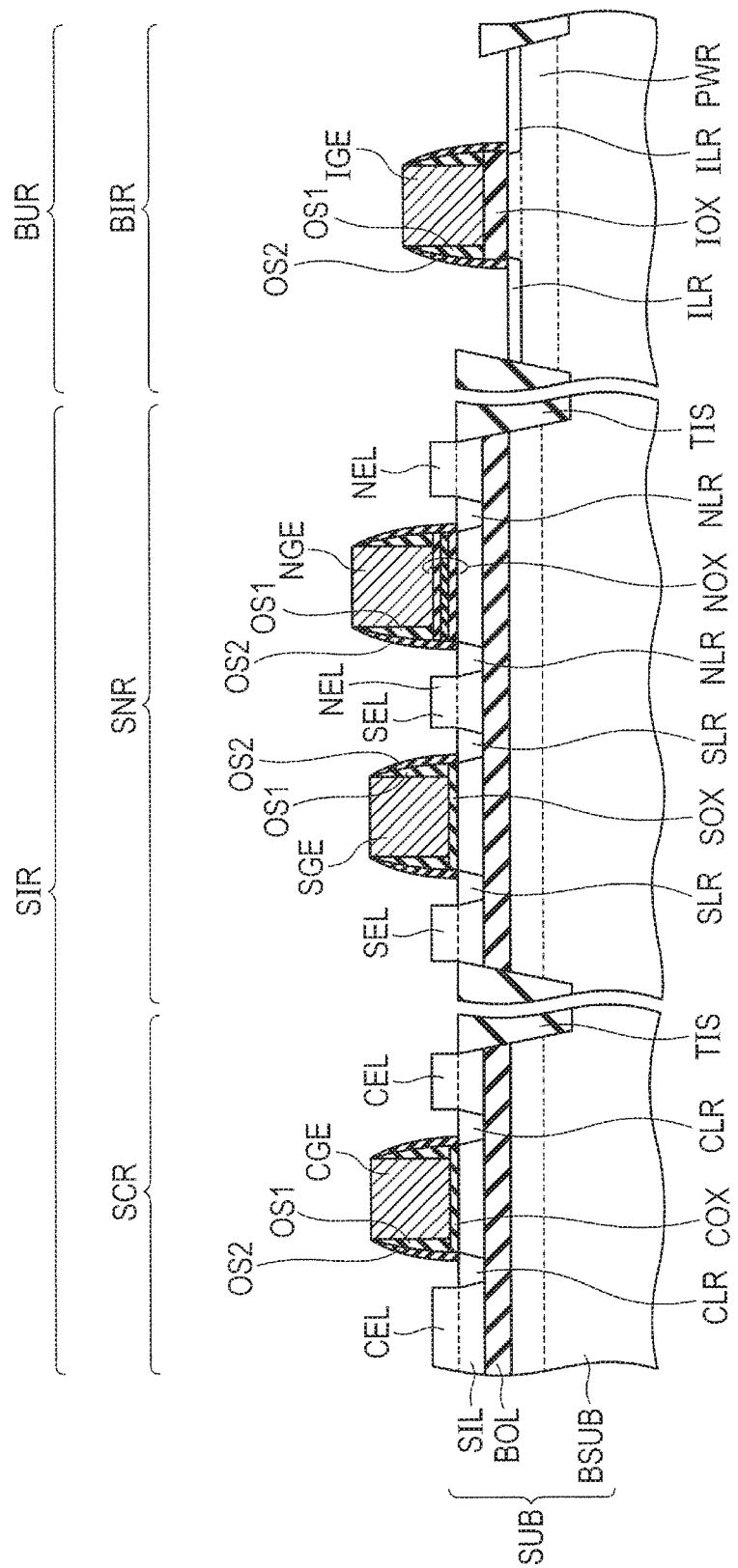
FIG. 44 is a sectional view illustrating a step performed after the step illustrated in FIG. 43 in the second embodiment.

Subsequently, as shown in FIG. 44, the silicon nitride film INF and the spacer film TSF are removed. Subsequently, predetermined photoengraving processing is performed to form an undepicted photoresist pattern that exposes the memory region SNR but covers other regions. Subsequently, an n-type impurity is implanted with the photoresist pattern as an implantation mask to form the LDD region NLR of the memory transistor and the LDD region SLR of the selection transistor in the silicon layer SIL. Subsequently, the photoresist pattern is removed.

Subsequently, predetermined photoengraving processing is performed to form an undepicted photoresist pattern that exposes the high-withstand-voltage MOS transistor region BIR and the low-withstand-voltage MOS transistor region SCR, but covers other regions. Subsequently, an n-type impurity is implanted with the photoresist pattern as an implantation mask to form the LDD region ILR in the well region PWR of the high-withstand-voltage MOS transistor region BIR. The LDD region CLR is formed in the silicon layer SIL of the low-withstand-voltage MOS transistor region SCR. Subsequently, the photoresist pattern is removed.

Figure 45:
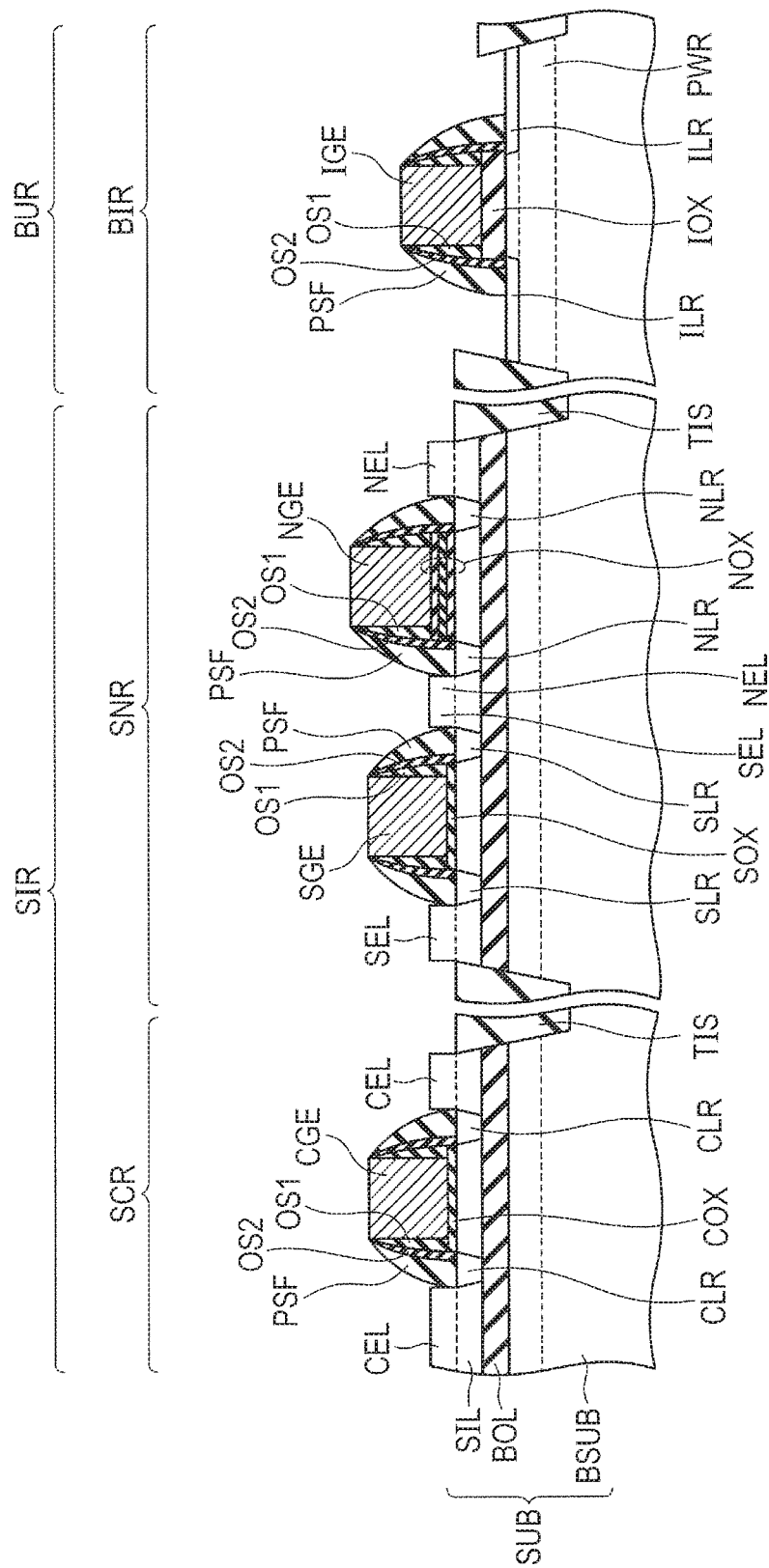
FIG. 45 is a sectional view illustrating a step performed after the step illustrated in FIG. 44 in the second embodiment.
Figure 46:
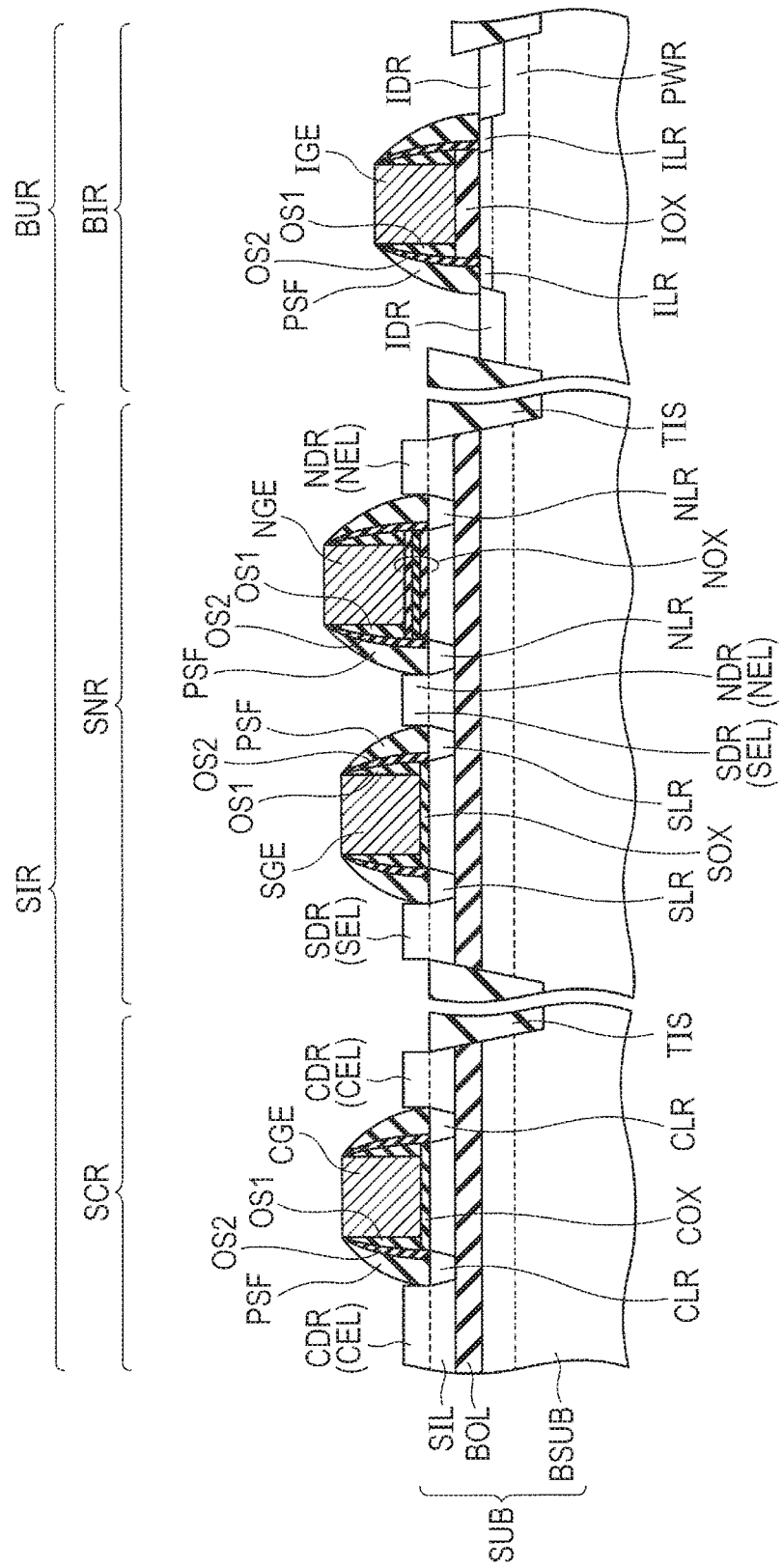
FIG. 46 is a sectional view illustrating a step performed after the step illustrated in FIG. 45 in the second embodiment.

Subsequently, as shown in FIG. 45, the spacer film PSF is formed over each of the sidewall surfaces of the gate electrodes NGE, SGE, IGE, and CGE. Subsequently, predetermined photoengraving processing is performed to form an undepicted photoresist pattern that exposes the memory region SNR, the low-withstand-voltage MOS transistor region SCR, and the high-withstand-voltage MOS transistor region BIR, but covers other regions.

Subsequently, an n-type impurity is implanted with the photoresist pattern as an implantation mask to form the diffusion layer NDR in the raised epitaxial layer NEL and the diffusion layer SDR in the raised epitaxial layer SEL in the memory region SNR. The diffusion layer CDR is formed in the raised epitaxial layer CEL in the low-withstand-voltage MOS transistor region SCR. The diffusion layer IDR is formed in the well region PWR in the high-withstand-voltage MOS transistor region BIR. Subsequently, the photoresist pattern is removed.

Figure 47:
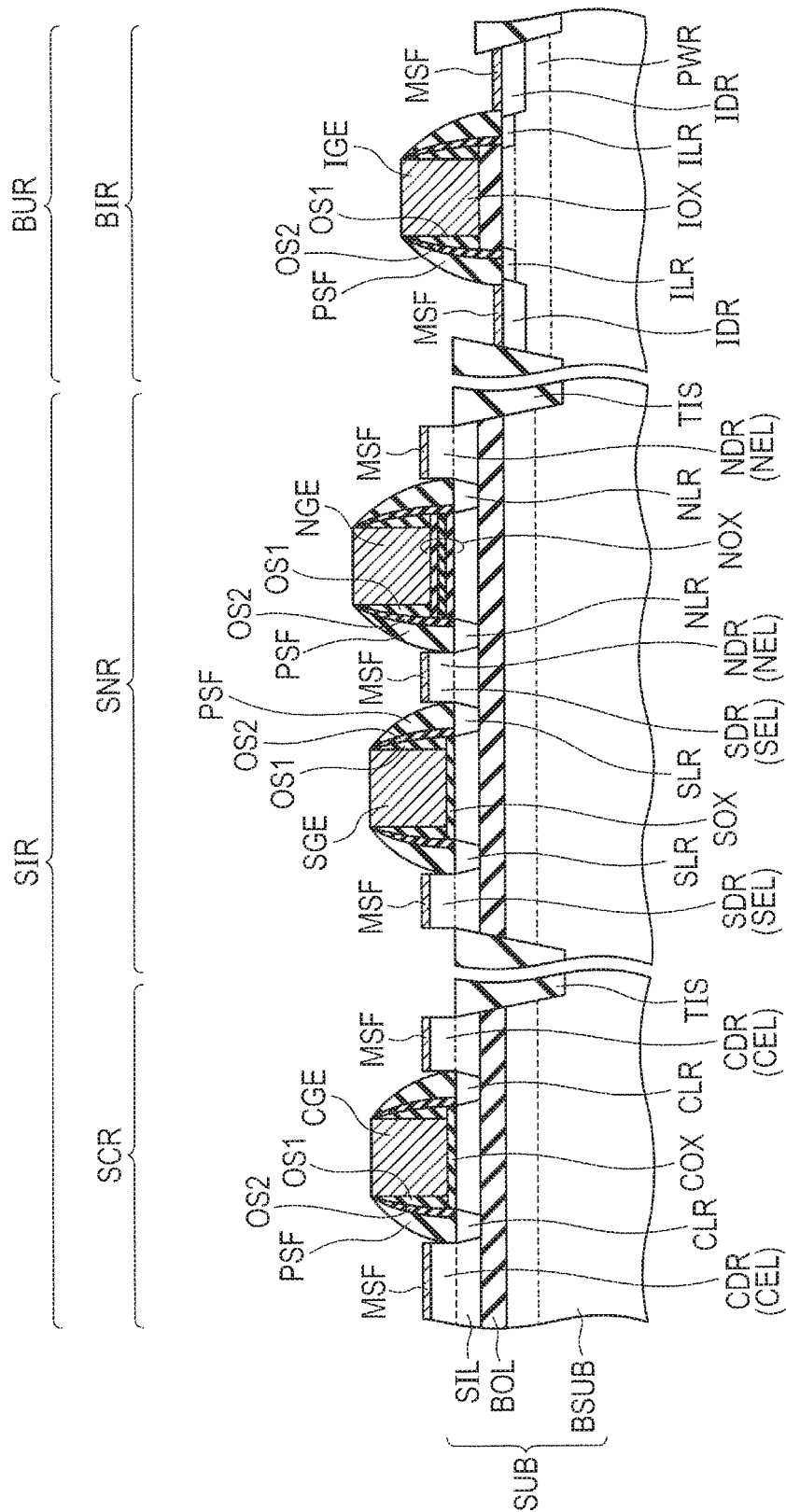
FIG. 47 is a sectional view illustrating a step performed after the step illustrated in FIG. 46 in the second embodiment.

Subsequently, as shown in FIG. 47, the metal silicide film MSF is formed on each of the surfaces of the raised epitaxial layers NEL, SEL, and CEL (diffusion layers NDR, SDR, and CDR) and on the surface of the well region PWR (diffusion layer IDR) by a salicide process, for example.

Figure 48:
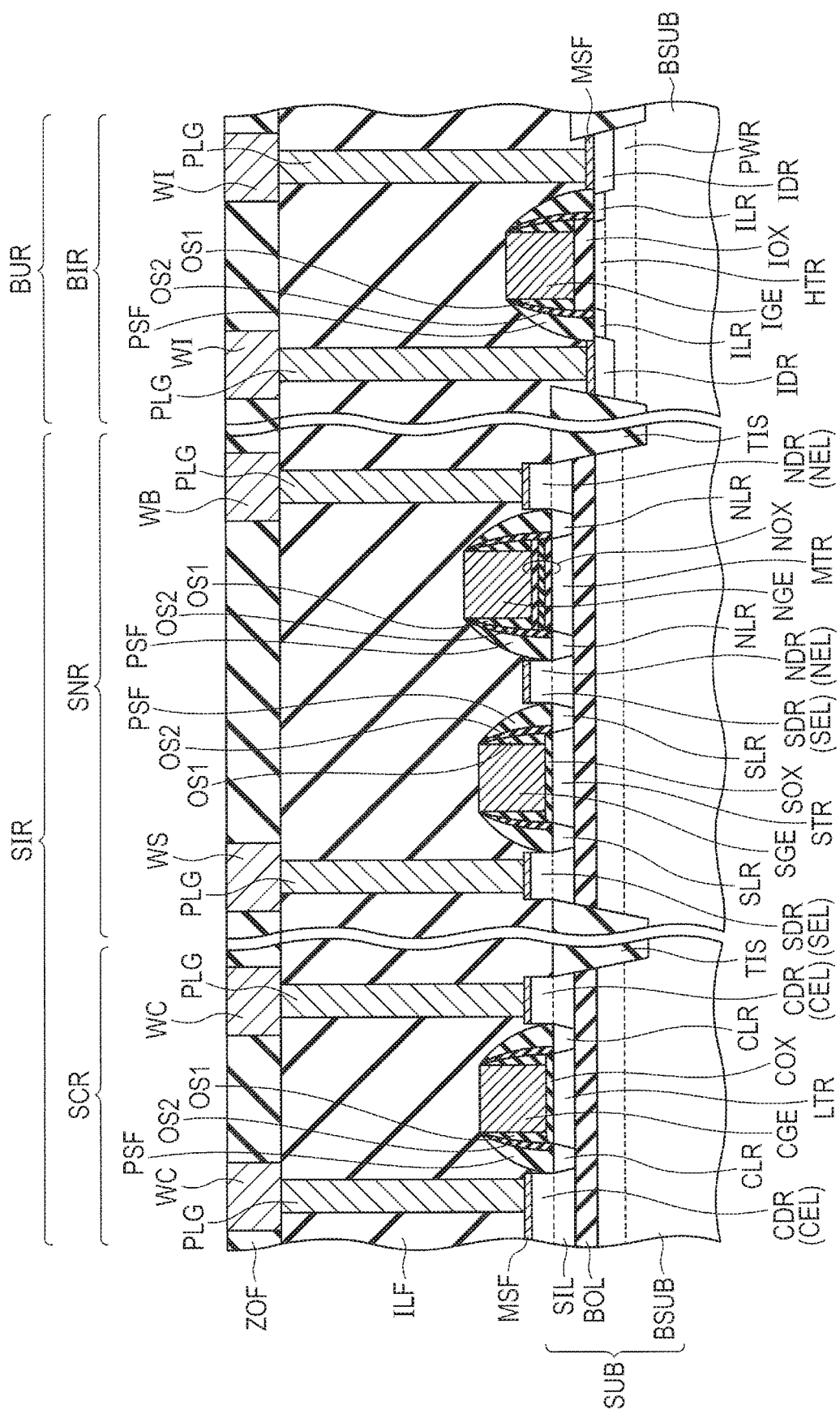
FIG. 48 is a sectional view illustrating a step performed after the step illustrated in FIG. 47 in the second embodiment.

Subsequently, as shown in FIG. 48, the interlayer insulating film ILF is formed so as to cover the gate electrodes NGE, SGE, IGE, and CGE. A plug PLG is formed so as to penetrate the interlayer insulating film ILF and reach each metal silicide film MSF. Subsequently, the insulating film ZOF is formed so as to cover the interlayer insulating film ILF. The interconnections WB, WS, WI, and WC are formed in the insulating film ZOF. Subsequently, an undepicted top interconnection is formed as necessary, thereby the major part of the semiconductor device shown in FIG. 30 is completed.

Operation of the semiconductor device of the second embodiment is now described. First, a circuit diagram of a memory cell in the memory region SNR is described. The semiconductor device of the second embodiment is different from the semiconductor device of the first embodiment, in which the memory region BNR is provided in the well region PWR of the bulk region BUR, in that the memory region SNR is provided in the silicon layer SIL of the SOI region SIR.

Figure 49:
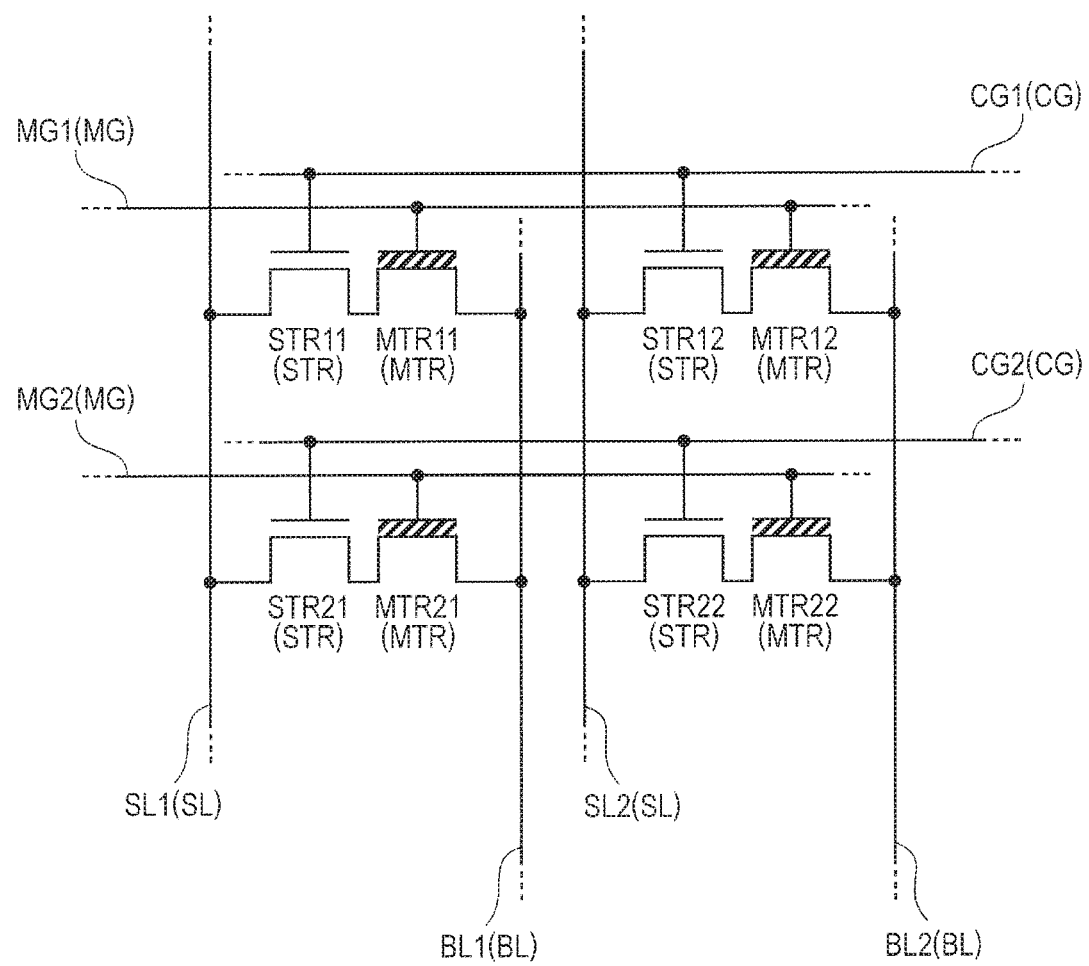
FIG. 49 is a circuit diagram of memory cells in a memory region in the second embodiment.

Hence, as shown in FIG. 49, a circuit diagram of the memory cells in the memory region SNR has the same coupling relationships between the memory transistor MTR, the selection transistor STR, the memory gate line MG, the selection gate line CG, the source line SL, and the bit line BL as the coupling relationships of the circuit diagram (see FIG. 20) of the memory region BNR in the first embodiment except that a dot line frame corresponding to the well region PWR is not shown.

Figure 50:
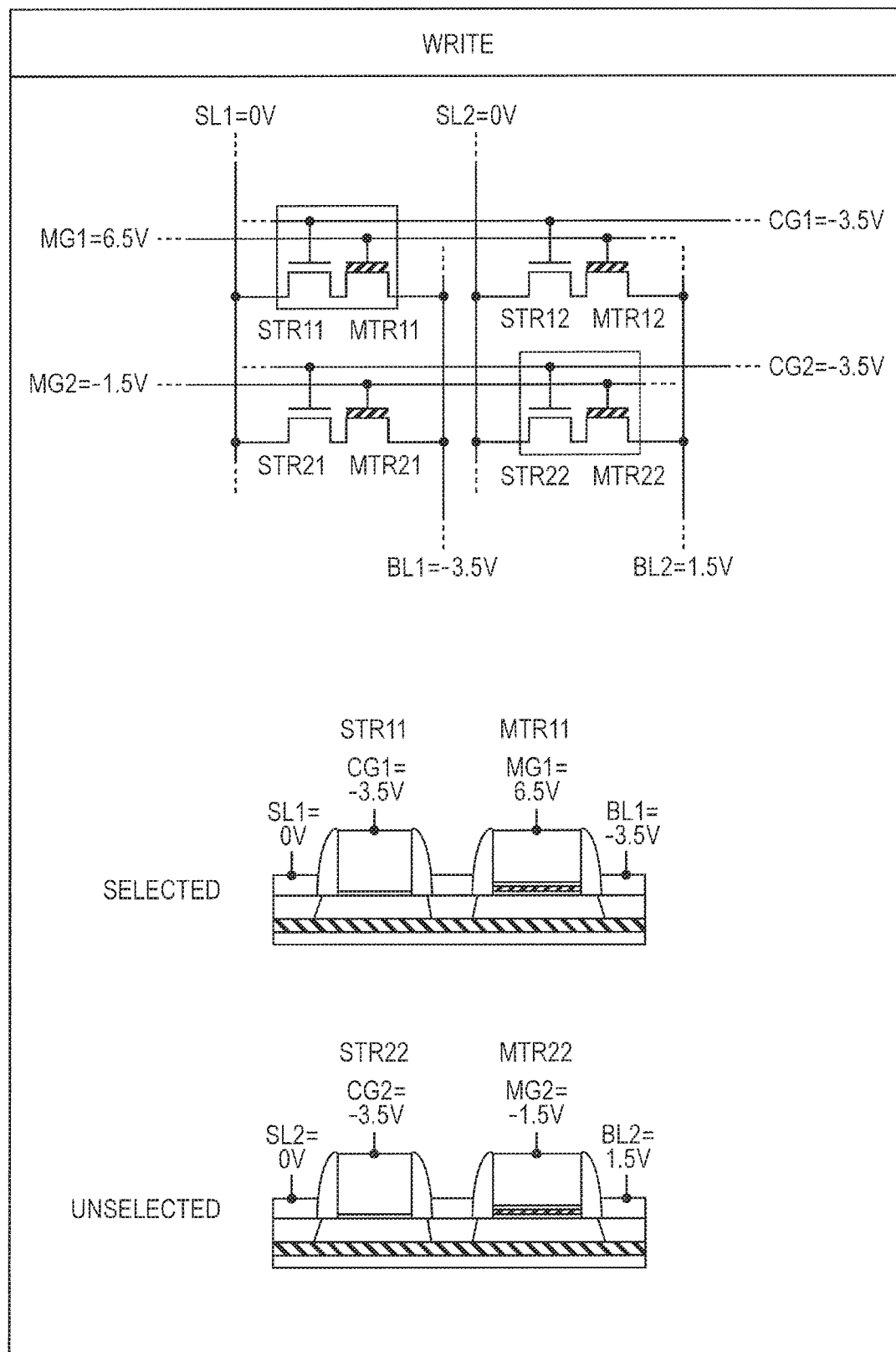
FIG. 50 is a diagram to explain information write operation on a memory cell in the second embodiment.

Information write operation on a memory sell is now described with reference to the circuit diagram shown in FIG. 49. As shown in FIG. 50, the selected bit to be written is assumed to include the memory transistor MTR11 and the selection transistor STR11, for example. For example, 6.5 V, −3.5 V, 0 V, and −3.5 V are applied to the memory gate line MG1, the selection gate line CG1, the source line SL1, and the bit line BL1, respectively.

As a result, a positive bias is applied to the gate electrode NGE of the memory transistor MTR11, and thus electron is injected from the silicon layer SIL to the charge storage layer (silicon nitride film NI) of the gate insulating film NOX. In this way, information write operation is performed on the selected bit.

On the other hand, for example, assuming the unselected bit to be not written includes the memory transistor MTR22 and the selection transistor STR22, −1.5 V, −3.5 V, 0 V, and 1.5 V are applied to the memory gate line MG2, the selection gate line CG2, the source line SL2, and the bit line BL2, respectively. As a result, a negative bias is applied to the gate electrode NGE of the memory transistor MTR22, and no electron is injected into the charge storage layer (silicon nitride film NI) of the gate insulating film NOX.

The diffusion layer NDR, to which the electric potential of the bit line BL is applied, is provided in the raised epitaxial layer NEL in the memory transistor MTR. As described above, this suppresses influence of the impurity in the diffusion layer NDR on the impurity concentration profile of the LDD region NLR, making it possible to suppress write disturb, i.e., accidental erasure of information.

Figure 51:
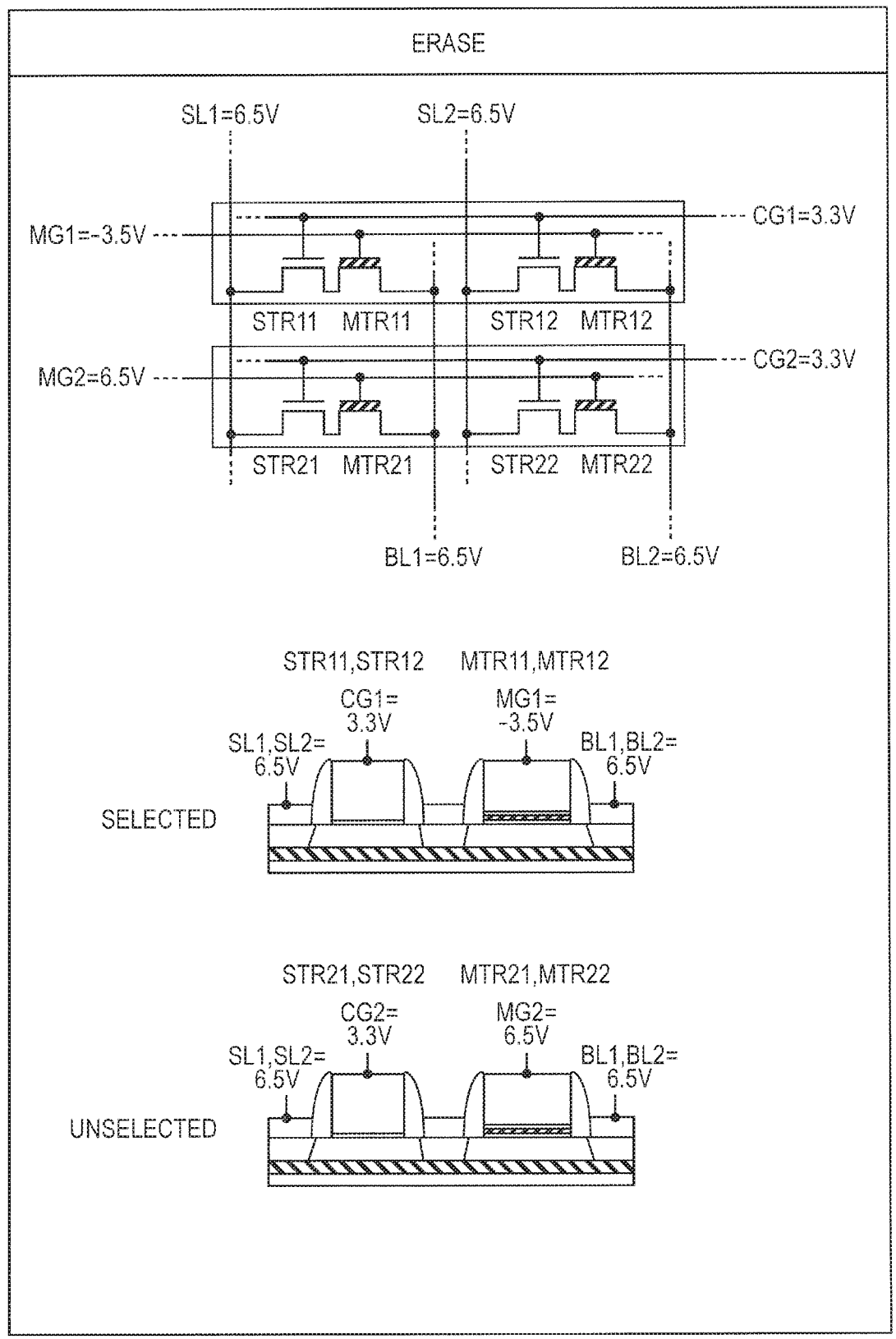
FIG. 51 is a diagram to explain information erasure operation on a memory cell in the second embodiment.

Information erasure operation on memory sells is now described. As shown in FIG. 51, the respective selected bits to be erased are assumed to include the memory transistor MTR11 and the selection transistor STR11, and the memory transistor MTR12 and the selection transistor STR12, for example.

For example, −3.5 V, 3.3 V, 6.5 V, and 6.5 V are applied to the memory gate line MG1, the selection gate line CG1, the source lines SL1 and SL2, and the bit lines BL1 and BL2, respectively. As a result, a negative bias is applied to the gate electrode NGE of the memory transistor MTR11, and thus electron stored in the charge storage layer (silicon nitride film NI) of the gate insulating film NOX is extracted to the silicon layer SIL. In this way, information erasure operation is performed on the selected bits.

On the other hand, assuming the respective unselected bits to be not erased include the memory transistor MTR21 and the selection transistor STR21, and the memory transistor MTR22 and the selection transistor STR22, 6.5 V, 3.3 V, 6.5 V, and 6.5 V are applied to the memory gate line MG2, the selection gate line CG2, the source lines SL1 and SL2, and the bit lines BL1 and BL2, respectively. As a result, the electric potential of the memory transistor MTR11 (gate electrode) becomes equal to the electric potential of the silicon layer SIL, and thus no electron is extracted.

Figure 52:
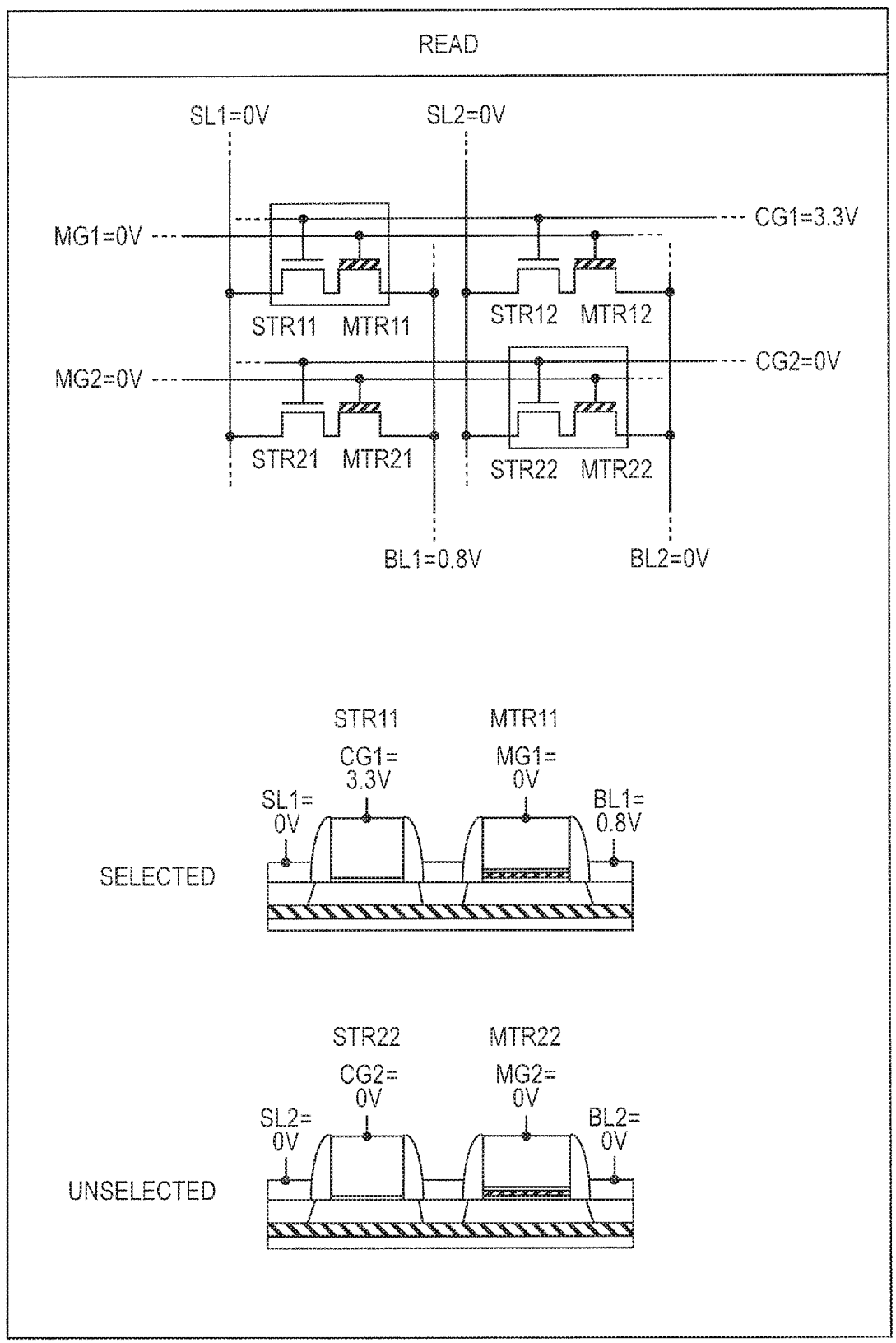
FIG. 52 is a diagram to explain information read operation on a memory cell in the second embodiment.

Information read operation on a memory sell is now described. As shown in FIG. 52, the selected bit to be read is assumed to include the memory transistor MTR11 and the selection transistor STR11, for example. For example, 0 V, 3.3 V, 0 V, and 0.8 V are applied to the memory gate line MG1, the selection gate line CG1, the source line SL1, and the bit line BL1, respectively.

If the charge storage layer of the memory transistor MTR11 stores the injected electron, the threshold voltage of the memory transistor MTR11 increases. No current therefore flows through the memory transistor MTR11 and the selection transistor STR11. When the charge storage layer stores no injected electron, the threshold voltage is reduced, and current flows through the memory transistor MTR11 and the selection transistor STR11. In this way, information read operation is performed on the selected bit.

On the other hand, assuming the unselected bit to be not read includes the memory transistor MTR22 and the selection transistor STR22, 0 V, 0 V, 0 V, and 0 V are applied to the memory gate line MG2, the selection gate line CG2, the source line SL2, and the bit line BL2, respectively. No channel region is therefore formed in the selection transistor STR11, and thus information read operation is not performed.

In the memory transistor MTR of the semiconductor device, the diffusion layer NDR, to which the electric potential of the bit line is applied, is provided in the raised epitaxial layer NEL. As described above, this suppresses influence of the impurity in the diffusion layer NDR on the impurity concentration profile of the LDD region NLR, making it possible to reduce write disturb.

As described above, high-temperature hydrogen anneal is performed before formation of the raised epitaxial layer NEL, so that the number of interface states in the gate insulating film NOX (bottom silicon oxide film) decreases, leading to an improvement in retention characteristics of the memory transistor MTR.

Third Embodiment

The first and second embodiments have been described with a semiconductor device, in which one memory cell is configured by one memory transistor and one selection transistor. A semiconductor device, in which one memory cell is configured by one memory transistor and is provided in the bulk region, is now described.

Figure 53:
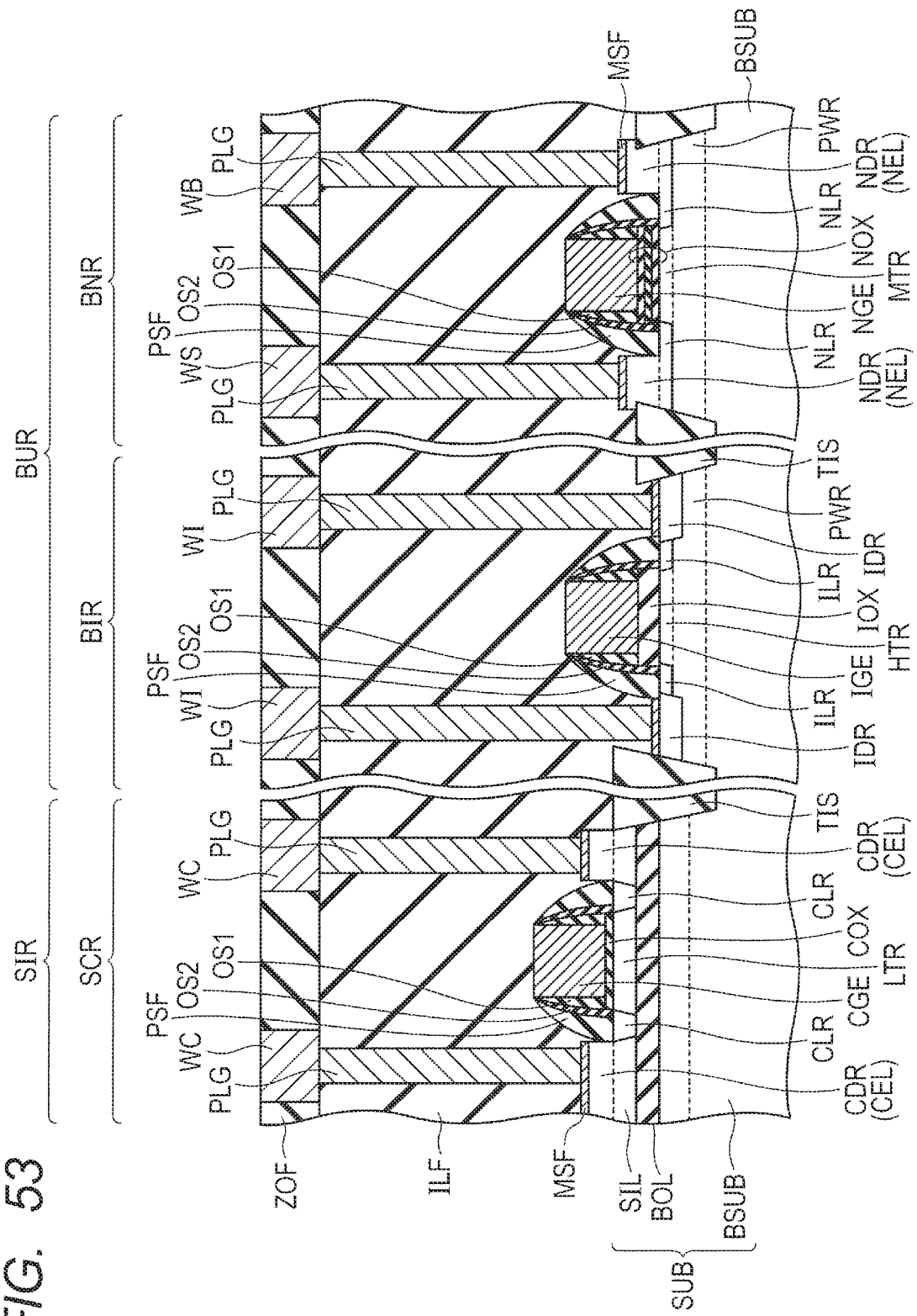
FIG. 53 is a sectional view of a semiconductor device of a third embodiment.

As shown in FIG. 53, the bulk region BUR and the SOI region SIR are defined in the SOI substrate SUB. The element isolation insulating film TIS defines the memory region BNR and the high-withstand-voltage MOS transistor region BIR in the bulk region BUR, and defines the low-withstand-voltage MOS transistor region SCR in the SOI region SIR.

The memory transistor MTR is provided in the p-type well region PWR formed in the memory region BNR. The raised epitaxial layer NEL (raised part) is provided on the surface of the well region PWR. The memory transistor MTR includes the gate insulating film NOX including the charge storage layer, the gate electrode NGE, the LDD region NLR, and the diffusion layer NDR.

The raised epitaxial layer NEL is provided from the surface of the well region PWR, on which the gate insulating film NOX is disposed, to a position higher than the surface. The LDD region NLR is provided from a portion of the well region PWR located directly below the sidewall surface of the gate electrode NGE to a portion of the well region PWR located directly below the raised epitaxial layer NEL.

The diffusion layer NDR is provided mainly in the raised epitaxial layer NEL. The impurity concentration of the diffusion layer NDR is higher than the impurity concentration of the LDD region NLR. Since other configurations are similar to those of the semiconductor device shown in FIG. 1, the same components are designated by the same reference numeral, and duplicated description is omitted except when required.

The semiconductor device of the third embodiment can be manufactured by the same manufacturing method as that described in the first embodiment except that only the memory transistor MTR is formed while the selection transistor is not formed in the memory region BNR.

Operation of the semiconductor device of the third embodiment is now described. First, a circuit diagram of memory cells in the memory region BNR is described. The memory cells in the memory region BNR of the semiconductor device include the memory transistors MTR arranged in a matrix. Four memory cells are exemplified herein to simplify the description.

Figure 54:
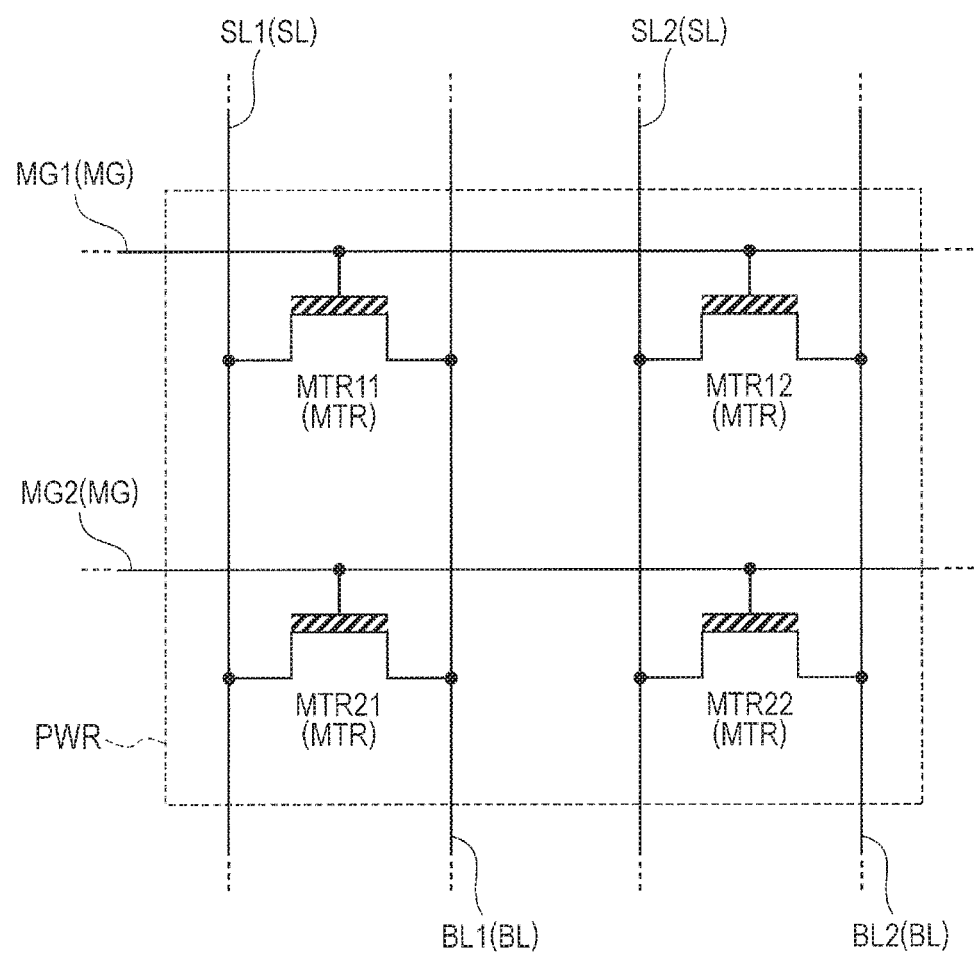
FIG. 54 is a circuit diagram of memory cells in a memory region in the third embodiment.

As shown in FIG. 54, the memory gate lines MG are disposed so as to intersect the source lines SL and the bit lines BL. The memory transistor MTR is electrically coupled between the source line SL and the bit line BL. The gate electrode of the memory transistor MTR is electrically coupled to the memory gate line MG. The memory transistors MTR11 to MTR22 are provided in the p-type well region PWR.

The memory transistor MTR11 is electrically coupled between the source line SL1 and the bit line BL1. The gate electrode of the memory transistor MTR11 is electrically coupled to the memory gate line MG1. The memory transistor MTR12 is electrically coupled between the source line SL2 and the bit line BL2. The gate electrode of the memory transistor MTR12 is electrically coupled to the memory gate line MG1.

The memory transistor MTR21 is electrically coupled between the source line SL1 and the bit line BL1. The gate electrode of the memory transistor MTR21 is electrically coupled to the memory gate line MG2. The memory transistor MTR22 is electrically coupled between the source line SL2 and the bit line BL2. The gate electrode of the memory transistor MTR22 is electrically coupled to the memory gate line MG2.

Figure 55:
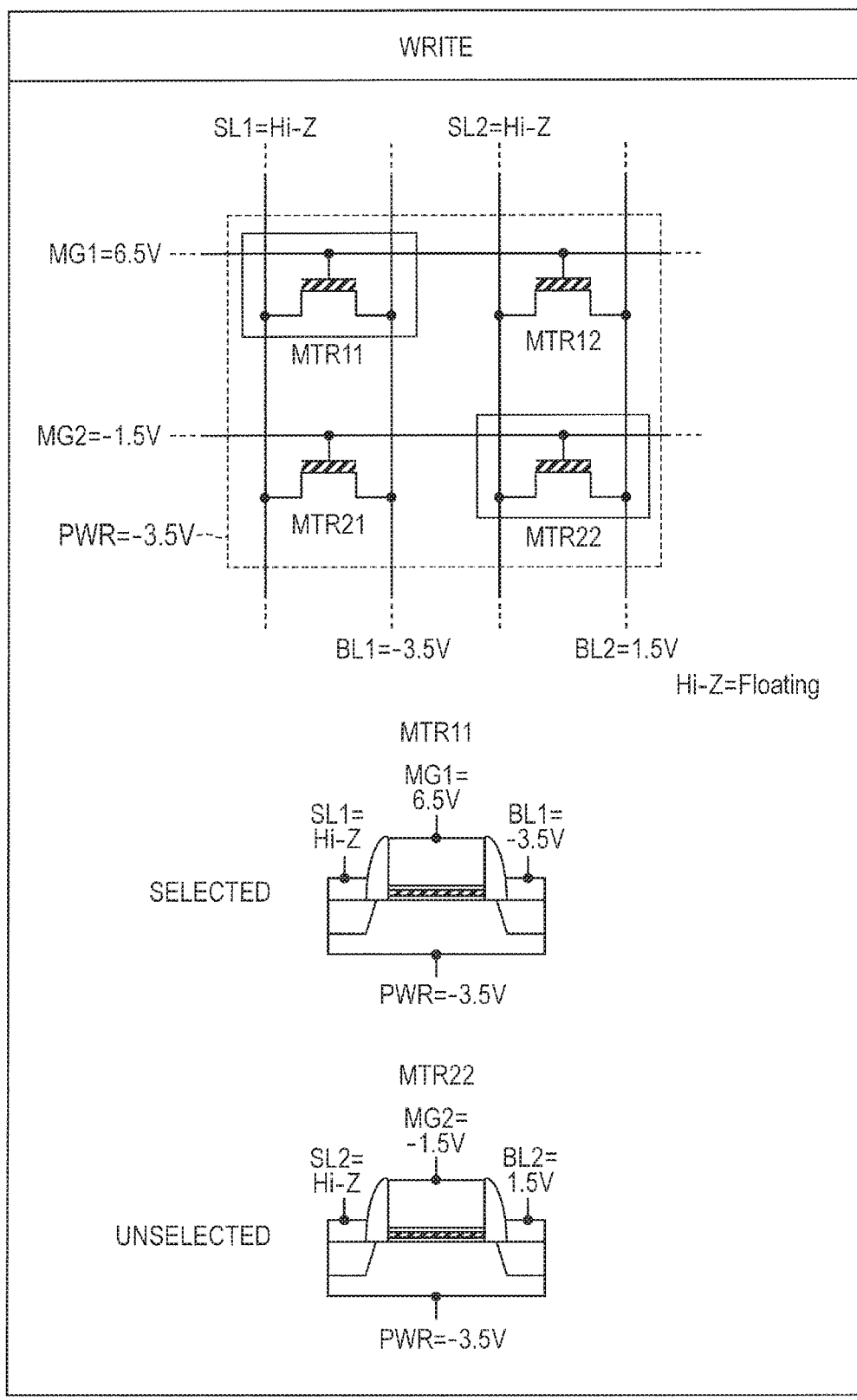
FIG. 55 is a diagram to explain information write operation on a memory cell in the third embodiment.

Information write operation on a memory sell is now described with reference to the circuit diagram shown in FIG. 54. As shown in FIG. 55, the selected bit to be written is assumed to include the memory transistor MTR11, for example. For example, 6.5 V, −3.5 V, and −3.5 V are applied to the memory gate line MG1, the bit line BL1, and the well region PWR, respectively. The source line SL1 is adjusted to a high impedance state.

As a result, a positive bias is applied to the gate electrode NGE of the memory transistor MTR11, and thus electron is injected into the charge storage layer (silicon nitride film NI) of the gate insulating film NOX from the well region PWR to which a negative bias is applied. In this way, information write operation is performed on the selected bit.

On the other hand, for example, assuming the unselected bit to be not written includes the memory transistor MTR22, −1.5 V, 1.5 V, and −3.5 V are applied to the memory gate line MG2, the bit line BL2, and the well region PWR, respectively. The source line SL2 is adjusted to a high impedance state. As a result, a negative bias is applied to the gate electrode NGE of the memory transistor MTR22, and no electron is injected into the charge storage layer (silicon nitride film NI) of the gate insulating film NOX.

The diffusion layer NDR, to which an electric potential of the bit line is applied, is provided in the raised epitaxial layer NEL in the memory transistor MTR. As described above, this suppresses influence of the impurity in the diffusion layer NDR on the impurity concentration profile of the LDD region NLR, making it possible to suppress write disturb, i.e., accidental erasure of information.

Figure 56:
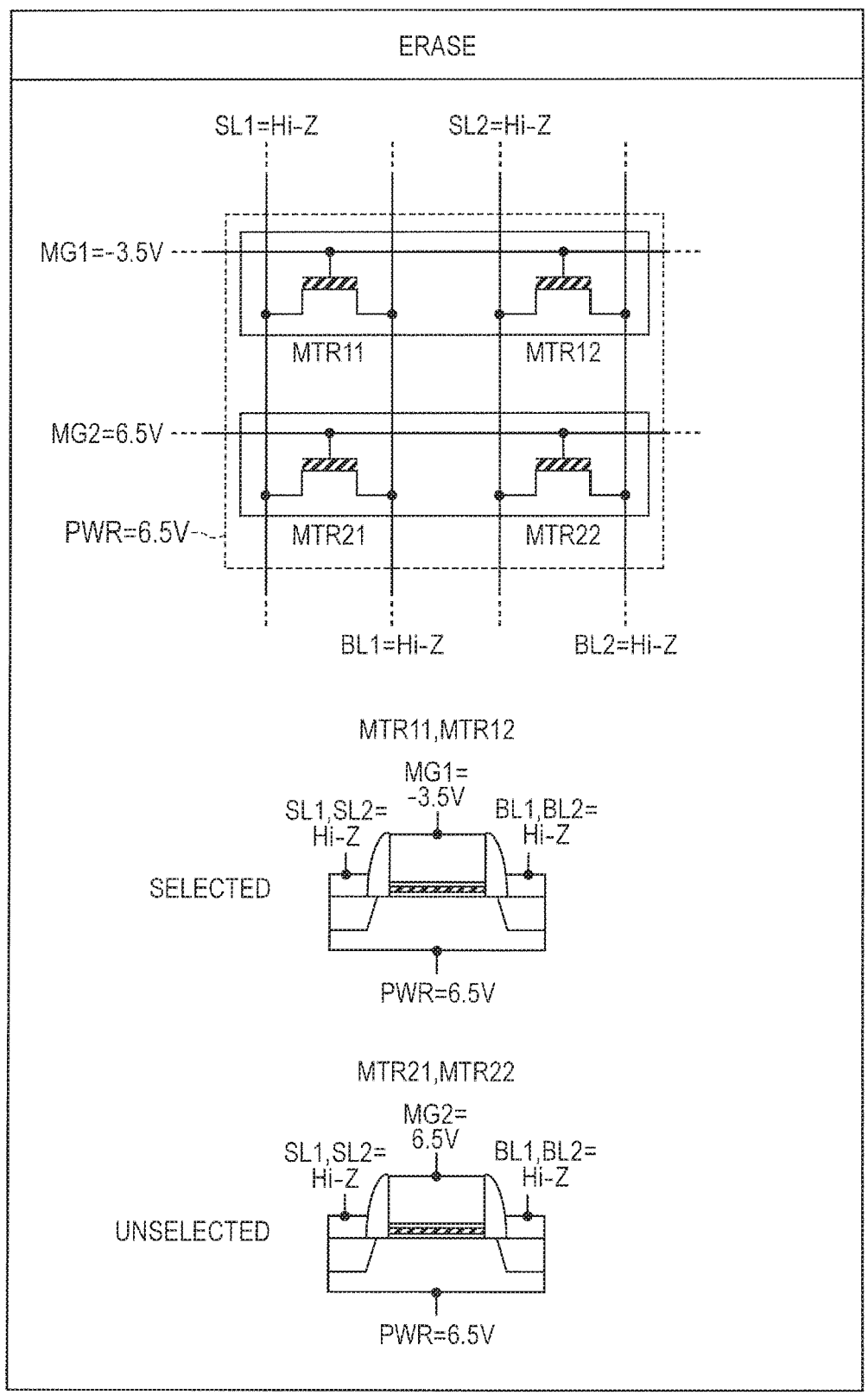
FIG. 56 is a diagram to explain information erasure operation on a memory cell in the third embodiment.

Information erasure operation on memory sells is now described. As shown in FIG. 56, the selected bit to be erased is assumed to include the memory transistor MTR11 and the memory transistor MTR12, for example.

For example, −3.5 V and 6.5 V are applied to the memory gate line MG1 and the well region PWR, respectively. The source lines SL1 and SL2 are each adjusted to a high impedance state. The bit lines BL1 and BL2 are each adjusted to a high impedance state. As a result, a negative bias is applied to the gate electrode NGE of each of the memory transistors MTR11 and MTR12, and thus electron stored in the charge storage layer of the gate insulating film NOX is extracted to the well region PWR to which a positive bias is applied. In this way, information erasure operation is performed on the selected bits.

On the other hand, assuming the unselected bits to be not erased include the memory transistor MTR21 and the memory transistor MTR22, 6.5 V and 6.5 V are applied to the memory gate line MG2 and the well region PWR, respectively. The source lines SL1 and SL2 are each adjusted to a high impedance state. The bit lines BL1 and BL2 are each adjusted to a high impedance state. As a result, the electric potential of the gate electrode NGE of each of the memory transistors MTR21 and MTR22 becomes equal to the electric potential of the well region PWR, and thus no electron is extracted.

Figure 57:
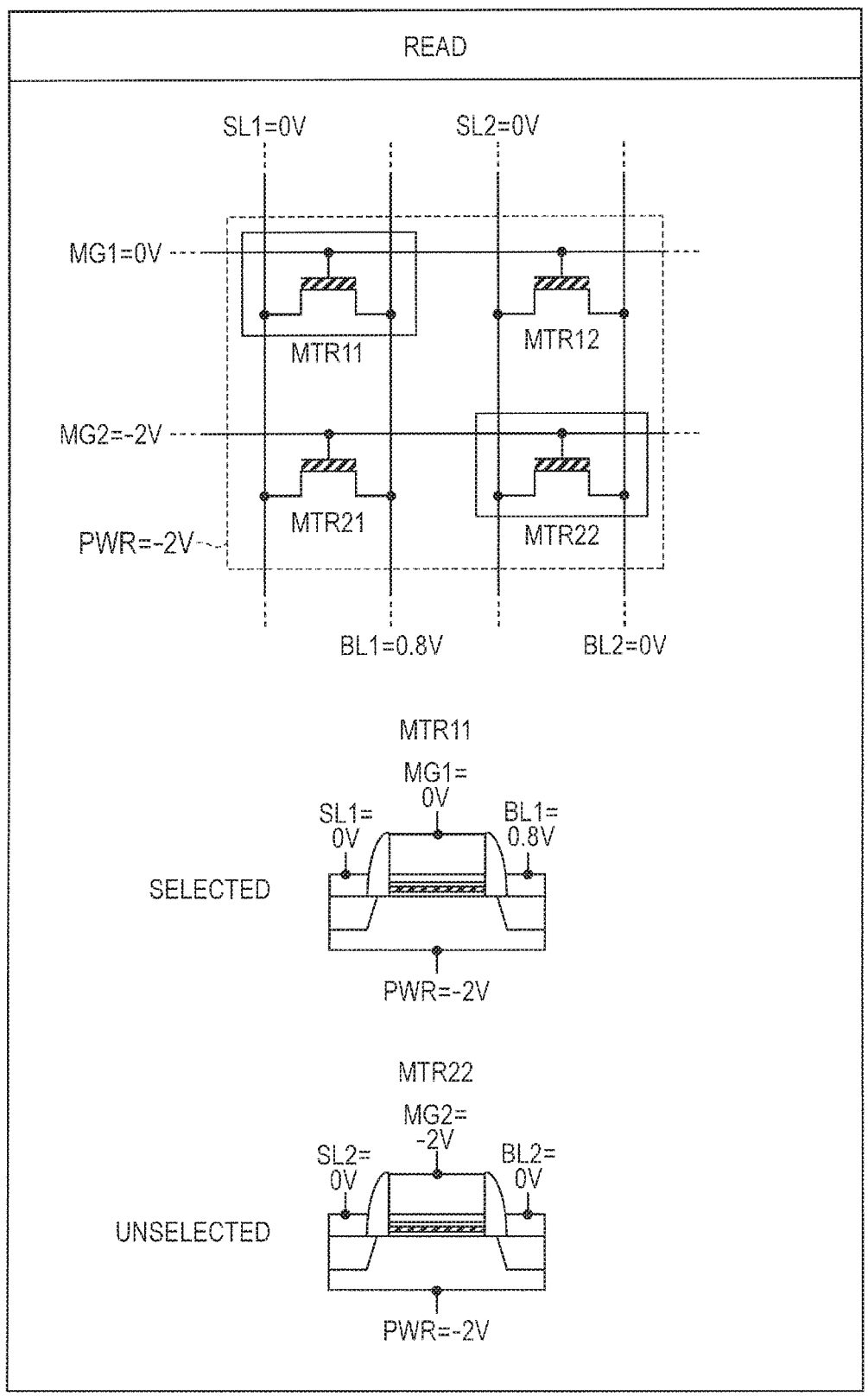
FIG. 57 is a diagram to explain information read operation on a memory cell in the third embodiment.

Information read operation on a memory sell is now described. As shown in FIG. 57, the selected bit to be read is assumed to include the memory transistor MTR11, for example. For example, 0 V, 0 V, 0.8 V, and −2 V are applied to the memory gate line MG1, the source line SL1, the bit line BL1, and the well region PWR, respectively.

If the charge storage layer of the memory transistor MTR11 stores the injected electron, the threshold voltage of the memory transistor MTR11 increases. No current therefore flows through the memory transistor MTR11. If the charge storage layer stores no injected electron, the threshold voltage is reduced, and current flows through the memory transistor MTR11. In this way, information read operation is performed on the selected bit.

On the other hand, assuming the unselected bit to be not read includes the memory transistor MTR22, −2 V, 0 V, 0 V, and −2 V are applied to the memory gate line MG2, the source line SL2, the bit line BL2, and the well region PWR, respectively. Consequently, information read operation is not performed.

In the memory transistor MTR of the semiconductor device of the third embodiment, the diffusion layer NDR, to which the electric potential of the bit line is applied, is provided in the raised epitaxial layer NEL. As described above, this suppresses influence of the impurity in the diffusion layer NDR on the impurity concentration profile of the LDD region NLR, making it possible to reduce write disturb.

As described above, high-temperature hydrogen anneal is performed before formation of the raised epitaxial layer NEL, so that the number of interface states in the gate insulating film NOX (bottom silicon oxide film) decreases, leading to an improvement in retention characteristics of the memory transistor MTR.

Fourth Embodiment

A semiconductor device, in which one memory cell is configured by one memory transistor and is provided in the SOI region, is now described.

Figure 58:
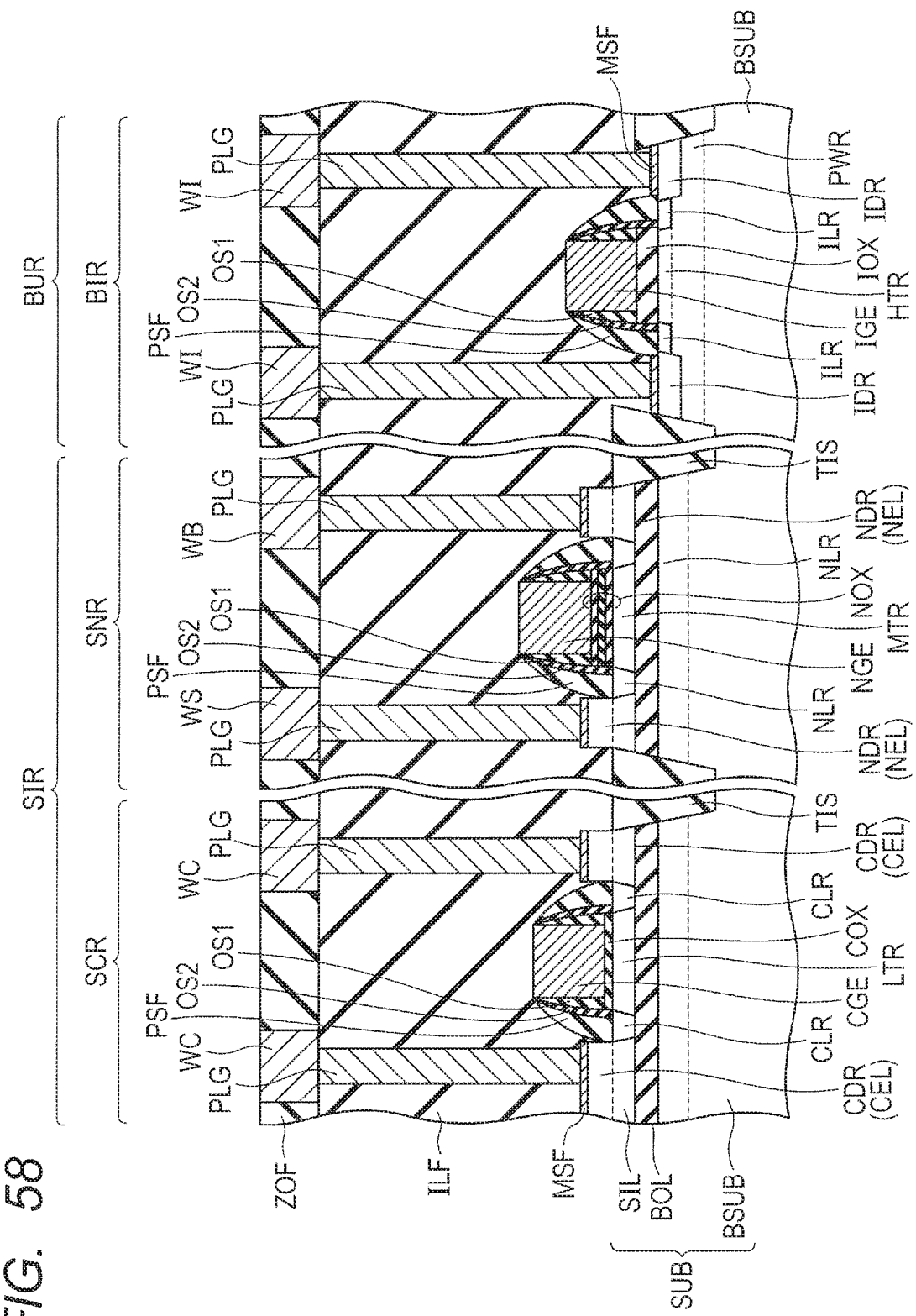
FIG. 58 is a sectional view of a semiconductor device of a fourth embodiment.

As shown in FIG. 58, the bulk region BUR and the SOI region SIR are defined in the SOI substrate SUB. The element isolation insulating film TIS defines the high-withstand-voltage MOS transistor region BIR in the bulk region BUR, and defines the memory region SNR and the low-withstand-voltage MOS transistor region SCR in the SOI region SIR.

The memory transistor MTR is provided in the silicon layer SIL in the memory region SNR. The raised epitaxial layer NEL (raised part) is provided on the surface of the silicon layer SIL. The memory transistor MTR includes the gate insulating film NOX including the charge storage layer, the gate electrode NGE, the LDD region NLR, and the diffusion layer NDR.

The raised epitaxial layer NEL is provided from the surface of the silicon layer SIL, on which the gate insulating film NOX is disposed, to a position higher than the surface. The LDD region NLR is provided from a portion of the silicon layer SIL located directly below the sidewall surface of the gate electrode NGE to a portion of the silicon layer SIL located directly below the raised epitaxial layer NEL.

The diffusion layer NDR is provided mainly in the raised epitaxial layer NEL. The impurity concentration (second impurity concentration) of the diffusion layer NDR is higher than the impurity concentration (first impurity concentration) of the LDD region NLR. Since other configurations are similar to those of the semiconductor device shown in FIG. 30, the same components are designated by the same reference numeral, and duplicated description is omitted except when required.

The semiconductor device of the fourth embodiment can be manufactured by the same manufacturing method as that described in the second embodiment except that only the memory transistor MTR is formed while the selection transistor is not formed in the memory region SNR.

Operation of the semiconductor device of the fourth embodiment is now described. First, a circuit diagram of memory cells in the memory region SNR is described. The semiconductor device of the fourth embodiment is different from the semiconductor device of the third embodiment (see FIG. 53), in which the memory region BNR is provided in the well region PWR of the bulk region BUR, in that the memory region SNR is provided in the silicon layer SIL of the SOI region SIR.

Figure 59:
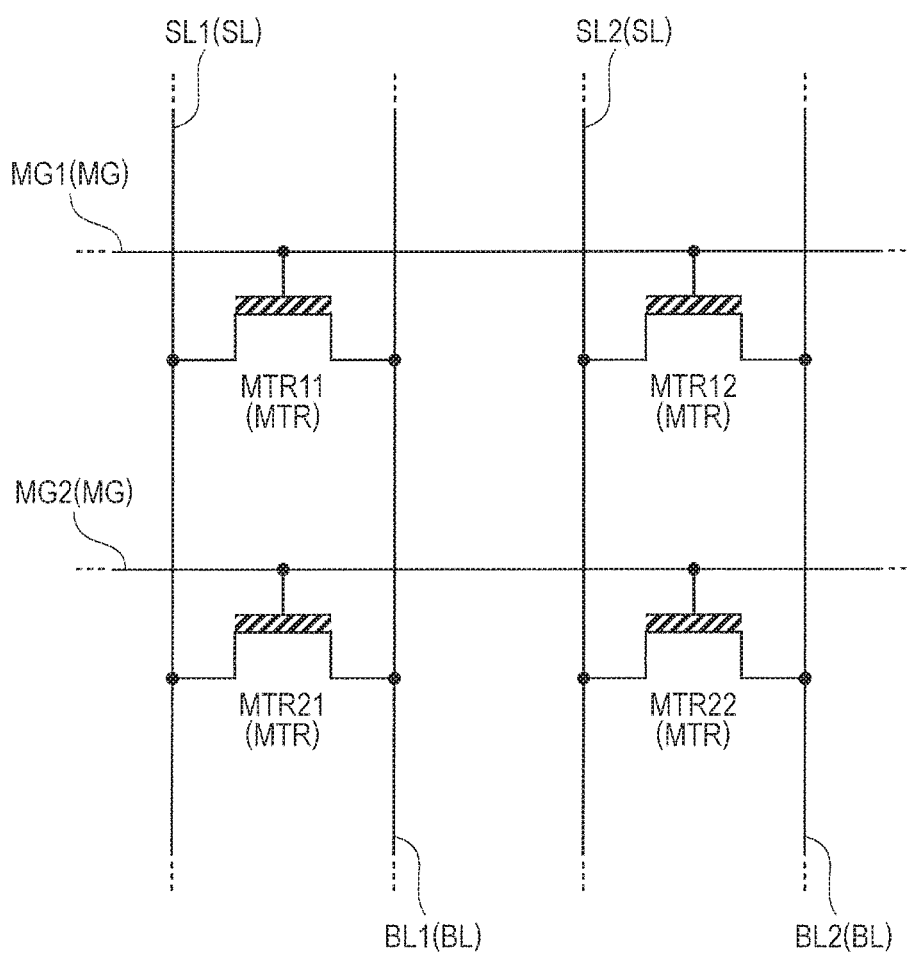
FIG. 59 is a circuit diagram of memory cells in a memory region in the fourth embodiment.

Hence, as shown in FIG. 59, the circuit diagram of the memory cells in the memory region SNR has the same coupling relationships between the memory transistor MTR, the memory gate line MG, the source line SL, and the bit line BL as the coupling relationships of the circuit diagram (see FIG. 54) of the memory region BNR in the third embodiment except that a dot line frame corresponding to the well region PWR is not shown.

Figure 60:
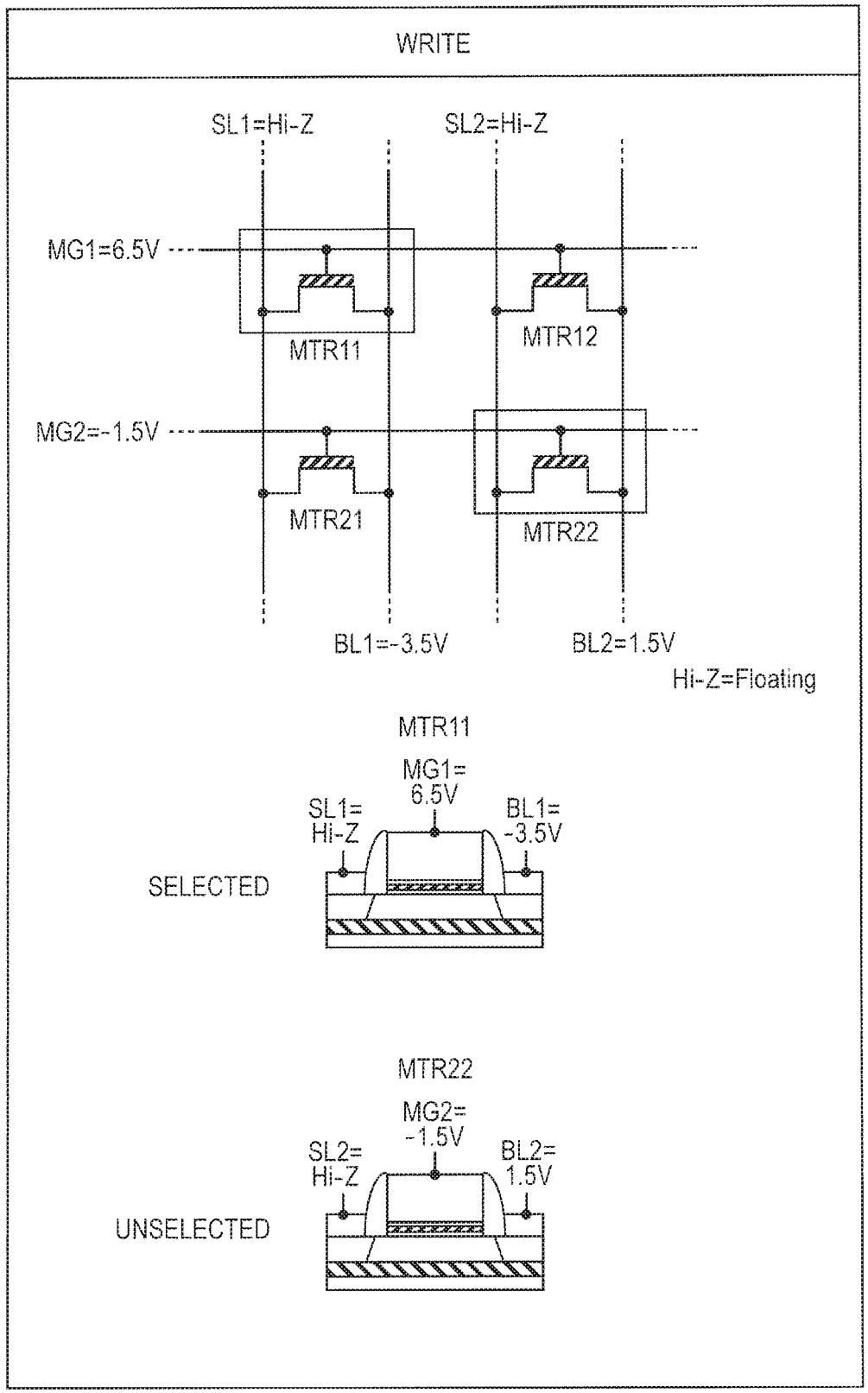
FIG. 60 is a diagram to explain information write operation on a memory cell in the fourth embodiment.

Information write operation on a memory sell is now described with reference to the circuit diagram shown in FIG. 59. As shown in FIG. 60, the selected bit to be written is assumed to include the memory transistor MTR11, for example. For example, 6.5 V and −3.5 V are applied to the memory gate line MG1 and the bit line BL1, respectively. The source line SL1 is adjusted to a high impedance state.

As a result, a positive bias is applied to the gate electrode NGE of the memory transistor MTR11, and thus electron is injected from the silicon layer SIL to the charge storage layer (silicon nitride film NI) of the gate insulating film NOX. In this way, information write operation is performed on the selected bit.

On the other hand, for example, assuming the unselected bit to be not written includes the memory transistor MTR22, −1.5 V and 1.5 V are applied to the memory gate line MG2 and the bit line BL2, respectively. The source line SL2 is adjusted to a high impedance state. As a result, a negative bias is applied to the gate electrode NGE of the memory transistor MTR22, and no electron is injected into the charge storage layer (silicon nitride film NI) of the gate insulating film NOX.

The diffusion layer NDR, to which the electric potential of the bit line BL is applied, is provided in the raised epitaxial layer NEL in the memory transistor MTR. As described above, this suppresses influence of the impurity in the diffusion layer NDR on the impurity concentration profile of the LDD region NLR, making it possible to reduce write disturb, i.e., accidental erasure of information.

Figure 61:
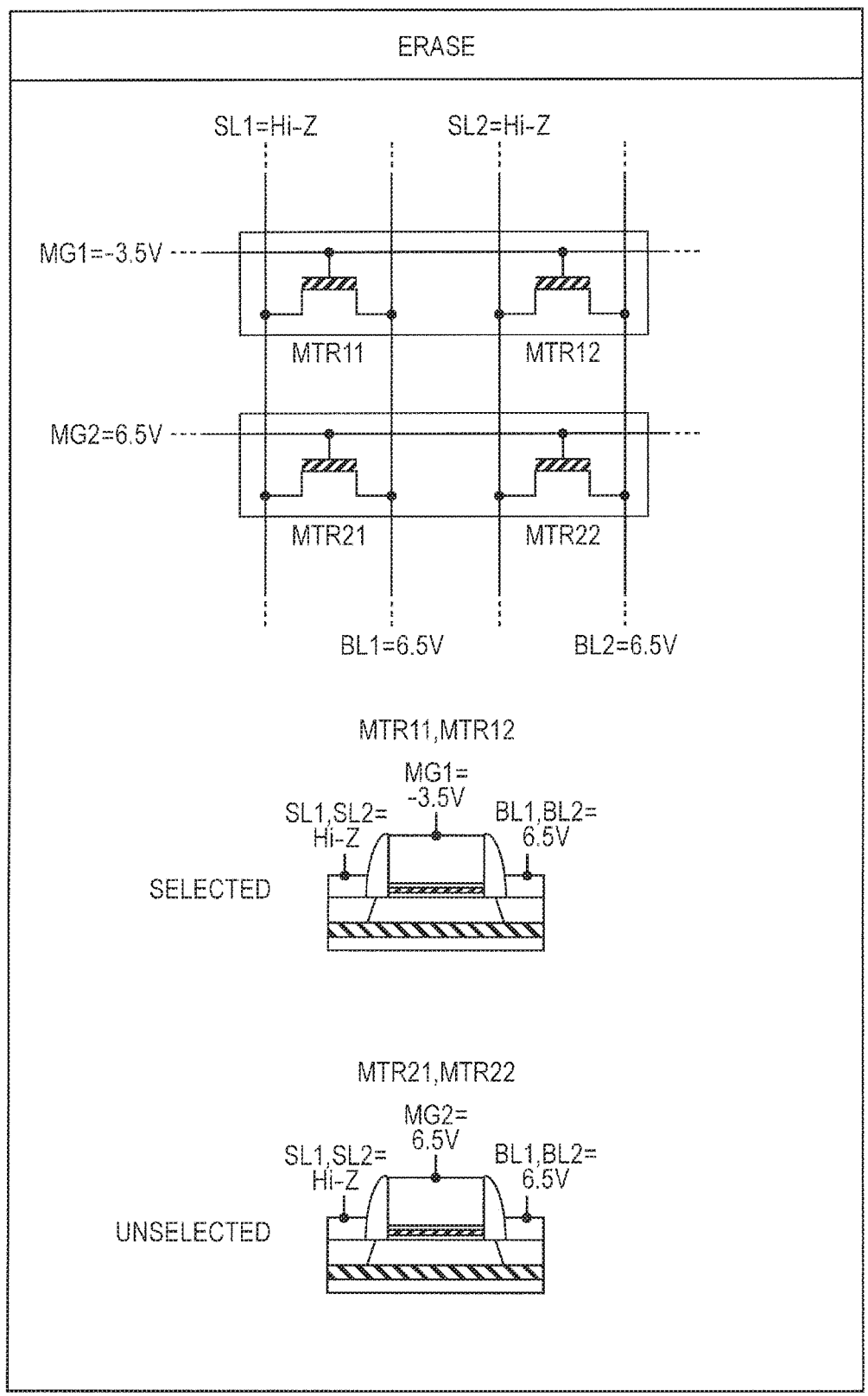
FIG. 61 is a diagram to explain information erasure operation on a memory cell in the fourth embodiment.

Information erasure operation on the memory sells is now described. As shown in FIG. 61, the respective selected bits to be erased are assumed to include the memory transistor MTR11 and the memory transistor MTR12, for example. For example, −3.5 V and 6.5 V are applied to the memory gate line MG1 and each of the bit lines BL1 and BL2, respectively. The source lines SL1 and SL2 are each adjusted to a high impedance state. As a result, a negative bias is applied to the gate electrode NGE of each of the memory transistors MTR11 and MTR12, and thus electron stored in the charge storage layer of the gate insulating film NOX is extracted to the silicon layer SIL. In this way, information erasure operation is performed on the selected bits.

On the other hand, assuming the respective unselected bits to be not erased include the memory transistor MTR21 and the memory transistor MTR22, 6.5 V and 6.5 V are applied to the memory gate line MG2 and each of the bit lines BL1 and BL2, respectively. The source lines SL1 and SL2 are each adjusted to a high impedance state. As a result, the electric potential of the gate electrode NGE of each of the memory transistors MTR21 and 22 becomes equal to the electric potential of the silicon layer SIL, and thus no electron is extracted.

Figure 62:
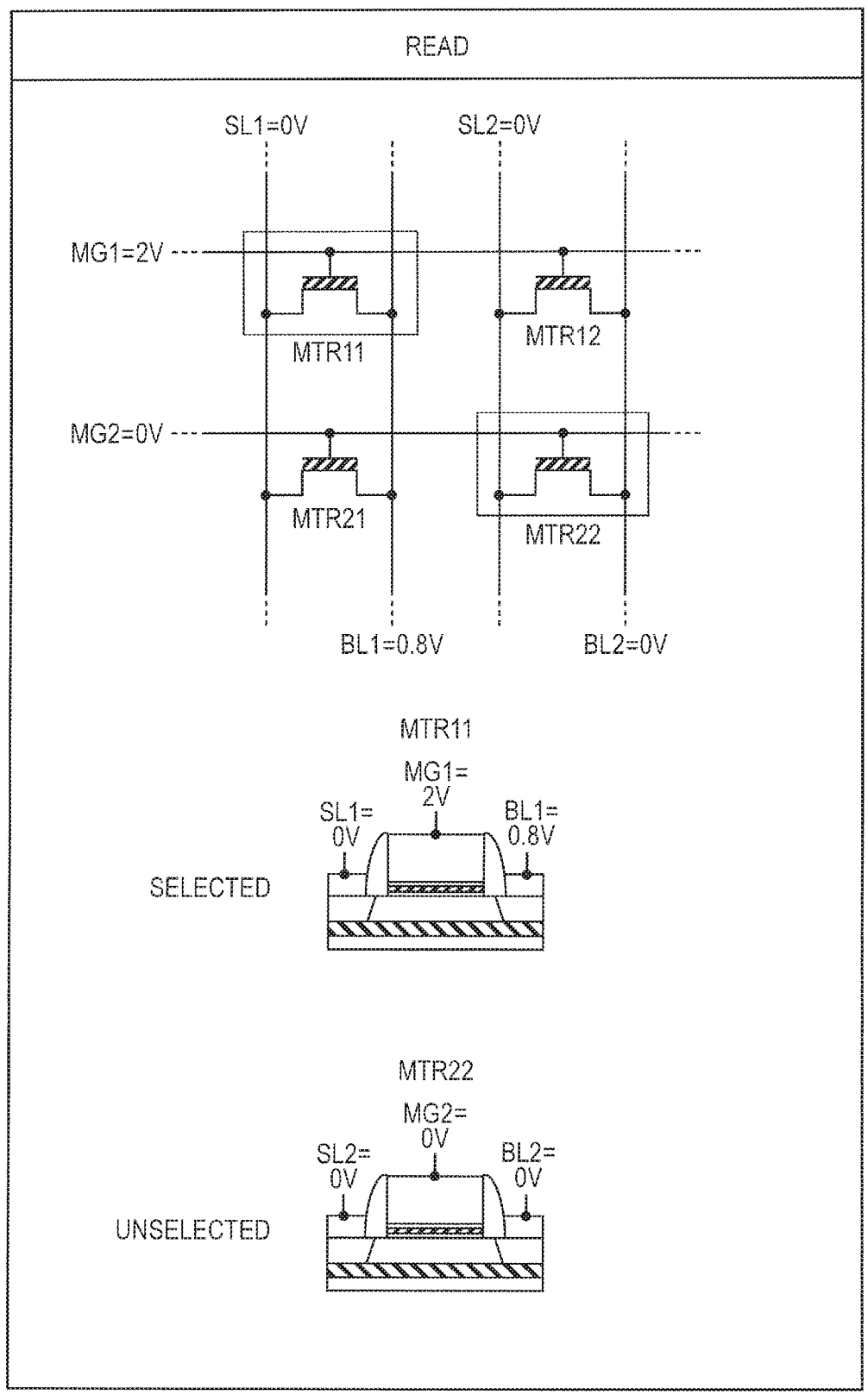
FIG. 62 is a diagram to explain information read operation on a memory cell in the fourth embodiment.

Information read operation on a memory sell is now described. As shown in FIG. 62, the selected bit to be read is assumed to include the memory transistor MTR11, for example. For example, 2 V, 0 V, and 0.8 V are applied to the memory gate line MG1, the source line SL1, and the bit line BL1, respectively.

If the charge storage layer of the memory transistor MTR11 stores the injected electron, the threshold voltage of the memory transistor MTR11 increases. No current therefore flows through the memory transistor MTR11. When the charge storage layer stores no injected electron, the threshold voltage is reduced, and current flows through the memory transistor MTR11. In this way, information read operation is performed on the selected bit.

On the other hand, assuming the unselected bit to be not read includes the memory transistor MTR22, 0 V, 0 V, and 0 V are applied to the memory gate line MG2, the source line SL2, and the bit line BL2, respectively. As a result, information read operation is not performed.

In the memory transistor MTR of the semiconductor device, the diffusion layer NDR, to which the electric potential of the bit line is applied, is provided in the raised epitaxial layer NEL. As described above, this suppresses influence of the impurity in the diffusion layer NDR on the impurity concentration profile of the LDD region NLR, making it possible to reduce write disturb.

As described above, high-temperature hydrogen anneal is performed before formation of the raised epitaxial layer NEL, so that the number of interface states in the gate insulating film NOX (bottom silicon oxide film) decreases, leading to an improvement in retention characteristics of the memory transistor MTR.

The semiconductor devices described in the respective embodiments can be variously combined as necessary. For example, the semiconductor device described in the first embodiment may be combined with the semiconductor device described in the second embodiment to form the memory transistor MTR in each of the SOI region SIR and the bulk region BUR.

Although the invention achieved by the inventors has been described in detail according to some embodiments thereof hereinbefore, the invention should not be limited thereto, and it will be appreciated that various modifications or alterations thereof may be made within the scope without departing from the gist of the invention.

What is claimed is:

1. A semiconductor device comprising:
a semiconductor base substrate; and
a memory transistor comprising:

a well region formed in the semiconductor base substrate;

a gate insulating film disposed on a surface of the semiconductor base substrate, the gate insulating film overlapping with the well region;

a memory gate electrode disposed on the gate insulating film;

a spacer film disposed on a sidewall surface of the memory gate electrode;

a raised part disposed on the surface of the semiconductor base substrate, the raised part being adjacent to the spacer film;

a first impurity region provided in the well region, but not provided in the raised part, the first impurity region being located directly below the spacer film; and a second impurity region provided in the raised part, but not provided in the well region formed in the semiconductor base substrate, wherein the gate insulating film includes:
- a first film disposed on the surface of the semiconductor base substrate;
- a second film disposed on the first film, the second film being served as a charge storage layer; and
- a third film disposed on the second film, wherein an impurity concentration of the second impurity region is higher than an impurity concentration of the first impurity region, and wherein the raised part has a surface located on a side of the gate insulating film relative to the surface of the semiconductor base substrate.

2. The semiconductor device according to claim 1, wherein the surface of the raised part is located above a boundary between the semiconductor base substrate and the first film of the gate insulating film.

3. The semiconductor device according to claim 1, wherein the third film of the gate insulating film has a surface on which the memory gate electrode is disposed, and a distance between the surface of the semiconductor base substrate and the surface of the raised part is greater than a distance between the surface of the semiconductor base substrate and the surface of the third film of the gate insulating film.

4. The semiconductor device according to claim 1, wherein the raised part is an epitaxial layer.

5. The semiconductor device according to claim 1, wherein a silicide film is disposed on the surface of the raised part.

6. The semiconductor device according to claim 5, further comprising:

an interlayer insulating film provided so as to cover the memory transistor; and a plug formed so as to penetrate the interlayer insulating film and reaching to the silicide film.

7. The semiconductor device according to claim 1,
wherein the first film comprises oxide,
wherein the second film comprises nitride, and
wherein the third film comprises oxide.

8. The semiconductor device according to claim 1, further comprising:

a semiconductor substrate including:
- the semiconductor base substrate;
- an insulating film disposed on the semiconductor base substrate; and
- a semiconductor layer disposed on the insulating film, wherein the well region is formed in the semiconductor base substrate composing the semiconductor substrate, and wherein the gate insulating film is disposed on the surface of the semiconductor base substrate composing the semiconductor substrate.

* * * * *